(12) United States Patent
Nakamura et al.

(10) Patent No.: US 7,504,616 B2
(45) Date of Patent: Mar. 17, 2009

(54) EXPOSURE DEVICE AND IMAGE FORMING APPARATUS USING THE SAME

(75) Inventors: Tetsurou Nakamura, Hyogo (JP); Hiroshi Shirouzu, Fukuoka (JP); Takafumi Hamano, Fukuoka (JP); Shinya Yamamoto, Fukuoka (JP)

(73) Assignee: Panasonic Corporation, Osaka (JP)

( * ) Notice: Subject to any disclaimer, the term of this patent is extended or adjusted under 35 U.S.C. 154(b) by 139 days.

(21) Appl. No.: 11/697,555

(22) Filed: Apr. 6, 2007

(65) Prior Publication Data
US 2007/0235741 A1 Oct. 11, 2007

(30) Foreign Application Priority Data

| Apr. 10, 2006 | (JP) | ............................. 2006-108051 |
| Apr. 12, 2006 | (JP) | ............................. 2006-109646 |
| Apr. 27, 2006 | (JP) | ............................. 2006-123739 |

(51) Int. Cl.
H01L 27/15 (2006.01)
H04N 1/031 (2006.01)

(52) U.S. Cl. ........................ 250/214.1; 257/80; 257/84; 257/432; 313/507; 315/169.3; 347/236

(58) Field of Classification Search .............. 250/214.1; 257/80, 82, 84, 432; 313/506, 507; 315/169.3; 347/133, 236
See application file for complete search history.

(56) References Cited

U.S. PATENT DOCUMENTS

| 6,612,888 | B1 | 9/2003 | Pai et al. |
| 6,731,260 | B2 | 5/2004 | Jinno et al. |
| 6,881,979 | B2 * | 4/2005 | Starikov et al. ............... 257/80 |
| 6,989,849 | B2 | 1/2006 | Momura et al. |
| 7,053,549 | B2 | 5/2006 | Omura et al. |
| 7,286,586 | B2 * | 10/2007 | Kondo ..................... 372/50.21 |

(Continued)

FOREIGN PATENT DOCUMENTS

JP 11-194367 7/1999

(Continued)

OTHER PUBLICATIONS

English Language Abstract of JP 2002-144634.

(Continued)

*Primary Examiner*—John R Lee
(74) *Attorney, Agent, or Firm*—Greenblum & Bernstein, P.L.C.

(57) ABSTRACT

To provide an exposure device and an image forming apparatus using the same, in which the exposure device can detect light intensity with improved reliability and thereby controls the light intensity with high precision, the exposure device includes an EL (electro-luminescence) element having a first electrode (an anode), a second electrode (a cathode), and a light emitting layer disposed between the first and second electrodes, thereby forming a light emitting unit, and a light detecting element detecting light emitted from the EL element, in which the EL element and the light detecting element are stacked onto each other. The light detecting element is provided at an inner side of a principal surface of the electrode (the anode) which is disposed closer to the light detecting element than the other electrode. A light emitting area of the EL element is provided at an inner side of a principal surface of the light detecting element.

24 Claims, 34 Drawing Sheets

U.S. PATENT DOCUMENTS

| | | | |
|---|---|---|---|
| 7,408,598 B2 * | 8/2008 | den Boer et al. | 349/53 |
| 2002/0066904 A1 * | 6/2002 | Yuan et al. | 257/83 |
| 2002/0074553 A1 * | 6/2002 | Starikov et al. | 257/77 |
| 2004/0080011 A1 * | 4/2004 | Starikov et al. | 257/481 |
| 2007/0046765 A1 | 3/2007 | Kawano et al. | |
| 2007/0081068 A1 | 4/2007 | Nakamura et al. | |

FOREIGN PATENT DOCUMENTS

| | | |
|---|---|---|
| JP | 2001-068265 | 3/2001 |
| JP | 2001-284043 | 10/2001 |
| JP | 2002-144634 | 5/2002 |
| JP | 2002-178560 | 6/2002 |
| JP | 2002-352951 | 12/2002 |
| JP | 2004-080410 | 3/2004 |
| JP | 2004-082330 | 3/2004 |
| JP | 2004-230879 | 8/2004 |
| JP | 2004-335267 | 11/2004 |
| JP | 2006-216907 | 8/2006 |
| WO | 2006/082896 | 10/2006 |

OTHER PUBLICATIONS

English Language Abstract of JP 2002-178560.
English Language Abstract of JP 2006-216907.
English Language Abstract of JP 2004-080410.
English Language Abstract of JP 2004-230879.
English Language Abstract of JP 2002-352951.
English Language Abstract of JP 2001-068265.
U.S. Appl. No. 11/693,189, to Masumoto et al., filed Mar. 29, 2007.

* cited by examiner

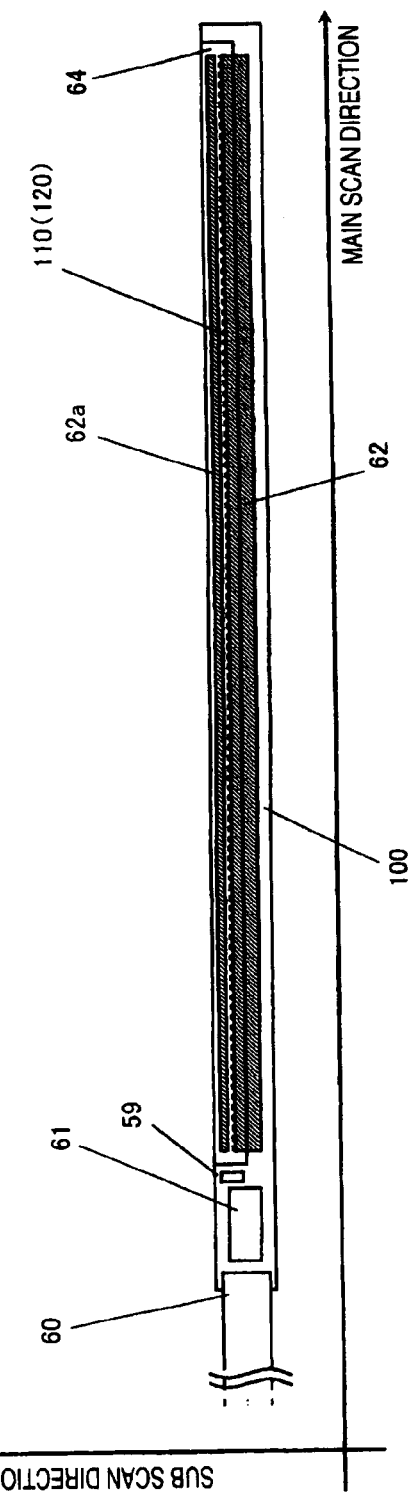
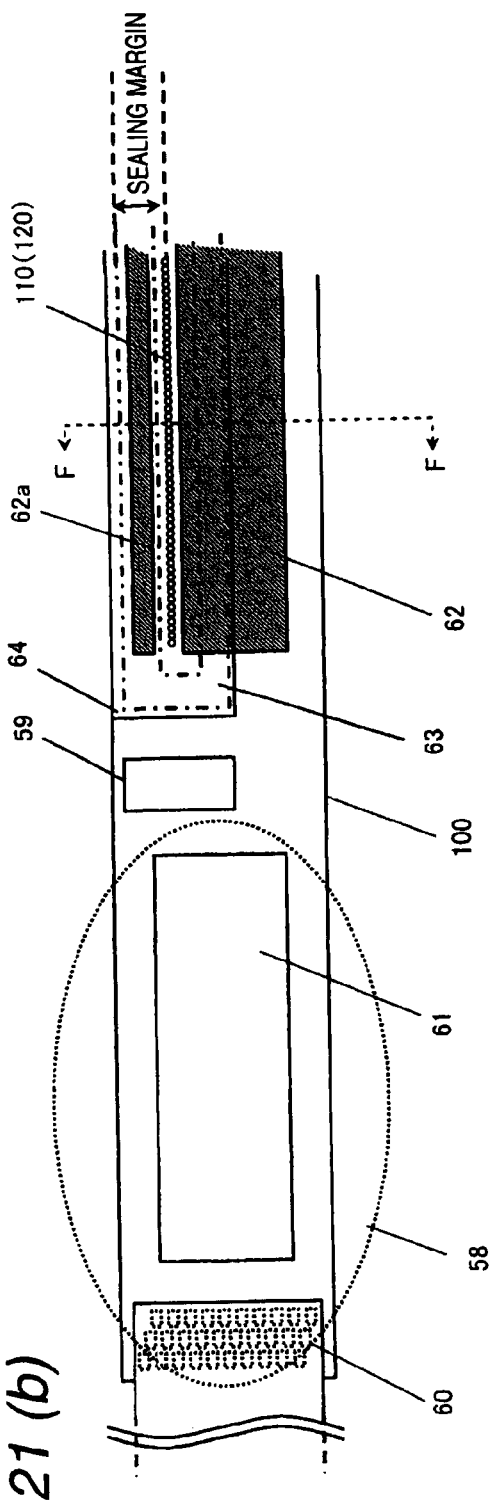
FIG. 21 (a)
FIG. 21 (b)

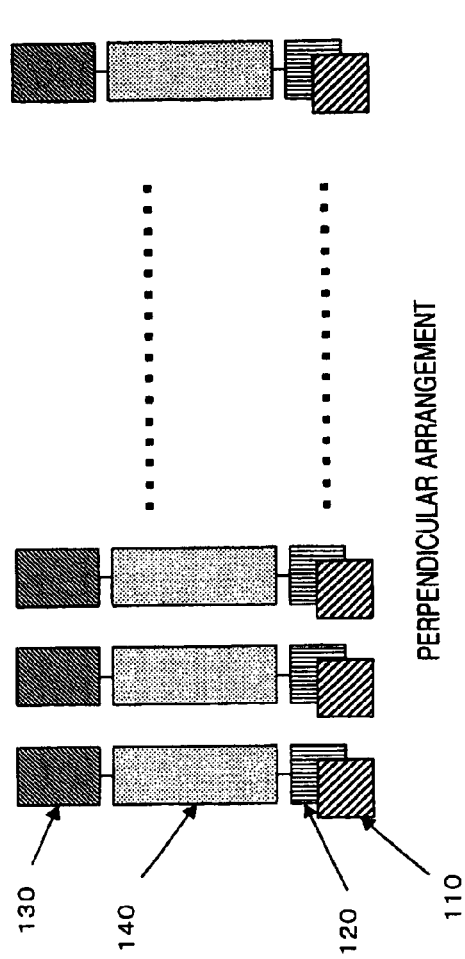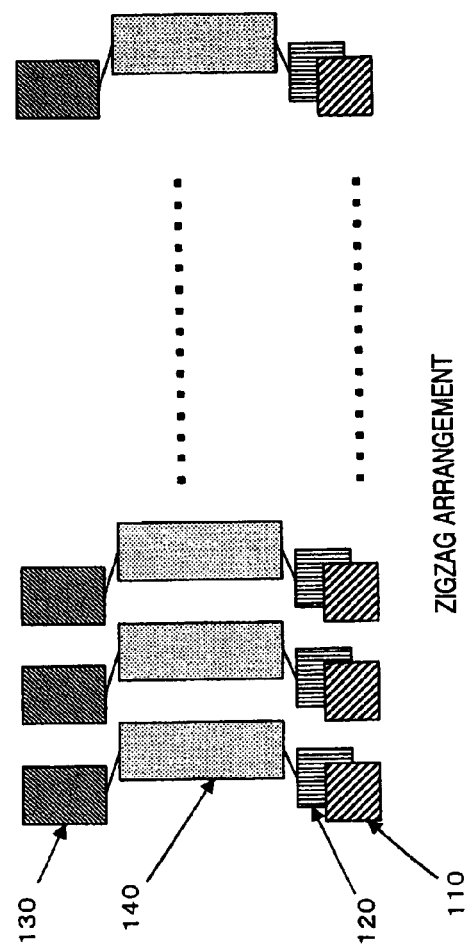

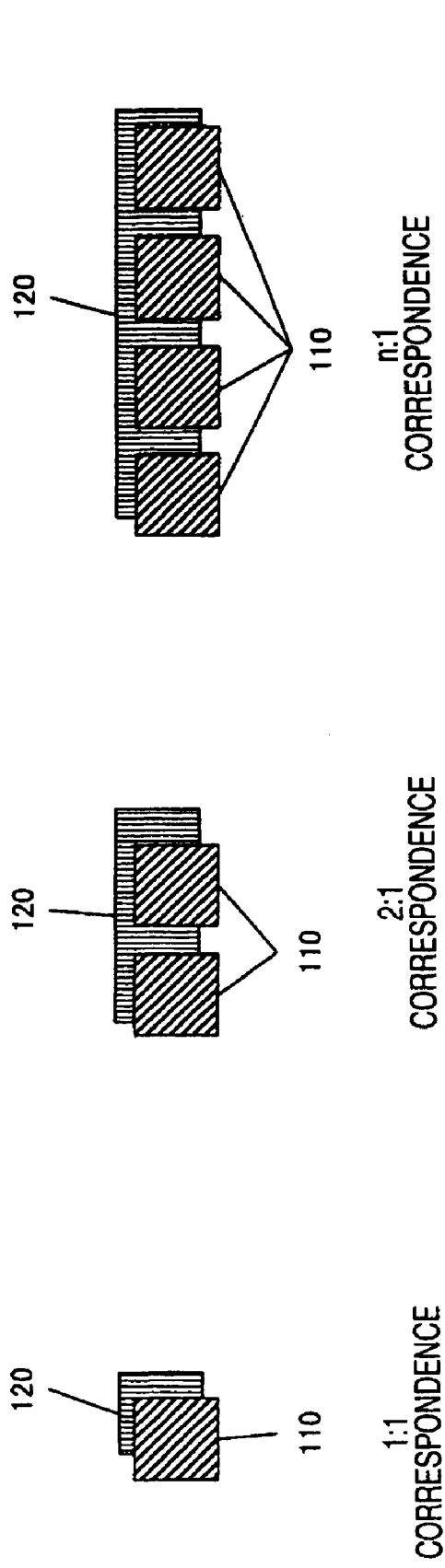

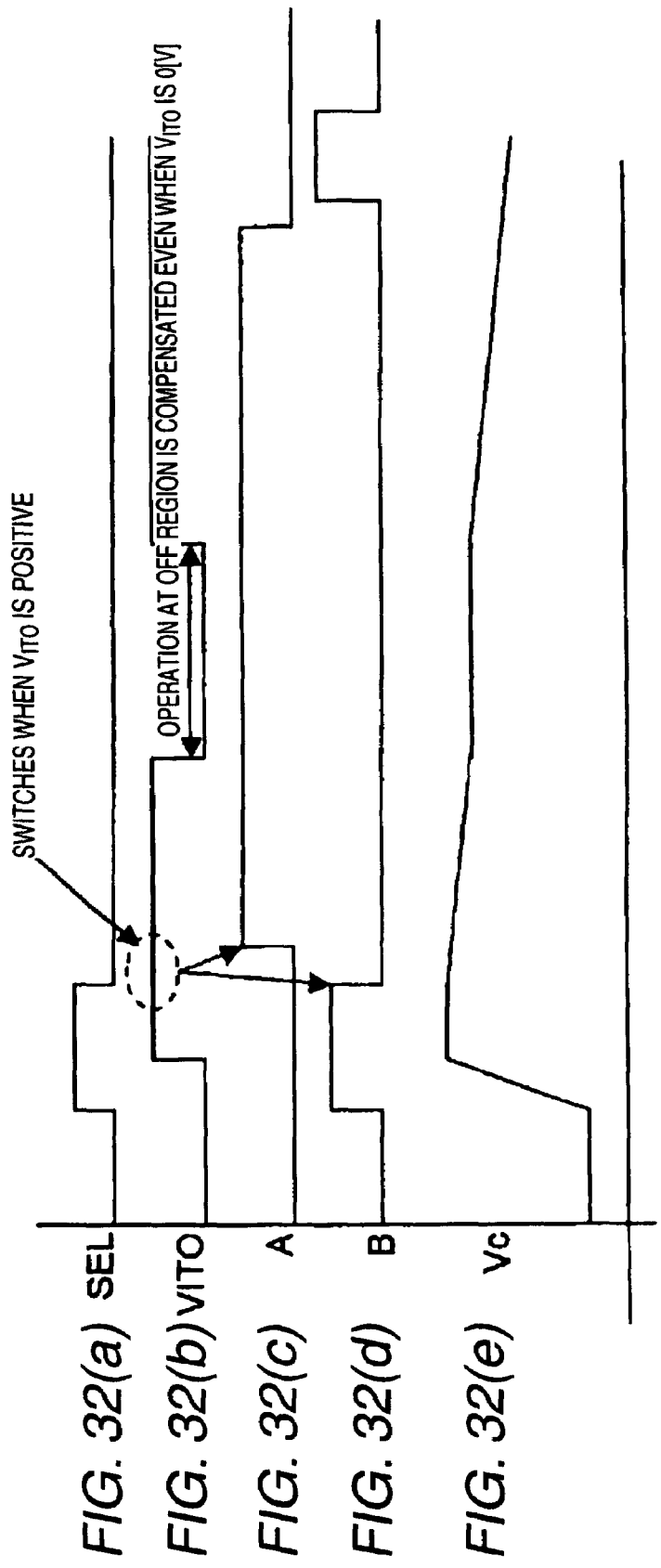

EXPOSURE DEVICE AND IMAGE FORMING APPARATUS USING THE SAME

BACKGROUND OF THE INVENTION

1. Field of the Invention

The present invention relates to an exposure device and an image forming apparatus using the same, and more particularly, to an exposure device and an image forming apparatus using the exposure device in which light emitting elements are aligned in an array configuration.

2. Description of the Related Art

With the recent trend toward a smaller and cheaper image forming apparatus such as a facsimile machine or a printer, there have been many attempts to make smaller and cheaper components of the image forming apparatus.

In an image forming apparatus employing an electro-photographic process, a photosensitive member is exposed to light by irradiating light modulated with image data onto the photosensitive member, and a toner adhering to the photosensitive member by the electrostatic force is transferred onto a printing medium such as a recording paper, thereby forming an image on the printing medium. As a method of controlling the light irradiated onto the photosensitive member, there have been known a method of introducing light emitted from a semiconductor laser onto the photosensitive member using a rotating polygonal mirror, and a method of achieving the same effect by using an exposure device known as an optical head having a plurality of very-small light sources. The optical head includes a light source and a circuit for controlling driving of the light source, and a light emitting diode is commonly used as the light source.

As a means for downsizing the light source while reducing the manufacturing cost, there has been proposed an optical head using an EL (electro-luminescence) element as its light source.

Examples of the optical head using an organic EL element as the light source are disclosed in Patent Documents 1 and 2. Patent Document 1 describes the configuration of the optical head with a focus on light emitting and detecting elements, and Patent Document 2 describes the configuration with a focus on pixels. The light emitting units disclosed in both Patent Documents have substantially the same configuration and are configured as a stacked layer structure including a light emitting layer constituting the organic EL element, a thin-film transistor serving as the light detecting element for use in light intensity correction and as a circuit for controlling the driving of the light emitting layer, and the like.

The light detecting elements disclosed in both Patent Documents have a light receiving area smaller than the light emitting area of the light emitting layer to prevent the light output from the bottom surface of the stacked layer structure from being blocked at the light receiving area.

Patent Document 1: JP-A-2002-144634
Patent Document 2: JP-A-2002-178560

FIG. 33 is a cross-sectional diagram of a configuration of an optical head, and more particularly, of a peripheral configuration of an light emitting element provided in the optical head, in accordance with the related art.

As shown in FIG. 33, a light emitting element (an EL element 110) serving as a light source of an optical head is configured as a stacked layer structure including a plurality of layers made of various kinds of materials. In the optical head, a base coating layer 101 is prepared on a glass substrate 100, the EL element 110 and its driving circuit serving as the light source and the driving circuit are formed thereon, and a light detecting element 120 constituted, for example, by a thin-film transistor is formed on a portion of the base coating layer 101.

Next, an interlayer insulating film 103 made, for example, of a silicon oxide film is formed on the stacked layer structure. In addition, an anode 111, a light emitting layer 112, and a cathode 113 are formed thereon. In this state, when an electric voltage is applied between the anode 111 and the cathode 113, electric potential difference is provided across the light emitting layer 112 and thus the light emitting layer 112 is caused to emit light.

As shown in FIG. 33, the optical head known in the art is provided with a light detecting element 120 which has a light receiving area $A_r$ smaller than a light emitting area $A_{LE}$ of the light emitting layer to prevent the light output from the bottom surface of the stacked layer structure from being blocked at the light receiving area.

Therefore, at this moment, a bump area resulting from the light detecting element 120 is present on the surface of the stacked layer structure. Next, an interlayer insulating film 103 made of a insulating film such as an silicon oxide film is formed on the stacked layer structure. However, it is difficult to form the interlayer insulating film 103 with a uniform thickness due to the above-described bump area resulting from the light detecting element 120. Thus, the surface of the interlayer insulating film 103 is formed into a convex curved surface corresponding to the shape of the light detecting element 120. Therefore, the surfaces of layers formed on the interlayer insulating film 103 are also formed into the convex curved surface corresponding to the light detecting element 120, and the light emitting layer 112 may have a small thickness at areas such as the convex portion or its edge portions. Accordingly, the thickness of the light emitting layer 112 is not maintained at a constant level over a light exiting area $A_{LE}$. In addition, the brightness of the light emitting layer 112 at the surfaces of the small-thickness areas may be greater than that of other surfaces. Accordingly, the intensity distribution (i.e., in-plane distribution) of light emitted from a single EL element 110 may become irregular.

The thin-film transistor constituting the light detecting element 120 faces the anode 111 of the EL element 110 via the interlayer insulating film 103. As a result of many experiments, it has been found that the light detecting element 120 is greatly influenced by the electric potential of the anode 111 and functions as a thin-film transistor having, as its gate electrode, the anode 111 of the EL element 110.

In the optical head known in the art, it is not considered that the light detection precision of the light detecting element 120 is greatly influenced by the electric potential of the anode 111, and more particularly, it does not suggest the layout and size of the light detecting element 120 with respect to the anode 111 of the EL element 110.

SUMMARY OF THE INVENTION

The invention has been made in view of such circumstances, and its object is to provide an exposure device having a light detecting element capable of detecting the intensity of light emitted from a light emitting element, and a high-quality image forming apparatus equipped with the exposure device.

An exposure device in accordance with the invention includes an EL (electro-luminescence) element having a first electrode, a second electrode, and a light emitting layer disposed between the first and second electrodes, thereby forming a light emitting unit, and a light detecting element having a photo-electric conversion unit detecting light emitted from the EL element, in which the EL element and the light detecting element are stacked onto each other, a light emitting area of the EL element is provided at an inner side of a principal surface of the light detecting element, and the photo-electric conversion portion of the light detecting element is provided at an inner side of a principal surface of the first electrode which is disposed closer to the light detecting element than the other electrode.

With this configuration, the intensity distribution of light emitted in the light emitting area of the EL element can be made uniform, and the channel characteristic of the light detecting element can be securely controlled. Accordingly, it is possible to detect the uniformly distributed light intensity of the EL element with high precision. Thus, it is possible to an exposure device capable of maintaining the light intensity at a constant level by controlling the light intensity of the EL element on the basis of the light detection result.

BRIEF DESCRIPTION OF THE DRAWINGS

FIG. 21(a) is a top view of a glass substrate related to the exposure device of the image forming apparatus in accordance with the second embodiment of the invention; and FIG. 21(b) is an enlarged view of a main part thereof.

FIGS. 27(a) and 27(b) are explanatory diagrams showing examples of an element arrangement pattern in the exposure device in accordance with a third embodiment of the invention.

FIGS. 28(a) to 28(c) are explanatory diagrams showing examples of an element arrangement pattern in the exposure device in accordance with a fourth embodiment of the invention.

FIG. 32 is an explanatory diagram showing electric potentials and the like of a switching TFT in accordance with the sixth embodiment of the invention.

DETAILED DESCRIPTION OF THE PREFERRED EMBODIMENTS

Hereinafter, embodiments of the invention will be described with reference to drawings.

First Embodiment

Figure 1:
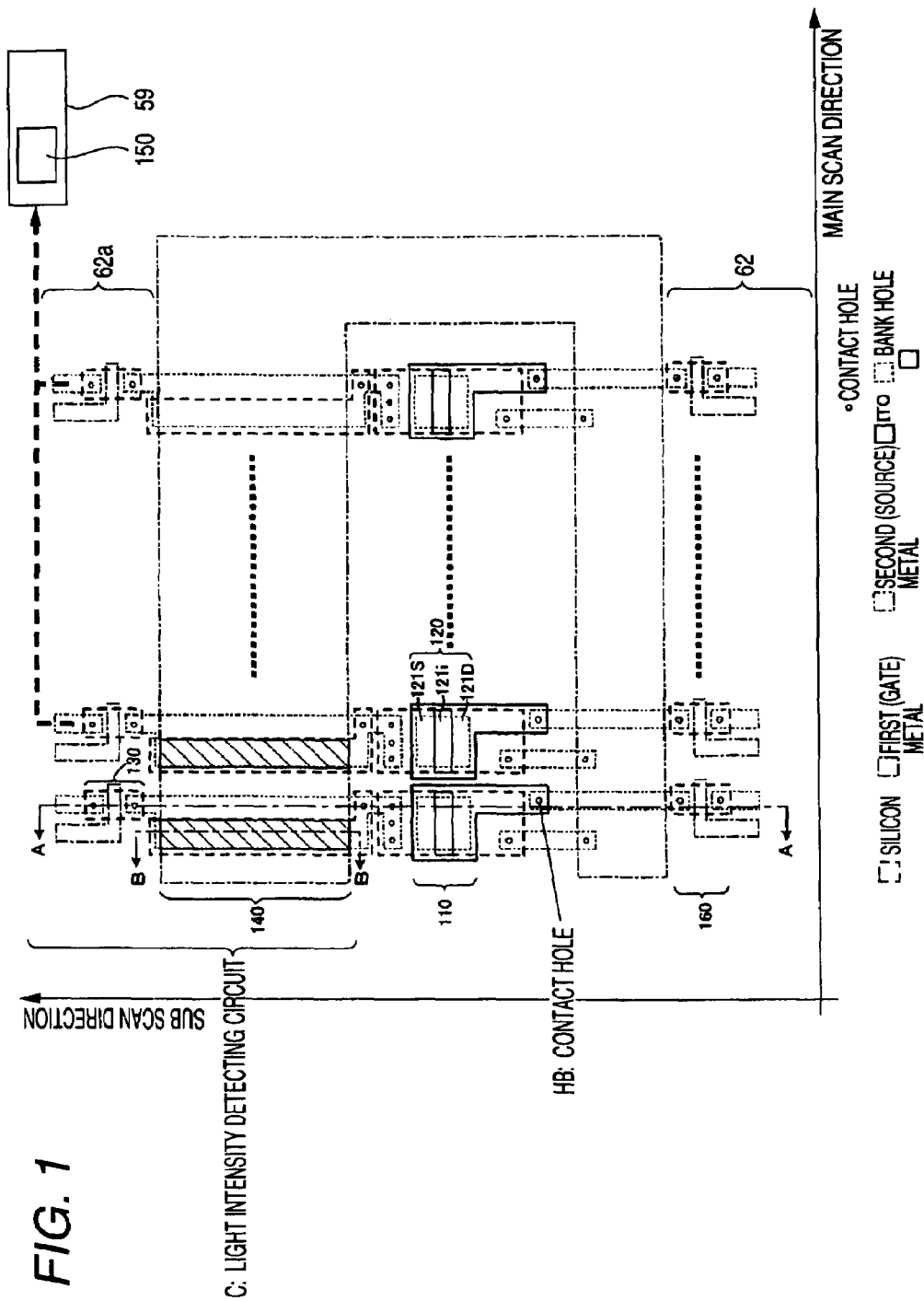
FIG. 1 is a plan view of an organic EL element constituting an exposure device and a peripheral configuration thereof in accordance with a first embodiment of the invention.

FIG. 1 is a plan view of an organic EL element constituting an exposure device and a peripheral configuration thereof in accordance with a first embodiment of the invention.

FIG. 2(a) is a cross-sectional diagram of a peripheral configuration of a light detecting element 120 in accordance with the first embodiment of the invention, FIG. 2(b) is a cross-sectional diagram showing a peripheral configuration of a capacitance element 140 in accordance with the first embodiment of the invention, and FIG. 2(c) is a cross-sectional diagram showing a peripheral configuration of a selection transistor 130 in accordance with the first embodiment of the invention.

Figure 3:
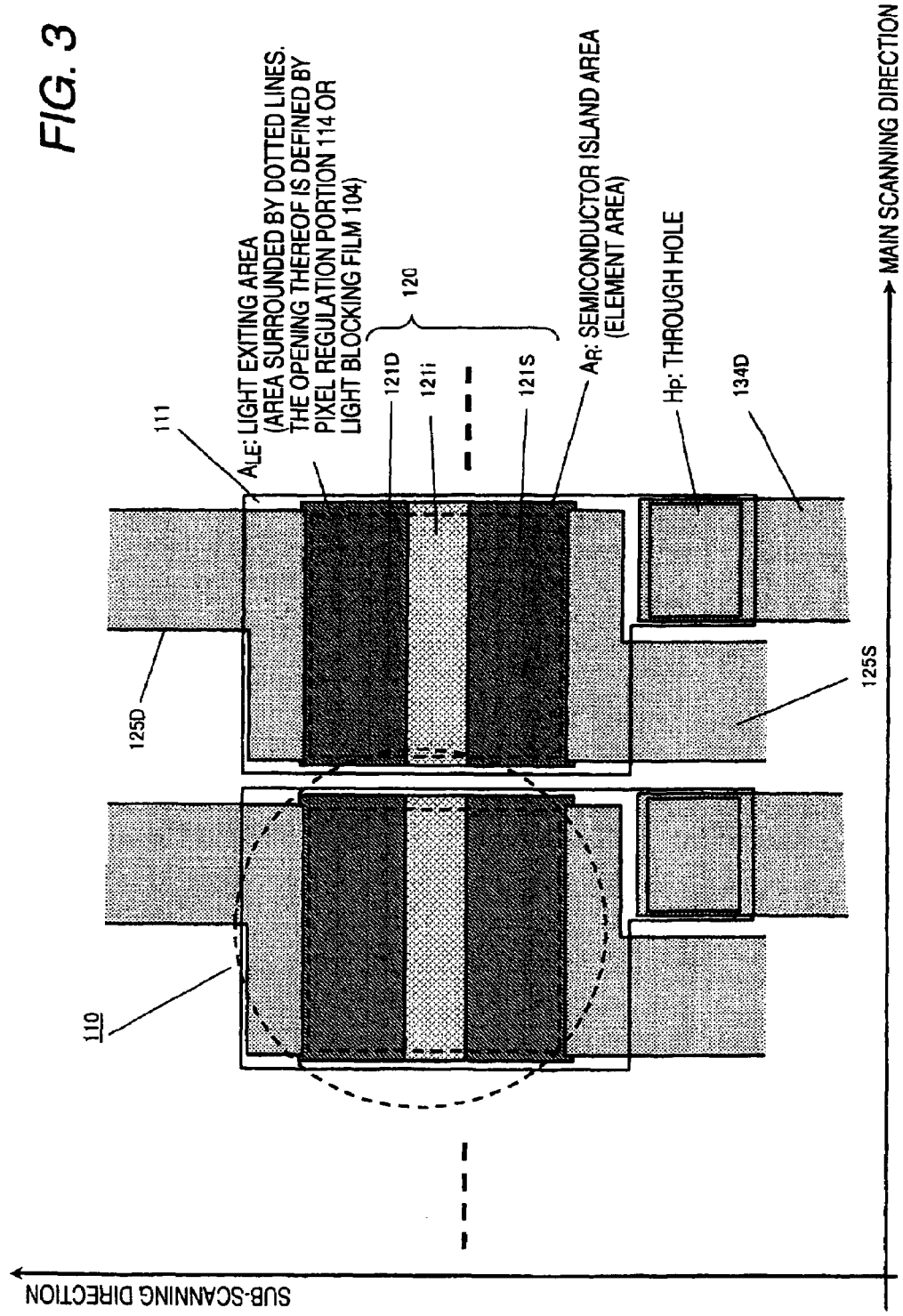
FIG. 3 is a plan view of a main part of the organic EL element and a peripheral configuration thereof in accordance with the first embodiment of the invention.

FIG. 3 is a plan view of a main part of the organic EL element and a peripheral configuration thereof in accordance with the first embodiment of the invention.

FIGS. 2(a) and 2(c) are taken along the line A-A in FIG. 1, and FIG. 2(b) is taken along the line B-B in FIG. 1. The portion Q in FIG. 2(c) is continuous with respect to the portion P in FIG. 2(a).

Hereinafter, the configuration of an EL element constituting an exposure device and a peripheral configuration thereof in accordance with the first embodiment will be described with reference to FIGS. 1, 2(a), 2(b), 2(c), and 3.

A glass substrate 100 having an exposure light source formed thereon is provided in the exposure device.

A light emitting element array constituted by a plurality of light detecting elements 110 (organic EL elements) is formed on the glass substrate 100 constituting the exposure device. Along the light detecting element array, there is provided light detecting elements 120 which detect light emitted from the organic EL elements 110 (in FIGS. 1, 2(a), 2(b), 2(c), and 3, there are shown a state that the organic EL elements 110 and the light detecting elements 120 are superimposed onto each other). On the glass substrate 100, there is provided selection transistors 130 serving as a switching element for selecting the light detecting elements 120 and extracting outputs of the light detecting elements 120. Between the light detecting element 120 and the selection transistor 130 serving as the switching element, there is provided a capacitance element 140 serving as a light blocking member, from which charge stored therein in advance is discharged with photocurrent generated by the light detecting element 120 at the time of light intensity measurement.

The capacitance element 140 as the light blocking member prevents the light emitted from the organic EL element 110 from entering into the selection transistor 130, thereby effectively preventing erroneous or unstable operation of the selection transistor 130.

Since the exposure device requires smaller numbers of light emitting element arrays than that required by display apparatuses, there may be present empty spaces along a direction vertical to the arrangement direction of the light detecting element arrays. Accordingly, the capacitance elements 140 or the selection transistors 130 can be laid out with a margin on the empty spaces, i.e., without sacrificing their electric characteristics such as electrostatic capacitance.

The above-described configuration will be described in detail below.

On the glass substrate 100 constituting the exposure device, there are provided an array of a plurality of organic EL elements 110 (hereinafter, referred to as "light detecting element array") serving as light detecting elements being aligned in the main scanning direction, light detecting elements 120 configured with photo-diodes for detecting light emitted from the organic EL elements 110, a light intensity detection unit (hereinafter, referred to as a light intensity detection circuit C) being connected to the output of the light detecting element 120 and processing the light output from the organic EL element 110, a light intensity calculation unit 150 calculating the intensity of light on the basis of the output from the light intensity detection circuit C, and a driving circuit (a drive unit) 160 for controlling the driving of the organic EL elements 110.

In the first embodiment, on the light detection circuit C, there is formed a thin-film transistor (hereinafter, referred to as TFT) circuit 62a including the selection transistor 130 configured with TFTs. The driving circuit 160 is also configured with TFTs and constitutes a TFT circuit 62. Moreover, the light detecting element 120 is also configured with TFTs.

The light detection circuit C is constituted by the capacitance element 140 connected in parallel to at least the light detecting element 120 and the switching selection transistor 130 being connected to the capacitance element 140 and controlling an readout operation of the capacitance element 140. In this embodiment, the selection transistor 130 and the light detecting element 120 are separated from each other by the capacitance element 140. In addition, the selection transistor 130, the capacitance element 140, and the light detecting element 120 are sequentially aligned in a direction vertical to the light detecting element array. The selection transistor 130 is connected to a processing circuit unit 59 including a light intensity calculation circuit 150 (hereinafter, referred to a charge amplifier).

The output of the light intensity detection circuit C selected by the selection transistor 130 is input to the processing circuit unit 59 including the charge amplifier 150, and then converted into light intensity measurement data in the processing circuit unit 59.

The driving circuit 160 constituting a drive unit of the organic EL element 110 is configured with switching TFTs made of poly-crystalline silicon layer. The driving circuit 160 drives the organic EL element 110 on the basis of a driving current value set by a driving IC chip (not shown) (a source driver 61 to be described later).

As shown in FIG. 2(a), the light detecting element 120 is configured with a TFT having, as its gate electrode, a first electrode (an anode 111) of the organic EL element 110 disposed closer to the light detecting element 120. Moreover, the light detecting element 120 is configured as a poly-crystalline silicon layer formed by the same process as that of the switching selection transistor 130 (see FIG. 2(c) for reference) for selecting timings for a light intensity readout operation of the light intensity detection circuit C. Although the TFT (the light detecting element 120) for the light intensity detection and the switching TFT (the selection transistor 130) for the signal selection are simultaneously formed on the same layer to allow good workability, the selection transistor 130 and the light detecting element 120 are separated from each other by an amount corresponding to the layout space of the capacitance element 140. Accordingly, it is possible to prevent erroneous operation of the selection transistor 130 due to variations in threshold values resulting from the light entering into the switching TFT (the selection transistor 130).

Moreover, as shown in FIG. 2(b), since the capacitance element 140 is configured such that three-layer electrodes are facing each other with two interlayer insulating films disposed therebetween, the capacitance element 140 has a good light blocking effect and thus is able to block stray light in a secure manner, thus preventing an erroneous operation. Accordingly, it is possible to detect a very small photocurrent in an efficient manner, thus enabling highly reliable light intensity detection with a high precision.

As shown in the sectional diagrams of FIGS. 2(a), 2(b), and 2(c), the exposure device in accordance with the first embodiment includes the light detecting element 120 and organic EL element 110 which are sequentially stacked on the glass substrate 100 having formed thereon a base coating layer 101 for flat planarization and the TFT (the switching transistor) serving as the driving circuit 160 for driving the organic EL element 110 while correcting the driving current and period of the organic EL element 110 on the basis of the output of the light detecting element 120. On the glass substrate 100, there is installed a source driver 61 (not shown; see FIG. 21 for reference) as a chip IC connected to the driving current 160.

In the light detecting element 120, a semiconductor island area $A_R$ made of a poly-crystalline silicon layer formed on the surface of the base coating layer 101 is doped to a desired concentration level thus defining a source region 121S and a drain region 121D with a channel region 121i formed of a strip-shaped i-layer, serving as a photo-electric conversion unit disposed therebetween. The light detecting element 120 is constituted by the above-mentioned regions (the channel region 121i, the source region 121S, and the drain region 121D) and its electrodes, i.e., a source electrode 125S and a drain electrode 125D formed, through a through-hole, on a first insulating film 122 and a second insulating film 123, made of a silicon oxide film formed on the above-mentioned regions. The organic EL element 110 is formed on the light detecting element 120 via a silicon nitride film serving as a protective film 124. In the organic EL element 110, the protective film 124, an ITO (indium tin oxide) serving as the anode 111 (the first electrode), a pixel defining member 114 for defining the light emitting area (light exiting area $A_{LE}$) of the organic EL element 110, a light emitting layer 112, a cathode 113 (the second electrode) are stacked onto each other in this order. The "light exiting area" used in the invention refers to an area from which the light from the organic EL element 110 is emitted. In a case where there is formed a light blocking member having an opening such as the light blocking film 104 shown in FIG. 17 or the pixel defining member 114, the light exiting area refers to the area corresponding to the opening.

As described above, the exposure device in accordance with the first embodiment includes the EL element 110 having the first electrode (the anode 111), the second electrode (the cathode 113), and a light emitting layer 112 disposed between the first and second electrodes, thereby forming a light emitting unit, and the light detecting element 120 having a photo-electric conversion unit (the channel region 121i) detecting light emitted from the EL element 110, in which the EL element 110 and the light detecting element 120 are stacked onto each other, the light emitting area (the light exiting area $A_{LE}$) of the EL element 110 is provided at an inner side of a principal surface of the light detecting element 120, and the photo-electric conversion portion of the light detecting element 120 is provided at an inner side of a principal surface of the first electrode (the anode 111) which is disposed closer to the light detecting element 120 than the other electrode. The "photo-electric conversion unit" used in the invention refers to an area contributing the photo-electric conversion. The photo-electric conversion unit can be realized as an i-layer of the light detecting element having a p-i-p structure as long as the i-layer is disposed under the first electrode. With such a configuration, the first electrode (the anode 111) can effectively function as the gate electrode of the light detecting element 120, and the channel characteristics of the light detecting element 120 can be controlled by the stable electric potential of the first electrode (the anode 111) in a reliable manner, thereby improving the precision of the light intensity measurement.

In other words, such a configuration may be expressed in a different way that the EL element 110 is stacked as an upper layer of the light detecting element 120 formed on the glass substrate 100, and an outer periphery of the channel region 121i of the light detecting element 120 is disposed at an inner side of the principal surface of the first electrode (the anode 111) of the EL element 110. With such a configuration, the electric field from the first electrode (the anode 111) can be applied toward the light detecting element 120 in a reliable manner, thereby improving the controllability of the light detecting element 120.

As can be seen from the drawings (in particular, see FIGS. 2(a) and 3 for reference), the outer periphery of the poly-crystalline silicon semiconductor island area $A_R$ constituting the element area of the light detecting element 120 is disposed at an outer side of the light exiting area $A_{LE}$ of the EL element 110.

Since the size of the light detecting element 120 can be defined by the outer periphery of the semiconductor island area $A_R$, the configuration of the first embodiment may be expressed in a different way that the light detecting element 120 is provided at an inner side of the principal surface of the anode 111, and the light exiting area $A_{LE}$ is provided at an inner side of the principal surface of the light detecting element 120.

In this manner, since the outer periphery of the semiconductor island area $A_R$ of the light detecting element 120, which will be formed into a bump area, is disposed at an outer side of the light exiting area $A_{LE}$ of the EL element 110, the underlying layer of the light emitting layer 112 can be formed into a flat surface without producing the bump area on areas corresponding to the light exiting area $A_{LE}$ of the EL element 110. Therefore, the thickness of the light emitting layer 112 can be maintained at a constant level on the light exiting area $A_{LE}$ of the exposure device. Accordingly, the intensity distribution of light emitted from the light emitting layer 112 can be made uniform, thereby improving the image quality of an image forming apparatus equipped with the exposure device.

In general, the above-described element area refers to the semiconductor area or the semiconductor island area $A_R$ formed of the poly-crystalline silicon layer. In a case where the poly-crystalline silicon layer is formed over the entire surface of the substrate and then an insulation area is formed on a portion of the poly-crystalline silicon layer using anode-oxidation or oxygen ion-doping, the element area refers to the active region surrounded by the insulation area. In this case, since the active region as the element area and its circumferential areas are likely to be formed on the same surface, it is possible to form the light exiting area $A_{LE}$ on a flat surface.

As shown in FIGS. 2(b) and 2(c), the capacitance element 140 is configured with a capacitor which includes a first-layer electrode 141 formed of a poly-crystalline silicon layer, a second-layer electrode 142 formed through the same process as the gate electrode 133 of the selection transistor 130, and a third-layer electrode 143, wherein the above-described first insulating film 122 being sandwiched between the first-layer electrode 141 and the second-layer electrode 142, and the above-described second insulating film 123 being sandwiched between the second-layer electrode 142 and the third-layer electrode 143.

The capacitance element 140 is formed of an insulating film made of the same conductive material as that of the three-layer electrodes, i.e., the first-layer electrode 141, the second-layer electrode 142, and the third-layer electrode 143. Since these three-layer electrodes are superimposed onto each other, they may function as a three-layered light blocking film when they are formed of a light blocking material such as metal. Moreover, since layers of the three-layer electrodes can be formed through the same process as either of the source and drain regions or the gate electrode of the TFT constituting the selection transistor 130, the process can be simplified. Alternatively, the layers may be formed through an individual process different from that of the selection transistor by using conductive materials having a desired light blocking effect.

In addition, layers constituting the selection transistor 130 and the light detecting element 120 are formed through the same manufacturing process.

That is, the TFT serving as the selection transistor 130 is configured such that the source area 132S and the drain area 132D are formed around the channel area 132C through the same process as the semiconductor island area of the light detecting element 120, and the source and drain electrodes 134S and 134D are stacked thereon in contact with the source and drain areas 132S and 132D.

These layers are formed through commonly known semiconductor manufacturing processes such as semiconductor thin-film formation using a CVD method, photolithographic patterning, impurity-ion implantation, or insulating film formation.

In the invention, the glass substrate 100 is a sheet of achromatic light transmitting glass. Examples of the glass substrate 100 include a transparent or translucent inorganic glass, that is, an inorganic oxide glass such as a soda-lime glass, a barium-strontium containing glass, a lead glass, an alumino-silicate glass, a borosilicate glass, a barium borosilicate glass or a quartz glass, or an inorganic fluoride glass.

Other materials may be used as an alternative for the glass substrate 100. The glass substrate 100 may be suitably selected for use from a transparent or translucent polymer film such as polyethylene terephthalate, polycarbonate, polymethyl methacrylate, polyether sulfone, polyvinyl fluoride vinyl, polypropylene, polyethylene, polyacrylate, amorphous polyolefin, fluororesin, polysiloxane, or polysilane; a transparent or translucent chalcogenoide glass such as $As_2S_3$, $As_{40}S_{10}$ or $S_{40}Ge_{10}$; a material such as metal oxides and nitrides, for example, ZnO, $Nb_2O$, $Ta_2O_5$, SiO, $Si_3N_4$, $HfO_2$ or $TiO_2$; in a case where the substrate is not used as a light extracting surface for extracting the light emitted from the light emitting area, an opaque semiconductor material such as silicon, germanium, silicon carbide, gallium arsenic or gallium nitride, or the transparent substrate material containing a pigment, or a metal material having a surface subjected to an insulating process, and it is also possible to use a stacked substrate having a plurality of substrate materials stacked thereon. Other alternative examples include a substrate having a conductive surface made of Fe, Al, Cu, Ni, Cr or alloys thereof subjected to an insulating process, thus forming an insulating film made of an inorganic insulating material such as $SiO_2$ or SiN, or an organic insulating material such as resin coating.

Moreover, it is also possible to integrate a circuit including a resistor, a capacitor, an inductor, a diode and a transistor which serve to drive the organic EL element 110, on the surface of the glass substrate 100 or the inner part of the glass substrate 100.

Depending on applications, it is also possible to use a material for transmitting only a light beam having a specific wavelength therethrough or a material with a light converting function of converting into a light beam having a specific wavelength. While it is preferable that the substrate should have an insulating property, it is not particularly restricted but may have a conductivity within a range in which the driving operation of the organic EL element 110 is not disturbed or depending on the applications. The insulating substrate used in the invention includes a substrate having a surface subjected to a insulating process, such as by forming an insulating film on the surface.

On the glass substrate 100, there is formed a base coating layer 101. The base coating layer 101 has a two-layered structure, i.e., a first layer made of SiN and a second layer made of $SiO_2$. Although the SiN or $SiO_2$ layers may be formed through an evaporation process, it is desirable to form the layers through a sputtering process.

On the base coating layer 101, there are formed the above-described selection transistor 130 and light detecting element 120 with the poly-crystalline silicon layer through the same manufacturing process. Although the driving circuit 160 of the organic EL element 110 is constituted by circuit elements such as a resistor, a capacitor, an inductor, a diode, or a transistor, it is desirable to configure the driving circuit 160 with TFT in consideration of a smaller exposure device. As can be seen from FIG. 2(b), in the first embodiment, the light detecting element 120 is disposed at a middle portion between the organic EL element 110 including the light emitting layer 112 and the glass substrate 100 serving as a light output surface, and the island-shaped element area (semiconductor island area $A_R$) of the light detecting element 120 is greater than the light exiting area $A_{LE}$. Moreover, since the light exiting area $A_{LE}$ is disposed at an inner side of the light detecting element 120, a non-transparent material cannot be used as a material for the light detecting element 120. Therefore, it is necessary to form the light detecting element 120 using a material having a light transmitting property so that the light emitted from the light emitting layer 112 is not disturbed by the light detecting element 120. As a material for the light detecting element 120 having the light transmitting property, it is desirable to use a poly-crystalline silicon.

In the first embodiment, after forming the same semiconductor layer on the base coating layer 101, an etching process is performed on the semiconductor layer so that the selection transistor 130 and the light detecting element 120 are formed on the same layer. Such a process of forming individual metal layers of the selection transistor 130 and the light detecting element 120 into an island configuration at a single process is advantageous in view of decreasing the number of manufacturing processes and the manufacturing cost. In the light detecting element 120, the semiconductor island area $A_R$ for receiving the light emitted from the light exiting area $A_{LE}$ is defined on a surface of the island-shaped poly-crystalline or amorphous silicon areas constituting the light detecting element 120.

On the light detecting element 120 and the driving circuit (driving transistor 160) for applying an electric field to the light emitting layer 112 of the organic EL element 110, there are provided the first insulating film 122, the second insulating film 123, and the protective film 124, which are made, for example, of a silicon oxide film. The organic EL element 110 and the light detecting element 120 have a stacked layer structure in which they are separated by the above-mentioned insulating films. In the light detecting element 120, the each of the insulating films or the protective film 124 serves as a gate insulating film, considering the anode 111 as the gate electrode. Therefore, a voltage drop from the electric potential of the anode 111 is determined by the thickness of the protective film 124. The first insulating film 122, the second insulating film 123, and the protective film 124, constituting the gate insulating film is made, for example, of $SiO_2$, and is formed through an evaporation or sputtering process.

On the first insulating film 122 that is the gate insulating film disposed immediately on the selection transistor 130, there is formed the gate electrode 133. As a material for the gate electrode 133, a metal material such as Cr or Al can be used. Alternatively, when the gate electrode 133 requires a transparent property, ITO or a stack structure of a thin metal film and ITO may be used. The gate electrode 133 is formed through an evaporation or sputtering process.

On the substrate having the gate electrode 133 formed thereon, there is formed the second insulating film 123. The second insulating film 123 is formed over the entire surface of the stacked layer structure. The second insulating film 123 is made, for example, of SiN, and is formed through an evaporation or sputtering process.

On the second insulating film 123, there are formed a drain electrode 125D serving as an output electrode of the light detecting element, a source electrode 125S serving as a ground electrode of the light detecting element, and the source and drain electrodes 134S and 134D of the selection transistor 130. The drain electrode 125D and the source electrode 125S are connected to the source and drain regions 121S and 121D of the light detecting element 120, respectively, and serve to selectively transmit electric signals output from the light detecting element 120 to the ground electrode or other destination.

Meanwhile, the source electrode 134S and the drain electrode 134D are connected to the source and drain regions 132S and 132D of the selection transistor 130 and serve to apply a predetermined electric potential to the above-described gate electrode 133 in a state that a predetermined electric potential difference is applied between the source electrode 134S and the drain electrode 134D. Accordingly, the electric field is applied to the channel region 132C, thereby allowing the selection transistor 130 to function as the switching element.

As a material for the drain electrode 125D, the source electrode 125S, the source electrode 134S, and the drain electrode 134D, metal such as Cr can be used. As shown in FIG. 2(a), the drain electrode 125D serving as the output electrode of the light detecting element and the source electrode 125S serving as the ground electrode of the light detecting element are connected to an end portion of the light detecting element 120 through the first and second insulating films 122 and 123. Similarly, as shown in FIG. 2(c), the source electrode 134S and the drain electrode 134D of the selection transistor 130 are connected to an end portion of the selection transistor 130 through the first and second insulating films 122 and 123. Before forming the drain electrode 125D, the source electrode 125S, the source electrode 134S, and the drain electrode 134D, it is necessary to form through-holes into the first insulating film 122 and the second insulating film 123 so that the drain electrode 125D and the source electrode 125S are connected to the light detecting element 120 and the source electrode 134S and the drain electrode 134D are connected to the selection transistor 130. The through-holes extend onto the surfaces of the light detecting element 120 and the selection transistor 130, i.e., to a depth that the contact face of the light detecting element 120 and the drain and source electrodes 125D and 125S and the contact face of the selection transistor 130 and the source and drain electrodes 134S and 134D are exposed to the outside. The through-holes are formed immediately on the end portions of the light detecting element 120 and the selection transistor 130 through an etching process. As an etching gas, halogen gas is used. Specifically, the through-holes are formed into the first insulating film 122 and the second insulating film 123 through a patterning process while introducing the etching gas onto the surface in a state that the surface is coated with a resist pattern having openings formed through a photolithographic process. In this case, the etching gas is selected from those gases that are not chemically reactive with materials constituting the light detecting element 120 and the selection transistor 130. When the process of exposing the contact face of the drain and source electrodes 125D and 125S and the light detecting element 120 and the contact face of the drain and source electrodes 134D and 134S and the selection transistor 130 to the outside is completed, there are obtained the drain electrode 125D, the source electrode 125S, the source electrode 134S, and the drain electrode 134D. The source electrode 134S and the drain electrode 134D are obtained by forming a metal layer serving as a sensor electrode on the surface of the second insulating film 123, the surface of the above-described through-hole, both sensor electrodes, the surface of the light detecting element 120, and the surface of the contact face of the selection transistor 130, and then performing an etching process onto the metal layer so that the metal layer is separated into the drain electrode 125D, the source electrode 125S, the source electrode 134S, and the drain electrode 134D.

After the drain electrode 125D serving as the output electrode of the light detecting element, the source electrode 125S serving as the ground electrode of the light detecting element, the source electrode 134S, and the drain electrode 134D are formed, a protective film 124 is formed. The protective film 124 is made, for example, of SiN, and formed through an evaporation or sputtering process.

An anode 111 is formed on the protective film 124. The anode 111 is made, for example, of ITO (an indium-tin oxide). In addition to the ITO, examples of a material for the anode 111 may include IZO (Zinc Oxide doped with Indium) ATO ($SnO_2$ doped with Sb), AZO (ZnO doped with Al), ZnO, $SnO_2$, or $In_2O_3$. As shown in FIG. 2(a), the anode 111 is formed on the surface of the protective film 124, i.e., corresponding to a portion that is disposed immediately on the light detecting element 120. The anode 111 is connected to the driving circuit 160 (more specifically, to a drain electrode (without indicating numerals in the figure) of the driving circuit 160) via the protective film 124. Therefore, it is necessary to form a through-hole into the protective film 124 before formation of the anode 111. The through-hole is formed through an etching process. After the etching process, a layer of the anode 111 is obtained. Although the anode 111 can be formed through an evaporation process, it is desirable to form the anode through a sputtering process.

After forming the anode 111, there is formed a pixel defining member 114 using an inorganic insulating material such as a silicon nitride film, a silicon oxide film, silicon oxynitride, titanium oxide, aluminum nitride or aluminum oxide, or an organic insulating material such as polyimide or polyethylene. It is desirable that the material for the pixel defining member 114 has a good insulating property, a strong endurability of dielectric breakdown, a good film forming property, and a good patterning property. The pixel defining member 114 used in the invention refers to a member for defining the light exiting area, and is defined as an opening formed on the insulating film disposed between the first or second electrode and the light emitting layer.

In the first embodiment, silicon nitrides and aluminum nitrides are used as a material constituting the silicon nitride film of the pixel defining member 114. The pixel defining member 114 is provided between the light emitting layer 112 to be described and the anode 111 so as to electrically separate the light emitting layer 112 disposed outside the light exiting area $A_{LE}$ from the anode 111, thereby defining an light emitting area of the light emitting layer 112.

Therefore, those areas of the light emitting layer 112 that are superimposed by the pixel defining member 114 serve as a non light emitting area, and those areas that are not superimposed by the pixel defining member 114 serves as the light exiting area $A_{LE}$. The pixel defining member 114 is configured such that the light exiting area $A_{LE}$ of the light emitting layer 112 is smaller than the semiconductor island area $A_R$ of the light detecting element 120, and the light exiting area $A_{LE}$ is disposed at an inner side of the semiconductor island area $A_R$ of the light detecting element 120.

After forming the pixel defining member 114, there is formed the light emitting layer 112. The light emitting layer 112 is made of an inorganic material, or a high or low-molecular organic material to be described later in detail.

Although in the first embodiment, the organic EL element 110 is used as a light emitting element for forming the light emitting layer 112, an inorganic EL element having its light emitting unit made of an inorganic material may also be used.

Examples of the inorganic light emitting material include titanium-phosphorus potassium, barium-boron oxide, or lithium-boron oxide.

Since the inorganic EL element having the light emitting layer 112 made of the inorganic light emitting material can be manufactured through a screen printing process, it is possible to form the inorganic EL element with little production error. Moreover, since it does not require facilities such as a cleanroom, it is possible to manufacture the EL element with mass production. Accordingly, it is possible to provide the exposure device at a low manufacturing cost.

It is desirable that the high-molecular organic light emitting material for the light emitting layer 112 has a fluorescent or phosphorescent property in a visible region and have an excellent film forming property. For example, a polymer light emitting material such as PPV (polyparaphenylenevinylene) or polyfluorene may be used.

As a polymer material for the light emitting layer 112, an organic compound having a tree-shaped multi-branched structure such as dendrimer may be used. Since such an organic compound has a tree-shaped multi-branched high or low-molecular structure in which the light emitting structure unit is 3-dimensionally surrounded by a plurality of outer structure units, the light emitting structure unit is 3-dimensionally isolated and thus the organic compound itself has a fine particle shape. Therefore, when the organic compound is formed into a thin film shape, the neighboring light emitting structure units in a collection of organic compounds are unlikely to come closer to each other thanks to the presence of the outer structure units. Accordingly, the light emitting structure units are uniformly distributed in the thin film, and thus it is possible to increase the lifetime of the light emitting element while maintaining a high light intensity.

In addition to $Alq_3$ and Be-benzoquinolinol ($BeBq_2$), as a low-molecular organic light emitting material for the light emitting layer 112, there may be used a fluorescent brightening agent such as a benzooxazol type, for example, 2,5-bis(5,7-di-t-pentyl-2-benzooxazolyl)-1,3,4-thiadiazol, 4,4'-bis(5, 7-pentyl-2-benzooxazolyl)stilbene, 4,4'-bis[5,7-di-(2-methyl-2-butyl)-2-benzooxazolyl]stilbene, 2,5-bis(5,7-di-t-pentyl-2-benzooxazolyl)thiophin, 2,5-bis([5-a,a-dimethylbenzyl]-2-benzooxazolyl)thiophen, 2,5-bis[5,7-di-(2-methyl-2-butyl)-2-benzooxazolyl-3,4-diphe nylthiophen, 2,5-bis(5-methyl-2-benzooxazolyl)thiophen, 4,4'-bis(2-benzooxazolyl)biphenyl, 5-methyl-2-[2-[4-(5-methyl-2-benzooxazolyl)phenyl]vinyl]benzooxazolyl 2-[2-(4-chlorophenyl)vinyl]naphtho[1,2-d]oxazol, a benzothiazol type, for example, 2,2'-(p-phenylenedivinylene)-bisbenzothiazol, or a benzoimidazol type, for example, 2-[2-[4-(2-benzoimidazolyl)phenyl]vinyl]benzoimidazol or 2-[2-(4-carboxyphenyl)vinyl]benzoimidazol, an 8-hydroxyquinoline type metal complex such as tris(8-quinolinol)aluminum, bis(8-quinolinol)magnesium, bis(benzo[f]-8-quinolinol)zinc, bis(2-methyl-8-quinolinolate)aluminum oxide, tris(8-quinolinol)indium, tris(5-methyl-8-quinolinol)aluminum, 8-quinolinol lithium, tris(5-chloro-8-quinolinol)gallium, bis(5-chloro-8-quinolinol)calcium or poly[zinc-bis(8-hydroxy-5-quinolinol)methane], a metal chelating oxynoide compound such as dilithium epindrydione, a styrylbenzene type compound, for example, 1,4-bis(2-methylstyryl)benzene, 1,4-(3-methylstyryl)benzene, distyrylbenzen, 1,4-bis(2-ethylstyryl)benzene, 1,4-bis(3-ethylstyryl)benzene, 1,4-bis(2-methylstyryl) 2-methylbenzene, a distilpyrazine derivative such as 2,5-bis(4-methylstyryl)pyrazine, 2,5-bis(4-ethylstyryl)pyrazine, 2,5-bis[2-(1-naphtyl) vinyl]pyrazine, 2,5-bis(4-methoxystyryl)pyrazine, 2,5-bis[2-(4-biphenyl)vinyl] pyrazine or 2,5-bis[2-(1-pyrenyl)vinyl]pyrazine, a naphthalimide derivative, a perylene derivative, an oxadiazol derivative, an aldazine derivative, a cyclopentadiene derivative, a styrylamine derivative, a coumalin type derivative, or an aromatic dimethyldine derivative. Furthermore, anthracene, salicylate, pyrene, and coronene may also be used. Alternatively, it is also possible to use a phosphorescent light emitting material such as fac-tris(2-phenylpyridine) iridium.

The light emitting layer 112 made of the high or low-molecular material can be obtained by forming the material dissolved by using a solvent such as toluene or xylene into a layer shape using a wet-type film forming method as represented by a spin coating method, an ink-jet method, a gap coating or a printing method and dispersing the solvent contained in the solution. Although the light emitting layer 112 made of the low-molecular material is generally obtained by forming the material into a stacked layer using a vacuum evaporation method, an evaporation polymerization method, or an CVD method, either of the above-described methods may be used depending on the property of the light emitting material.

Although in the first embodiment, a single-layered light emitting layer 112 has been described in order to simplify the descriptions, the light emitting layer 112 may have a three-layered structure in which a hole transporting layer (not shown), an electron blocking layer (not shown), and the above-described organic light emitting material layer (not shown) are stacked onto each other in this order from the side of the anode 111. Moreover, the light emitting layer 112 may have a two-layered structure in which an electron transporting layer (not shown) and the organic light emitting material layer (not shown) are stacked onto each other in this order from the side of the cathode 113. Furthermore, the light emitting layer 112 may have a two-layered structure in which a hole transporting layer (not shown) and the organic light emitting material layer (not shown) are stacked onto each other in this order from the side of the anode 111. Furthermore, the light emitting layer 112 may have a seven-layered structure in which a hole injection layer (not shown), a hole transporting layer (not shown), an electron blocking layer (not shown), the organic light emitting material layer (not shown), a hole blocking layer, an electron transporting layer (not shown), and an electron injecting layer (not shown) are stacked one each other in this order from the side of the cathode 113. Alternatively, the light emitting layer 112 may have a single-layered structure made only of the above-described organic light emitting material. In this manner, the light emitting layer 112 as referred in the first embodiment includes a multi-layered structure including functional layers such as the hole transporting layer, the electron blocking layer, or the electron transporting layer. The above statement is equally applied to other embodiments to be described later.

Moreover, it is desirable that the hole transporting layer in the above-described functional layer should have a high hole mobility and is transparent and excellent in a film forming property, and, in addition to the TPD, there are used organic materials, for example, a polyphyrin compound such as porphin, tetraphenylporphin copper, phthalocyanine, copper phthalocyanine or titanium phthalocyanine oxide, aromatic tertiary amine such as 1,1'-bis[4-(di-P-tolylamino) phenyl] cyclohexane, 4,4',4''-trimethyltriphenylamine, N,N, N',N'-tetrakis(P-tolyl)-P-phenylenediamine, 1-(N,N-di-P-tolylamino)naphthalene, 4,4'-bis(dimethylamino)-2-2'-dimethyltriphenylmethane, N,N, N',N'-tetraphenyl-4,4'-diaminobiphenyl, N,N'-diphenyl-N,N'-di-m-tolyl-4,4'-diaminophenyl, or N-phenylcarbazole, a stilbene compound such as 4-di-P-tolylamino stilbene, 4-(di-P-tolylamino)-4'-[4-(di-P-tolylamino)styryl]stilbene, a triazole derivative, an oxadizazole derivative, an imidazole derivative, a polyarylalkane derivative, a pyrazoline derivative, a pyrazolone derivative, a phenylenediamine derivative, an anilamine derivative, an amino substituted chalcone, derivative, an oxazole derivative, a styrylanthracene derivative, a fluorenon derivative, a hydrazine derivative, a silazane derivative, a polysilane type aniline type copolymer, polymer oligomer, a styrylamine compound, an aromatic dimethylidine type compound, or a polythiophene derivative, for example, poly-3,4-ethylene-dioxythiophene (PEDOT), tetrahexylfluorenylbiphenyl (TFB) or poly-3-methylthiophene (PMeT). Moreover, there is also used a polymer dispersion type hole transporting material in which a low molecular organic material for hole transportation is dispersed in a polymer such as polycarbonate.

In addition, inorganic oxides such as $MoO_3$, $V_2O_5$, $WO_3$, $TiO_2$, $SiO$, $MgO$ may be used. When transitional metal oxides such as $MoO_3$ or $V_2O_5$ are used as the hole transporting layer, it is possible to increase the lifetime of the organic EL element in an efficient manner. Moreover, these hole transporting materials can also be used as an electron blocking material.

As a material for the electron transporting layer in the above-described functional layers, a polymer material comprising an oxadiazole derivative, for example, 1,3-bis(4-tert-butylphenyl-1,3,4-oxadiazolyl)phenylene (OXD-7), an anthraquinodimethane derivative, a diphenylquinone derivative or a silole derivative, or bis(2-methyl-8-quinolinorate)-(para-phenylphenolate)aluminum (BAlq), bathocuproin (BCP) may be used. Moreover, these electron transporting materials can also be used as an electron injection material or a hole blocking material.

After forming the light emitting layer 112, a cathode 113 is formed. The cathode 113 is obtained by forming metals such as Al into a laminated configuration through an evaporation process. Moreover, a metal or an alloy having a low work function is used, and a metal such as Ag, Al, In, Mg or Ti, an Mg alloy such as an Mg—Ag alloy or an Mg—In alloy, and an Al alloy such as an Al—Li alloy, an Al—Sr alloy or an Al—Ba alloy are used for the cathode 113 of the organic EL element 110. Alternatively, a metal laminated structure may be used in which a first-electrode layer making contact with an organic material layer made of a metal such as Ba, Ca, Mg, Li or Cs, or fluorides or oxides thereof such as LiF or CaO is formed on a second-electrode layer made of a metal such as Ag, Al or In.

The exposure device of the first embodiment is configured to use light that has been emitted from the organic EL element 110 and then passed through the glass substrate 100. Such a type of the organic EL element is called a bottom emission type.

Figure 2:
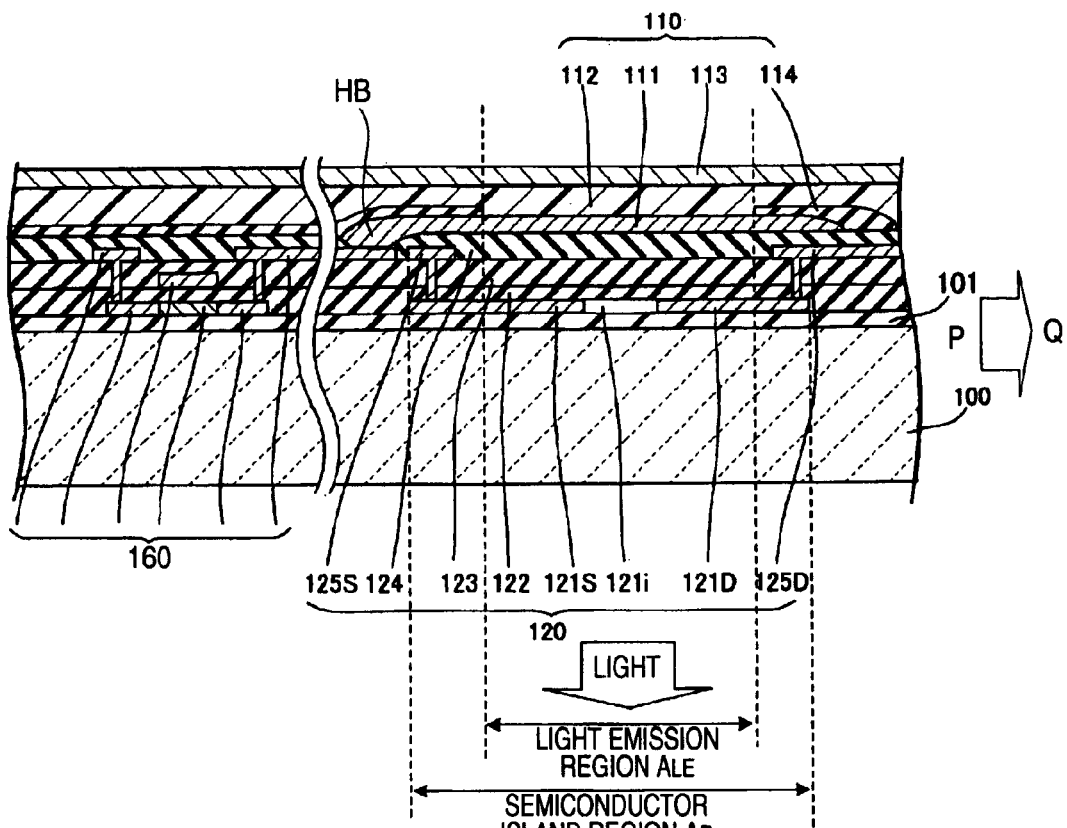
FIG. 2(a) is a cross-sectional diagram of a peripheral configuration of a light detecting element in accordance with the first embodiment of the invention.
FIG. 2(b) is a cross-sectional diagram showing a peripheral configuration of a capacitance element in accordance with the first embodiment of the invention.
FIG. 2(c) is a cross-sectional diagram showing a peripheral configuration of a selection transistor in accordance with the first embodiment of the invention.
Figure 2:
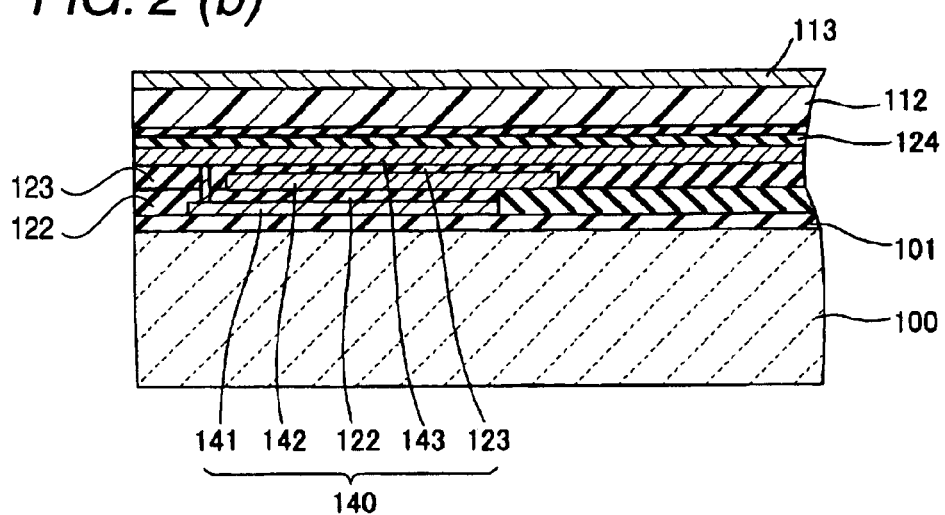
Figure 2:
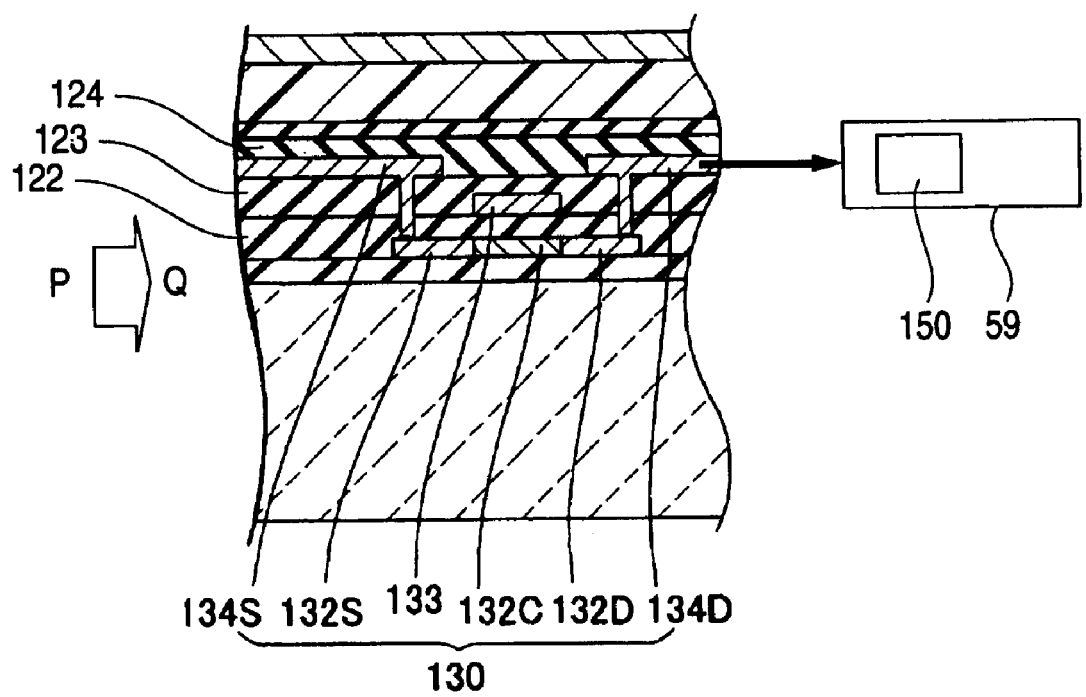

Since in the bottom emission type, the light is extracted from the glass substrate 100 side, it is necessary to form the light detecting element 120 using a highly transparent material such as poly-crystalline silicon (polysilicon). Although the light detecting element 120 made of the poly-crystalline silicon has a problem of inferior photocurrent-generating capability compared with that made of amorphous silicon, such a problem may be solved by forming a capacitance element 140 in the vicinity of the organic EL element 110 as shown in FIGS. 1 and 2(*b*) so that charge corresponding to the electric current output from the light detecting element 120 is accumulated in a capacitor for a predetermined time period, or by providing a processing circuit to be described later for accumulating a predetermined amount of charge and discharging the charge so that a voltage conversion is performed therein. Since in the bottom emission type, the light extracting electrode (anode) can be easily formed into a transparent electrode, it is possible to simplify the manufacturing process.

As shown in FIGS. 1 and 3, in the exposure device according to the first embodiment, a plurality of organic EL elements 110 are aligned in the main scanning direction (in the direction of the light emitting element array), and the light emitting area (light exiting area) is provided to the light detecting element 120 on a one-to-one basis. With this configuration, the light intensity of the individual organic EL element 110 can be measured by the light detecting element 120. Since the light detecting element 120 and the organic EL element 110 are separated from each other by thin films (the first and second insulating films 122 and 123 and the protective film 124) and leakage of light in a planar direction is extremely small, an optical effect such as crosstalk can be disregarded. Accordingly, it is possible to measure the light intensity of the plurality of organic EL element 110 at the same time, thus greatly decreasing the measurement time period.

FIG. 2(*a*) shows interrelations between the light detecting element 120, the drain electrode 125D serving as the output electrode of the light detecting element, the source electrode 125S serving as the ground electrode of the light detecting element, the light exiting area $A_{LE}$, the semiconductor island area $A_R$ serving as the element area of the light detecting element 120, an ITO (indium tin oxide) 111 serving as the anode of the light emitting element 112, the contact hole $H_B$, and the drain electrode of the driving circuit 160. The light detecting element 120 is connected to the drain electrode 125D and the source electrode 125S. The drain electrode 125D serving as the output electrode of the light detecting element is an electrode for transmitting the electric signals output from the light detecting element 120 toward the processing circuit unit 59 via the selection transistor 130 shown in FIG. 2(*c*).

The processing circuit unit 59 generates light intensity measurement data on the basis of the electric signals output from the light detecting element 120, and a light intensity correction unit (not shown) generates a feedback signal. A light intensity correcting operation is performed on the basis of the feedback signal.

In the first embodiment, the light intensity of the individual organic EL element 110 is corrected on the basis of the feedback signal, and the value of electric current for driving the organic EL element 110 is controlled by a source driver 61 (not shown; see FIG. 21 for reference). Although in the first embodiment, the light intensity is controlled on the basis of the output of the light detecting element 120, the invention may be easily applied to a so-called PWM method in which the time period for driving the organic EL element 110 is controlled on the basis of the feedback signal. The PWM method is advantageous in that the control can be realized with a full-digital circuit configuration.

The source electrode 125S as the ground electrode of the light detecting element is an electrode for connecting the light detecting element 120 to the ground. The ITO (indium tin oxide) serving as the anode 111 of the organic EL element 110 as the light emitting element is connected to the drain electrode of the driving circuit 160 (driving transistor), and the organic EL element 110 is controlled by the driving circuit 160 through the drain electrode.

As shown in FIGS. 1 and 3, the exposure device in accordance with the first embodiment is configured such that the light detecting elements 120 made of poly-crystalline silicon (polysilicon) having an island-shape are aligned in the main scanning direction in an array configuration, the light exiting area $A_{LE}$ on the light emitting layer 112 of the individual organic EL element 110 is defined by the silicon nitride film serving as the pixel defining member 114, and the light detecting element 120 having the semiconductor island area $A_R$ greater in size than the light exiting area $A_{LE}$ is disposed above the light emitting layer 112. Since the semiconductor island area $A_R$ (the island-shaped poly-crystalline silicon area) of the light detecting element 120 is greater than the light exiting area $A_{LE}$, it is possible to form the bump-like structure such as the source and drain electrodes 125S and 125D to be separated from the light exiting area $A_{LE}$. Therefore, at least the light exiting area $A_{LE}$ can be formed on the flat surface of the light detecting element 120. With this configuration, it is possible to prevent any possible local change in the thickness of the light emitting layer 112 even when the light emitting layer 112 is formed through the above-described wet-etching process, thereby preventing any irregularity in the electric current flowing through the light emitting layer 112. Accordingly, it is possible to manufacture the exposure device with an increased lifetime and having uniform light intensity distribution.

Since the semiconductor island area $A_R$ of the light detecting element 120 to be mounted on the exposure device of the first embodiment is greater than the light emitting area, i.e., the light exiting area $A_{LE}$, it is possible to convert the light emitted from the light emitting layer 112 into an electric signal to be use in the light intensity correction process in an efficient manner.

Figure 4:
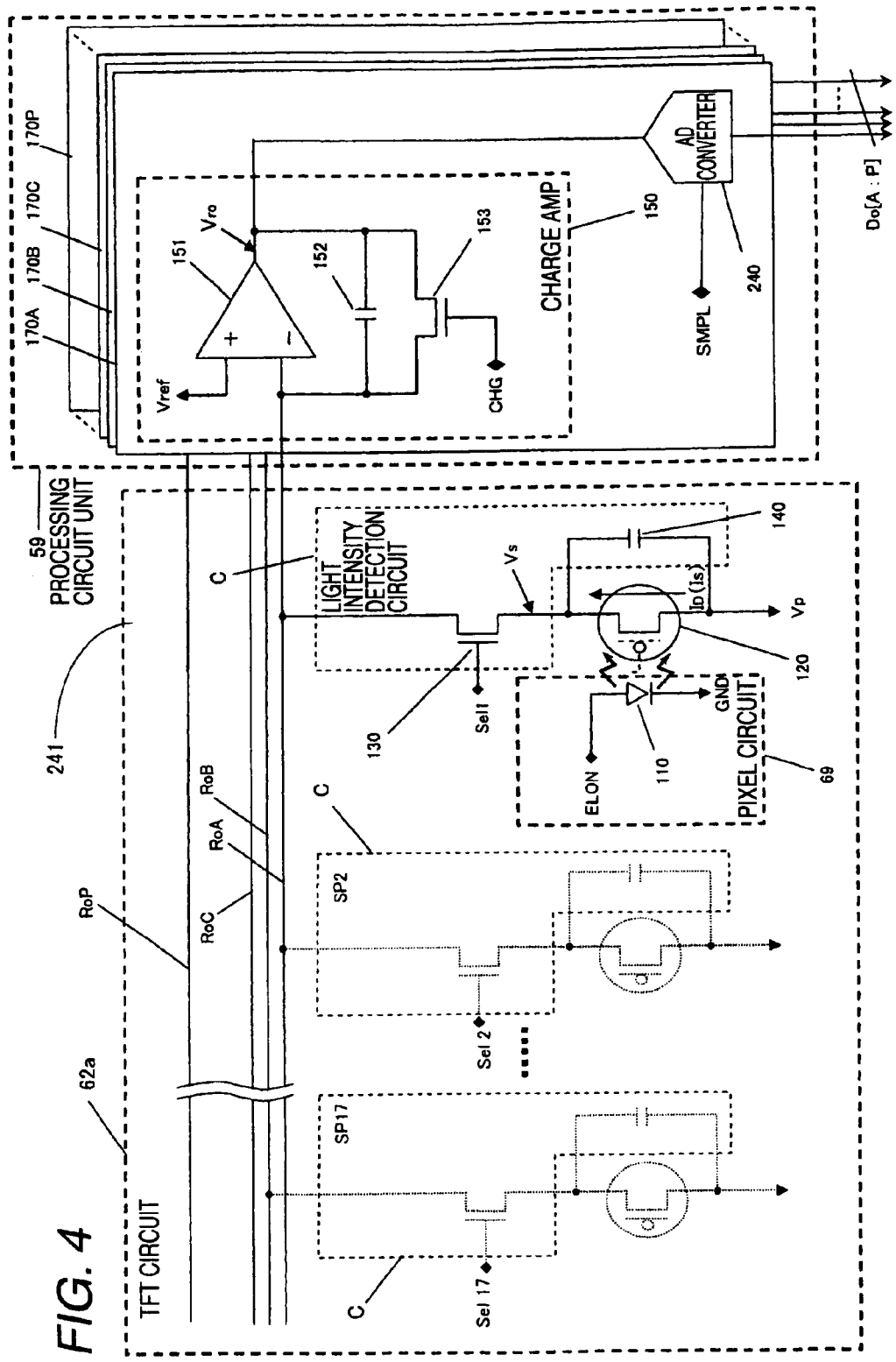
FIG. 4 is a circuit diagram of a light intensity detection circuit and a processing circuit unit which are installed in the exposure device in accordance with the first embodiment of the invention.

FIG. 4 is a circuit diagram of a light intensity detection circuit C and a processing circuit unit 59 which are installed in the exposure device in accordance with the first embodiment of the invention.

Hereinafter, the light intensity detection circuit C to be used in the exposure device of the invention and the processing circuit unit 59 for processing the output of the light intensity detection circuit C will be briefly described with reference to FIG. 4 (details thereof will be described later). In the following descriptions, the light intensity detection circuit C and the processing circuit unit 59 for processing the output thereof will be collectively referred to as a light intensity measuring unit 241.

As shown in FIG. 4, the light intensity measuring unit 241 includes a processing circuit unit 59 as a driving Ic, having a plurality of detection processing circuit 170 including a charge amplifier 150 constituted by an operational amplifier 151, and a light intensity detection circuit C integrated on the above-described glass substrate 100 and connected to the input terminal of the processing circuit unit 59. The light intensity detection circuit C is connected in parallel with the above-described selection transistor 130 and the light detecting element 120, and configured with the capacitance element (capacitor) 140 that is discharged with the output current (photocurrent) of the light detecting element 120.

Hereinafter, description will be made with reference to FIGS. 1, 2(a), and 2(b).

As can be seen from FIGS. 1 and 2(b), the capacitance element 140 is formed by sandwiching the first insulating film 122 with the conductive films formed through the same process as the source and drain electrodes 125S and 125D of the light detecting element 120 so that the conductive films constituting the capacitance element 140 are connected to the source and drain electrodes 125S and 125D of the light detecting element 120.

The light detecting element 120 detects the light intensity in such a manner that the light emitted from the organic EL element 110 is converted into an electric signal at the channel region 121i made of poly-crystalline silicon, and the electric current flowing from the source region 121S to the drain region 121D is extracted as the photocurrent.

When the organic EL element 110 is in the lighting state at the time of measuring the charge accumulated in the capacitance element 140, the anode 111 of the organic EL element 110 is charged with a predetermined electric voltage. Therefore, the anode 111 serves as the gate electrode of the light detecting element 120.

With the electric potential of the gate electrode (the anode 111), electric field is applied to the poly-crystalline silicon layer, i.e., the channel region 121i of the light detecting element 120 and a drain current $I_D$ is caused to flow. Since the drain current $I_D$ is additive to the photo-electric conversion current $I_s$, the photo-electric conversion current $I_s$ to be output, as the sensor output, from the drain electrode 125D to the light intensity detection circuit C corresponds to the addition of an actual photo-electric conversion current $I_s$ and the drain current $I_D$. Accordingly, there is a problem of deteriorating the light intensity detection precision.

As a result of many experiments, the inventors of the invention have found that the light detecting element 120 is greatly influenced by the electric potential of the anode 111 and functions as a thin-film transistor having, as its gate electrode, the anode 111 of the EL element 110. Moreover, since the drain current ID of the thin-film transistor is about 100 times greater than the photocurrent resulting from the photo-electric conversion, it is very difficult to detect the very small photocurrent in the presence of the drain current $I_D$.

Figure 5:
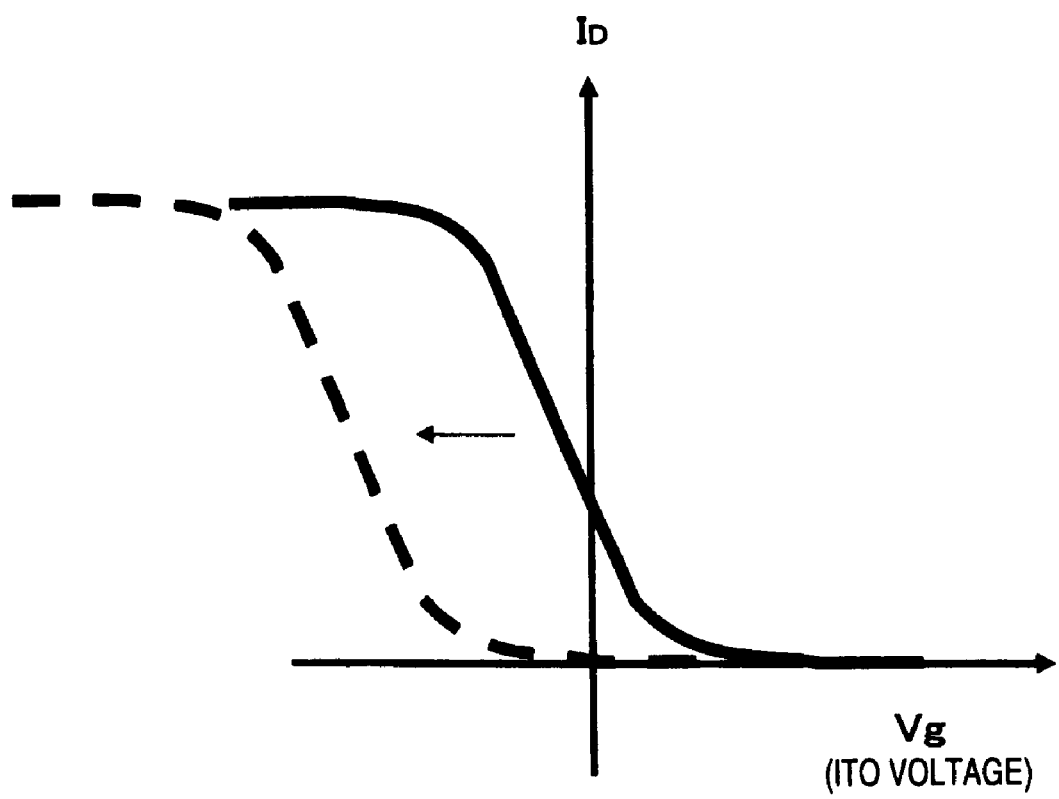
FIG. 5 is an explanatory diagram showing a relationship between a gate voltage and a drain current of a light detecting element in accordance with the first embodiment of the invention.

FIG. 5 is an explanatory diagram showing a relationship between a gate voltage Vg and a drain current $I_D$ of the light detecting element 120 in accordance with the first embodiment of the invention.

In FIG. 5, the relationship between the gate voltage Vg and the drain current $I_D$ are depicted by the solid lines. To secure a high precision of the light intensity detection, it is desirable that the drain current $I_D$ exhibits a small variation with respect to the variation in the gate volute Vg. Accordingly, it is desirable to operate the light detecting element in a region where the drain current $I_D$ of the TFT is 0, i.e., an OFF region where the transistor is turned off.

In the relationship between the gate voltage Vg and the drain current $I_D$, the drain current $I_D$ flows in the regions, Vg>0, and the drain current $I_D$ varies with the variation in the gate voltage Vg. As shown by the broken lines in FIG. 5, it is desirable to shift the electric potential of gate electrode toward a negative direction so as to operate the TFT in the OFF region, thereby eliminating the presence of the dark current. In the invention, since it is essential to detect the output of the light detecting element 120 with a high precision, it is necessary to allow the light detecting element 120 to detect the light at the OFF region of the TFT constituting the light detecting element.

Specifically, it is possible to configure the light detecting element 120 to operate in the OFF region by controlling the impurity concentration of the channel region 121i of the TFT constituting the light detecting element 120 to be relatively lower than that of the source and drain regions 121S and 121D so that the threshold voltage is increased to be greater than the electric potential of the first electrode (the anode 111).

The light detecting element 120 is configured such that the amount of the drain current $I_D$ and the photo-electric conversion current is determined by the electric field applied to the poly-crystalline silicon layer, i.e., the channel region 121i of the constituting TFT Therefore, if a portion of the channel region 121i of the TFT is not covered by the anode 111, it is difficult to control the electric field to be applied to the corresponding regions that is not covered by the anode 111. Accordingly, there is a problem that unstable electric field, i.e., disturbance resulting from a surface electric potential or external electric field is applied the channel region, thereby deteriorating the light intensity detection precision.

When the light detecting element 120 is formed through the same process as the TFT constituting the driving circuit 160, the light detecting element 120 is formed into a structure in which the light detecting element is covered with the first electrode (the anode 111) disposed at the glass substrate 100 side of the EL element 110, via the interlayer insulating film, i.e., the first insulating film 122, the second insulating film 123, and the protective film 124. The first electrode (the anode 111) serves as the gate electrode of the TFT constituting the driving circuit 160. In this case, the interlayer insulating film serves as the gate insulating film due to its dielectric constant base on the film thickness and material thereof. Meanwhile, since the electric potential applied to the anode 111 may become irregular, it is necessary that the thickness of the gate insulating film is determined such that irregularity in the electric potential of the anode 111 is absorbed by a voltage drop caused by the gate insulating film.

As a result, with the electric potential of the first electrode (the anode 111) of the EL element 110, an electric field is applied to the channel region 121i, and the characteristics of the TFT constituting the light detecting element 120 is controlled with the voltage between the gate and the source thereof. Since the thin-film transistor as the light detecting element 120 is characterized in that the output thereof is greatly changed at regions where the photo-electric conversion current flows, it has been known that it is effective to detect the light intensity at regions, i.e., the OFF region, where the photo-electric conversion current does not flow. Therefore, it is possible to perform the light intensity detection with a higher precision by adjusting the thickness or material of the interlayer insulating film serving as the gate insulating film so that the electric potential of the first electrode (the anode 111) of the EL element 110 is effectively functioning as the gate voltage of the thin-film transistor serving as the light detecting element 120. To apply the electric potential of the anode 111 as the gate electric potential, it is more effective to cover the entire surface of the channel region 121i of the thin-film transistor as the light detecting element 120 with the anode 111 of the EL element 110.

<Light Intensity Measuring Operation>

Figure 6:
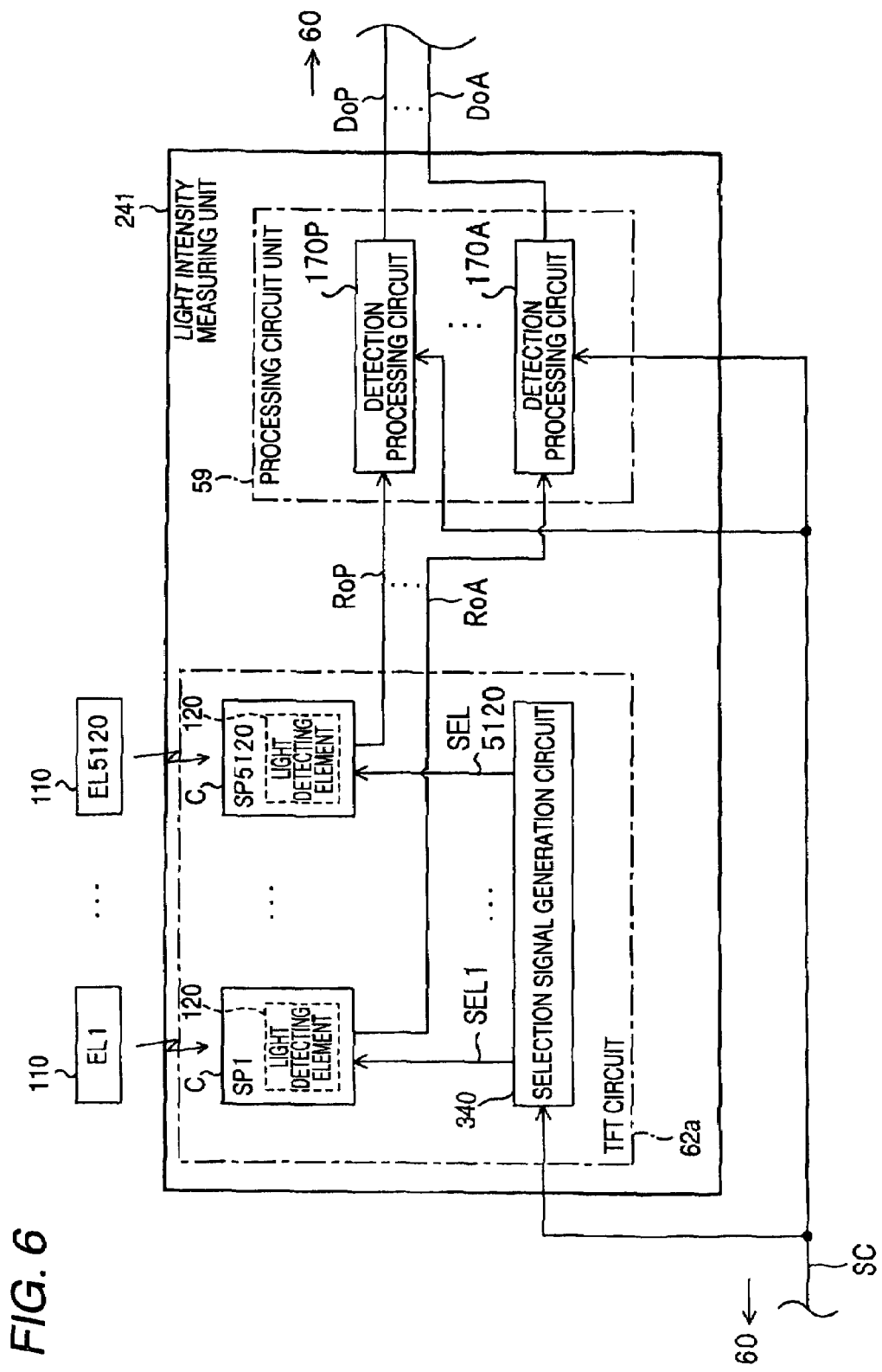
FIG. 6 is an explanatory diagram showing a main part of the light intensity measuring unit in accordance with the first embodiment of the invention.

FIG. 6 is an explanatory diagram showing a main part of the light intensity measuring unit 241 in accordance with the first embodiment of the invention.

Hereinafter, the light intensity measuring unit 241 in accordance with the first embodiment of the invention will be described in detail.

The light intensity measuring unit 241 is used to measure the intensity of light emitted from the organic EL element 110.

As shown in FIG. 6, the light intensity measuring unit 241 includes a plurality of light intensity detecting circuit C provided in correspondence to the plurality of organic EL element 110, a selection signal generation circuit 340 outputting sensor selection signals to the light intensity detecting circuits C, and a number (16) of detection processing circuit 170A to 170P. The light intensity measuring unit 241 is an example of a light intensity measuring apparatus, and the light intensity detecting circuit C is an example of a light intensity detecting circuit.

The detection processing circuits 170A to 170P have the same configuration, and thus will be collectively referred to as the detection processing circuit 170 when there is no need to distinguish them. The number of detection processing circuits 170 is not limited to 16, but may be set to m (m: a positive integer equal to or greater than 1).

As described above, the light intensity detection circuit C and the selection signal generation circuit 340 are configured as an monolithic integrated device made of polysilicon, together with the organic EL element and the TFT circuit 62a. Therefore, since the same kinds of elements such as transistors can be formed in the light intensity detection circuit C or the TFT circuit 62a through the same process, it is possible to simplify the manufacturing process.

The selection signal generation circuit 340 is connected to the engine control unit 42 through the FPC 60 (see FIGS. 21 and 22 for reference) (which will be described in detail later when describing an example of the image forming apparatus having the exposure device mounted thereon in a second embodiment). Moreover, the selection signal generation circuit 340 is also connected to the light intensity detection circuits C through the selection signal lines SEL1 to SEL5120. The "X" in the symbol "SELX" of the selection signal lines SEL1 to SEL5120 is a sensor pixel number SPNO provided to the light intensity detection circuits C serving as the destination source, and will be collectively referred to as the selection signal line SEL when there is no need to distinguish them.

The selection signal generation circuit 340 generates the sensor selection signal for controlling the operation of the light intensity detection circuit C on the basis of a sensor control input SC received from the engine control unit 42 via the FPC 60 and outputs the sensor selection signal to the light intensity detection circuit C via the selection signal line SEL. Accordingly, it is possible to control the light intensity detecting timings for the light intensity detection circuits C.

The light intensity detection circuit C is connected to the selection signal generation circuit 340 via the selection signal line SEL, and is also connected to the detection processing circuits 170A to 170P via either of the driver lines RoA to RoP. Moreover, the light intensity detection circuit C detects the light intensity on the basis of the sensor selection signal received from the selection signal generation circuit 340, and the output signal of the light intensity detection circuit C is output to the detection processing circuit 170. The "X" in the symbol "RoX" of the driver lines RoA to RoP is an output ID (A to P) provided to the detection processing circuits 170 serving as the destination source, and will be collectively referred to as the driver line Ro when there is no need to distinguish them.

The detection processing circuits 170A to 170P are provided to the processing circuit unit 59, and are connected to the light intensity detection circuits C via the driver lines RoA to RoP. The detection processing circuits 170A to 170P are also connected to the engine control unit 42 through the sensor output signal lines DoA to DoP and the FPC 60. The detection processing circuits 170A to 170P acquire the output signal from the light intensity detection circuit C and then outputs the light intensity measurement data to the FPC 60. The "X" in the symbol "DoX" of the sensor output signal lines DoA to DoP is an output ID (A to P) provided to the detection processing circuits 170 connected thereto, and will be collectively referred to as the sensor output signal line Do when there is no need to distinguish them.

The light intensity detection circuits C are classified into a plurality of groups and thus connected to either one of the driver lines RoA to RoP in accordance with the classification. The classification of the light intensity detection circuit C will be described with reference to FIG. 7.

Figure 7:
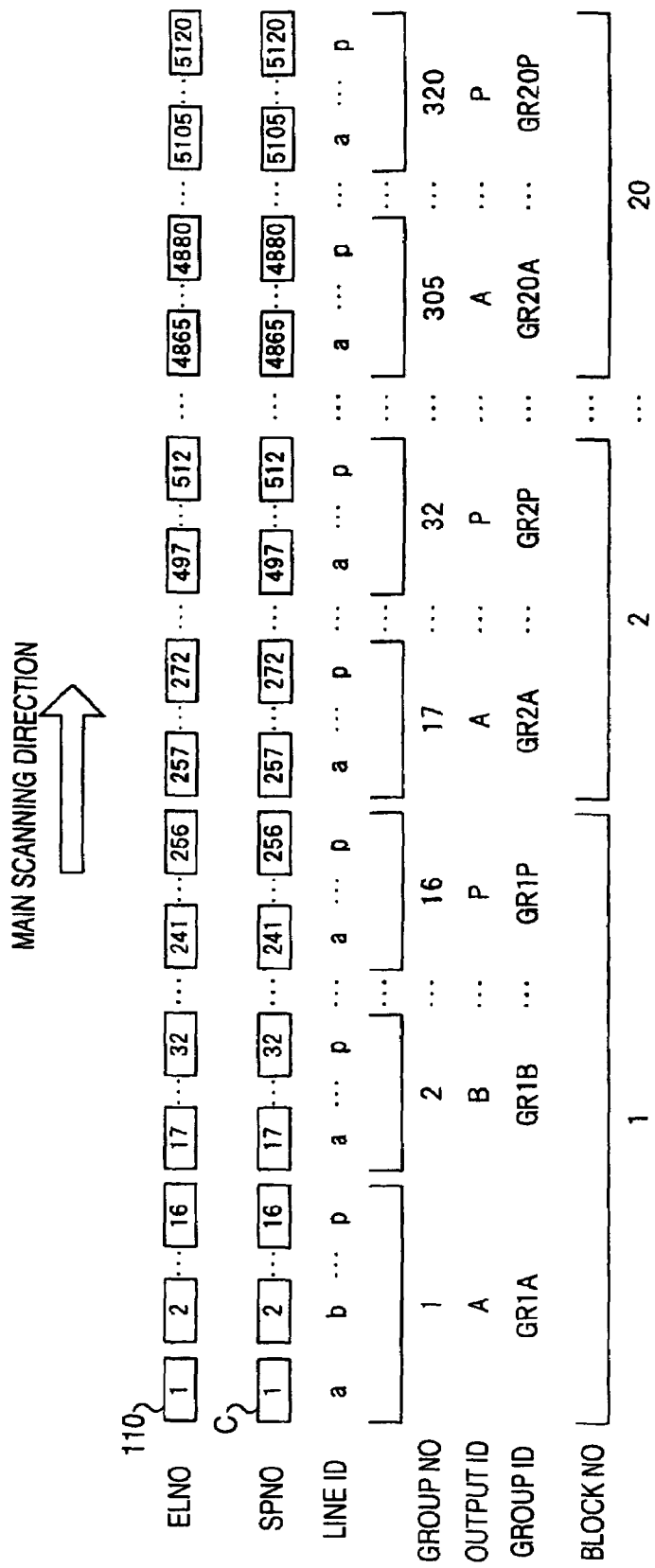
FIG. 7 is an explanatory diagram showing each group of the light intensity detection circuit in the light intensity measuring unit in accordance with the first embodiment of the invention.

FIG. 7 is an explanatory diagram showing each group of the light intensity detection circuit C in the light intensity measuring unit 241 in accordance with the first embodiment of the invention. As shown in FIG. 7, a number (5120) of organic EL elements 110 are aligned in an array configuration in the main scanning direction with a resolution of 600 dpi. Each of the organic EL elements 110 is assigned with an ID number (hereinafter, referred to as ELNO). The ELNO is a serial number starting from 1, and is sequentially assigned to the organic EL elements 110 in the order of their locations in the main scanning direction.

There are provided a number (5120) of light intensity detection circuits C in correspondence to the organic EL elements 110 in one-to-one basis, and each of the light intensity detection circuits detects the light intensity of the corresponding organic EL element 110. The ID number (hereinafter, referred to as SPNO) provided to the light intensity detection circuit C has the same number as the ELNO provided to the corresponding organic EL element 110. For example, the SPNO of 3000 is assigned to the light intensity measuring circuit C that is provided in correspondence to the organic EL element 110 having its ELNO of 3000.

The light intensity detection circuits C are classified into a number (320=5120÷16) of sensor groups by grouping a number (n: 16 in the present embodiment) of light intensity detection circuits C having consecutive SPNOs. The sensor groups are assigned with a group NO of from 1 to 320 in the increasing order of the SPNO assigned to the sensor groups. In each of the sensor groups, line IDs a, b, . . . , p are assigned to the light intensity detection circuits C in the increasing order of the SPNO. That is, the same line IDs are assigned to every n (16) numbers of light intensity detection circuits C.

The sensor groups are classified into a number (20=320÷16) of blocks by grouping a number (m corresponding to the number of detection processing circuits 170, and m is 16 in the present embodiment) of sensor groups having consecutive group NOs. The sensor groups are assigned with a block NO of from 1 to 20 in the increasing order of the group NO assigned to the sensor groups.

In each of the blocks, output IDs A, B, . . . , P are assigned to the sensor groups in the increasing order of the group NO. The light intensity detection circuits C included in the sensor groups assigned with the output IDs A, B, . . . , P are connected to the detection processing circuits 170A, 170B, . . . , 170P via the driver lines DoA, DoB, . . . , DoP, respectively. That is, the same output IDs are assigned to every m (16) numbers of sensor groups.

In the following descriptions, a group ID that is a combination of the block NOs and the output IDs may be used as identification information of the sensor groups in order to simplify the descriptions. For example, since the sensor group assigned with the group NO of 17 has its block NO of 2 and its output ID of A, the sensor group has its group ID of 2A.

Figure 8:
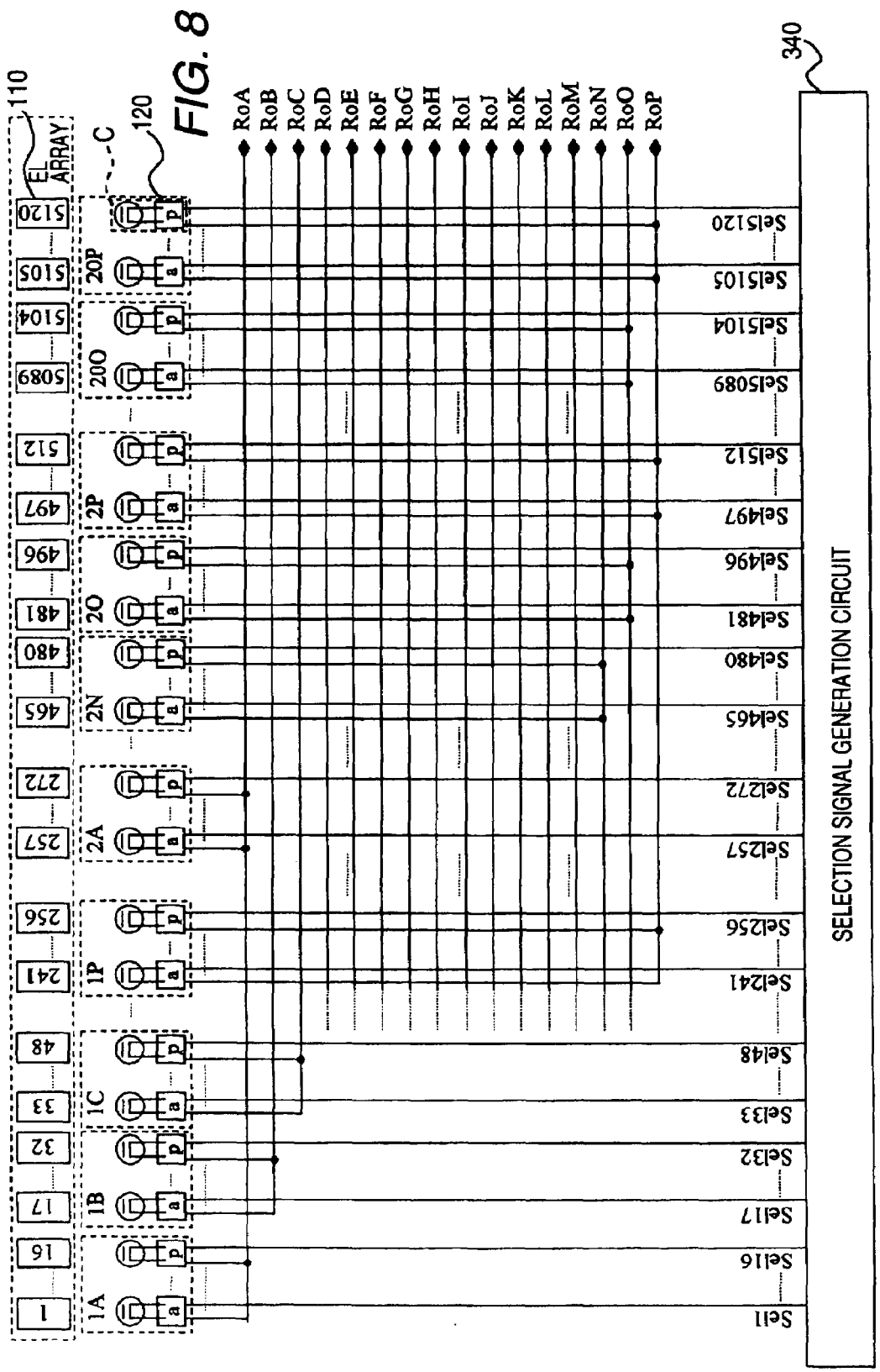
FIG. 8 is a circuit diagram showing an internal configuration of the light intensity measuring unit in accordance with the first embodiment of the invention.

FIG. 8 is a circuit diagram showing an internal configuration of the light intensity measuring unit 241 in accordance with the first embodiment of the invention. As shown in FIG. 8, the light intensity detection circuits C belonging to the same sensor group are connected to the same driver line Ro.

Moreover, the sensor groups are connected to the driver line Ro assigned with the output ID (A to P). For example, groups 1A, 2A, . . . , 20A (a total of 20 groups) are connected to the driver line RoA, and groups 1P, 2P, . . . , 20P are connected to the driver line RoP.

The driver lines RoA to RoP are connected to the detection processing circuits 170A to 170P provided in the processing circuit unit 59. That is, a total of 16 detection processing circuits 170A to 170P are provided in the processing circuit unit 59 in correspondence to the entire driver lines RoA to RoP. Meanwhile, the selection signal generation circuit 340 is formed in the TFT circuit 62 in a similar manner to the case of the gate controller 68 (see FIG. 25 for reference) for controlling the lighting and non-lighting of the organic EL elements 110. The selection signal generation circuit 340 may be formed in the TFT circuit 62a in a similar manner to the case of the above-described selection transistor 130. The selection signal generation circuit 340 (and the selection transistor 130) serves as a switching circuit for selectively inputting the sensor driving signals for driving the light detecting elements 120 with a predetermined timing to the light intensity detection circuit C through the selection lines SelX.

Next, the description will be continued with reference to FIG. 4.

As shown in FIG. 4, the light intensity detection circuit C includes the light detecting element 120, the capacitance element 140 connected in parallel to the light detecting element 120, and the selection transistor 130 being connected in serial to the light detecting element 120 and the capacitance element 140 and switching the electrical connection to the charge amplifier 150 through the driver line Ro. The electric potential of one end of the light detecting element 120 and the capacitance element 140 that is connected to the selection transistor 130 is defined as Vs. The electric potential of the other end of the light detecting element 120 and the capacitance element 140 is fixed at a predetermined level Vp.

The selection transistor 130 and the above-described selection signal generation circuit 340 are combined to constitute the switching circuit of the light detecting element 120. The selection lines Sel are connected to the gate terminal of the selection transistor 130. The sensor selection signal composed of the ON/OFF signal output from the selection signal generation circuit 340 is input to the selection transistor 130, thereby the selection transistor 130 is turned on and off in accordance with the sensor selection signal.

A total of 20 sensor groups (assigned with block NO of from 1 to 20) assigned with the same output IDs (A to P), i.e., a total of 320 (320=16×20) light intensity detection circuits C are connected to the same driver lines Ro assigned with the same output IDs. The driver lines Ro are connected to the detection processing circuit 170.

The detection processing circuit 170 includes a charge amplifier 150 and an analog-to-digital converter (hereinafter, referred to as ADC) 240. The charge amplifier 150 is configured to include an operational amplifier 151 having two input signal terminals (inverting and non-inverting input terminals) and one output signal terminal, a capacitance element 152 as an example of an amplification capacitance element connected between the inverting and non-inverting input terminals of the operational amplifier 151, and a charge/discharge selection transistor 153 connected in parallel to the capacitance element 152.

The non-inverting input terminal of the operational amplifier 151 is fixed at a predetermined reference voltage Vref, and the inverting input terminal thereof is connected to the light intensity detection circuit C through the driver line Ro. The output voltage of the operational amplifier 151 is defined as Vro.

The charge/discharge selection transistor 153 has its gate connected to the signal line CHG and is turned on and off in accordance with a charge/reset signal composed of the ON/OFF signal. The charge/reset signal supplied through the signal line CHG is one of the sensor control inputs SC shown in FIG. 6.

The above-described charge amplifier 150 constitutes the sensor drive unit in cooperation with the capacitance element 140 of the light intensity detection circuit C.

The ADC 240 is connected to the output terminal of the operational amplifier 151 of the charge amplifier 150. The ADC 240 selectively receives the output voltage Vro of the charge amplifier 150 on the basis of an AD conversion triggering signal SMPL which is one of the sensor control inputs SC, performs the output voltage into digital data, and outputs the digital data as the light intensity measurement data.

Figure 9:
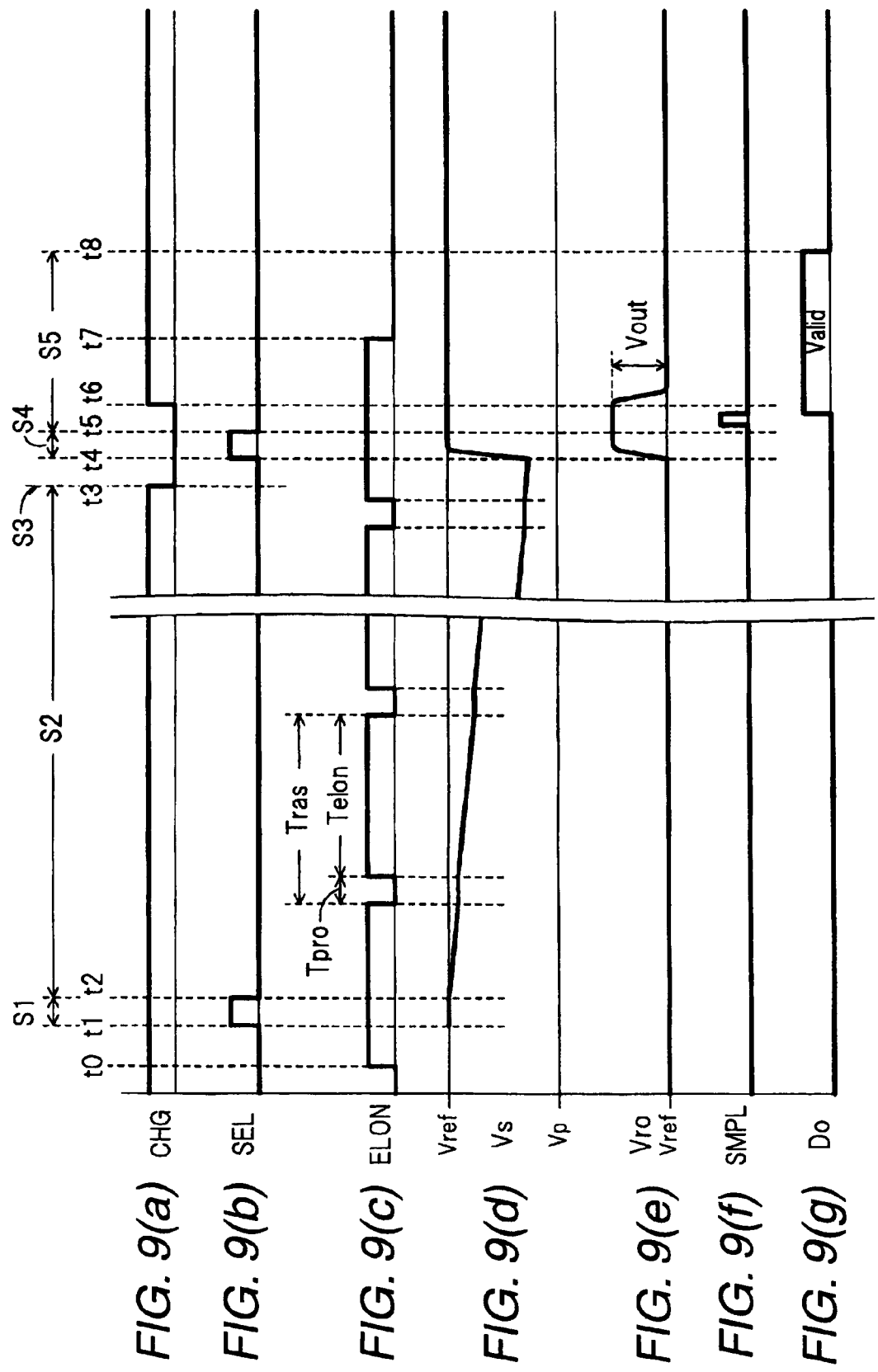
FIG. 9 is a timing chart for explaining an operation of each of the light detecting elements for detecting light intensity in accordance with the first embodiment of the invention.

FIG. 9 is a timing chart for explaining an operation of each of the light detecting elements 120 for detecting light intensity in accordance with the first embodiment of the invention. That is, the timing chart corresponds to operations of the individual light detecting element 120 for reading out the light intensity measurement data. As described above, the output of the light detecting element 120 which is a basis of the light intensity measurement data is obtained by being converted to a voltage value by the processing circuit unit 59 using a charge accumulation method, amplified with a predetermined amplification factor, and then subjected to an analog-to-digital conversion. The following timing charts correspond to the above-mentioned processes.

As shown in the timing charts of FIGS. 9(a) to 9(g), the light intensity measurement data based on the output of the light detecting element 120 is measured in such a manner that the charge accumulated in advance in the capacitance element 140 is extracted by the emission of light from the organic EL element 110 toward the light detecting element 120 at the time of switching of the selection transistor 130, and light intensity measurement data is measured on the basis of the amount of charge consumed by the capacitance element 152 for compensation of the lost charge. Accordingly, the light intensity measurement in accordance with the first embodiment is configured to measure the amount of charge lost due to the light emission of the organic EL element 110.

In FIG. 9, FIG. 9(a) is a diagram showing a charging state of the capacitance element 152 in the charge amplifier 150; FIG. 9(b) is a diagram showing the operation of the selection transistor 130; FIG. 9(c) is a diagram showing the lighting timings of the organic EL element 110; FIG. 9(d) is a diagram showing the electric potential (Vs) of the one end of the capacitance element 140 connected to the selection transistor 130; FIG. 9(e) is a diagram showing the output voltage (Vro) of the operational amplifier 151; FIG. 9(f) is a diagram showing the AD conversion triggering signal (SMPL) supplied to the ADC 240; and FIG. 9(g) is a diagram showing a state where valid light intensity measurement data is finally obtained.

First, when the selection transistor 130 receives the ON signal from the selection signal generation circuit 340 through the selection line Sel in a period between t1 and t2, the selection transistor 130 is turned ON (see FIG. 9(b) for reference), thereby charging the capacitance element 140 so that the electric potential Vs of the one end of the capacitance element 140 reaches the reference voltage Vref (S1: reset step), as shown in FIG. 9(d). The reset step is an example of a first period.

When the selection transistor 130 is turned OFF at t2 (see FIG. 9(b) for reference), the amount of the charge accumulated in the capacitance element 140 decreases as the charge is discharged with the photocurrent $I_s$ flowing through the light detecting element 120, and the electric potential Vs of the one end of the capacitance element 140 gradually decreases from the reference voltage Vref (S2: light irradiation/discharge step), as shown in FIG. 9(d).

When a predetermined time period expires in the above state, the charge/discharge selection transistor 153 of the charge amplifier 150 is turned OFF in t3 (see FIG. 9(a) for reference), the charge in the capacitance element 152 is made movable, and the charge amplifier 150 is made capable of measuring the light intensity of the organic EL element 110 (S3: measurement starting step).

In response to turning OFF of the charge/discharge selection transistor 153, the selection transistor 130 is turned ON at around t3 or t4 (later than t3) (see FIG. 9(b) for reference), and the charge is supplied from the capacitance element 152 of the charge amplifier 150 toward the capacitance element 140 that has lost the charge in a period between t2 and t4. As a result, the electric potential of the one end of the capacitance element 140 returns to Vref (see FIG. 9(d) for reference), and the output voltage Vro of the operational amplifier 151 of the charge amplifier 150 increases as shown in FIG. 9(e) (S4: charge transfer step). Since the photocurrent $I_s$ of the light detecting element 120 still flows during the period of the charge transfer step S4, the output voltage Vro increases by a small value. The period between t2 and t4 is an example of a second period, and the period (charge transfer step) between t4 and t5 is an example of a third period.

Next, in t5, the selection transistor 130 is turned OFF again, and the Vro is finally settled. The settled voltage is read out at a period such as t5 or after a predetermined time period after t5 in synchronization with the AD conversion triggering signal SMPL (see FIG. 9(f) for reference). Accordingly, as shown in FIG. 9(g), valid light intensity measurement data is output from the light intensity measurement unit 241 through the sensor output signal line Do, and the readout operation of the light intensity measurement data is finished at t8 (S5: read step).

Upon receiving the AD conversion triggering signal SMPL, the charge/discharge selection transistor 153 of the charge amplifier 150 is turned ON at t6 (see FIG. 9(a) for reference), and the charge accumulated in the capacitance element 152 provided in the charge amplifier 150 is reset.

Here, it is desirable that the time period required for the accumulation in the above-described steps S2 to S4, i.e., the time period lapsed between the time of turning off the selection transistor 130 at t2 and the time of turning off the charge/ discharge selection transistor 153 of the charge amplifier 150 and then turning on the selection transistor 130 at t5 is set to a small value as much as possible in order to decrease the time period required for the light intensity detection. However, in order to secure a predetermined SN and voltage detection resolution, as shown in FIG. 9(e), it is desirable that the potential difference Vout between the output voltage Vro settled at t5 and the reference voltage Vref is set to a large value as much as possible. In this case, it is necessary to secure a long accumulation period as much as possible. Accordingly, the accumulation period is set in consideration of both respects.

As shown in FIG. 9(c), in the light intensity measurement unit 241 of the first embodiment, there is prepared an one-raster period Tras (one-line forming period in the image formation) of an image forming apparatus 1 which includes a lighting and non-lighting programming periods Telon and Tpro for controlling the lighting and non-lighting of the organic EL element 110. The raster period Tras is set to a short period, for example of 350 µs. When the light detecting element 120 is configured with a material having a high light transmitting property such as polysilicon, the photocurrent $I_s$ generated based on the irradiation light decreases to a small level.

Therefore, in the first embodiment, the organic EL element 110 serving as an object of the light intensity detection is driven during a plurality numbers of raster period Tras in a period between t0 and t7 so that the accumulation period in steps S2 to S4 is set in the plurality of raster periods. The one-raster period Tras corresponds to the one-line period of the exposure device 13 (see FIG. 20 for reference) mounted on the image forming apparatus 1 and thus serves as the unit of the light emitting period (exposure period) of the organic EL element 110 in the image forming apparatus 1. Accordingly, the light intensity detection can be performed for a period longer than the one-raster period Tras, i.e., the one-light emitting period of the light emitting element, and it is thus possible to secure a predetermined SN and voltage detection resolution.

In this manner, the electrical connection between the charge amplifier 150 and the combination of the light detecting element 120 and the capacitance element 140 can be switched by the selection transistor 130 provided in the light intensity detection circuit C. Accordingly, it is possible to provide a desired accumulation period in an accurate manner.

In addition, in a period between t2 and t4, the connection between the combination of the light detecting element 120 and the capacitance element 140 and the driver line Ro is cut off by the selection transistor 130. Therefore, the light detecting element 120 and the capacitance element 140 are not influenced by noise transmitted from the charge amplifier 150 or the driver line Ro. Accordingly, it is possible to perform the light intensity detection with a high precision.

Next, a selection signal generation circuit 340 outputting a sensor selection signal will be described.

Figure 10:
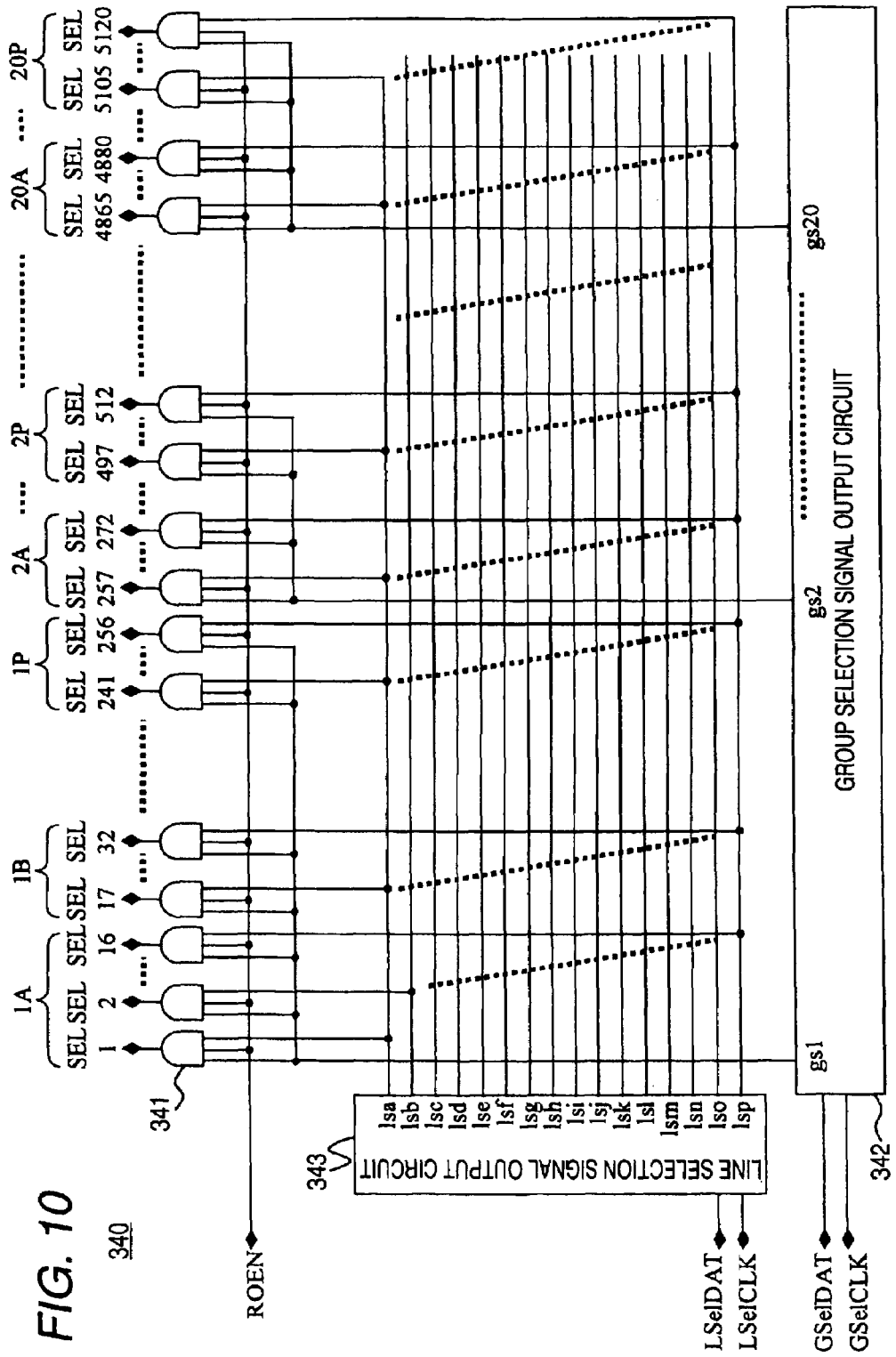
FIG. 10 is a circuit diagram showing an internal configuration of a selection signal generation circuit in accordance with the first embodiment of the invention.

FIG. 10 is a circuit diagram showing an internal configuration of a selection signal generation circuit 340 in accordance with the first embodiment of the invention. As shown in FIG. 10, the selection signal generation circuit 340 includes a number (5120) of AND circuits 341, a group selection signal output circuit 342, and a line selection signal output circuit 343.

As shown in FIG. 10, the AND circuit 341 outputs a logical AND product of three inputs. The AND circuit 341 receives, as its input, a selection timing signal ROEN that is one of the sensor control inputs SC, a group selection signal gs supplied from the group selection signal output circuit 342, and a line selection signal $I_s$ supplied from the line selection signal output circuit 343. The outputs of the AND circuit 341 are provided to the gate of the selection transistor 130 of the light intensity detection circuit C through the selection lines SEL1 to SEL5120.

The group selection signal output circuit 342 receives, as the sensor control inputs SC, a block switching signal GSelDAT and a block switching clock signal GSelCLK. The group selection signal output circuit 342 outputs group selection signals gs1 to gs20 on the basis of the block switching signal GSelDAT and the block switching clock signal GSelCLK. The group selection signals gs1 to gs20 are generated in correspondence to the block NOs shown in FIG. 7, and output to the AND circuit 341 connected to the light intensity detection circuit C corresponding to the sensor group assigned with block NOs 1 to 20.

Figure 11:
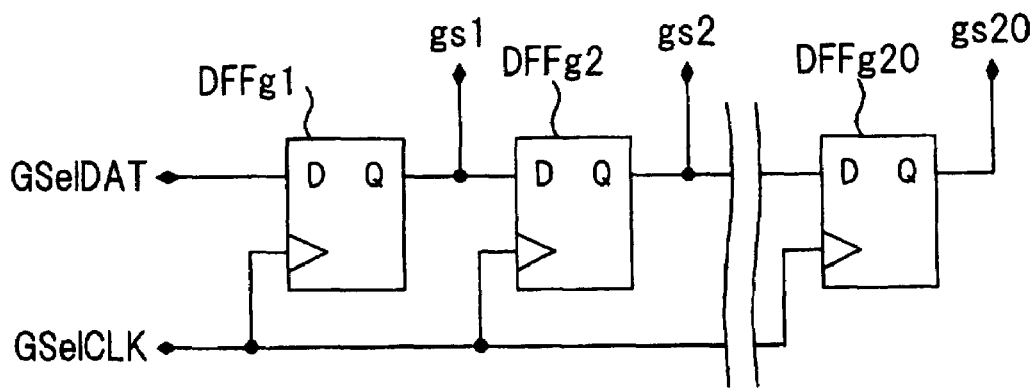
FIG. 11 is a circuit diagram showing an internal configuration of a group selection signal output circuit in accordance with the first embodiment of the invention.

FIG. 11 is a circuit diagram showing an internal configuration of the group selection signal output circuit 342 in accordance with the first embodiment of the invention. As shown in FIG. 11, the group selection signal output circuit 342 is configured as shift registers including a number (20) of serially connected D flip-flops DFFg1, DFFg2, ..., DFFg20. The D flip-flops DFFg1 to DFFg20 output the group selection signals gs1 to gs20, respectively.

The line selection signal output circuit 343 receives, as the sensor control inputs SC, a line switching signal LSelDAT and a line selection block signal LSelCLK. The line selection signal output circuit 343 outputs line selection signals lsa to lsp on the basis of the line switching signal LSelDAT and the line selection block signal LSelCLK. The line selection signals lsa to lsp are generated in correspondence to the line IDs shown in FIG. 7, and output to the AND circuit 341 connected to the light intensity detection circuit C corresponding to the sensor group assigned with line IDs a to p. For example, the line selection signal lsa is output to the light intensity detection circuit C assigned with the line ID of a, i.e., the AND circuit 341 connected to the light intensity detection circuit C assigned with SPNOs of 1, 17, ..., 5105.

Figure 12:
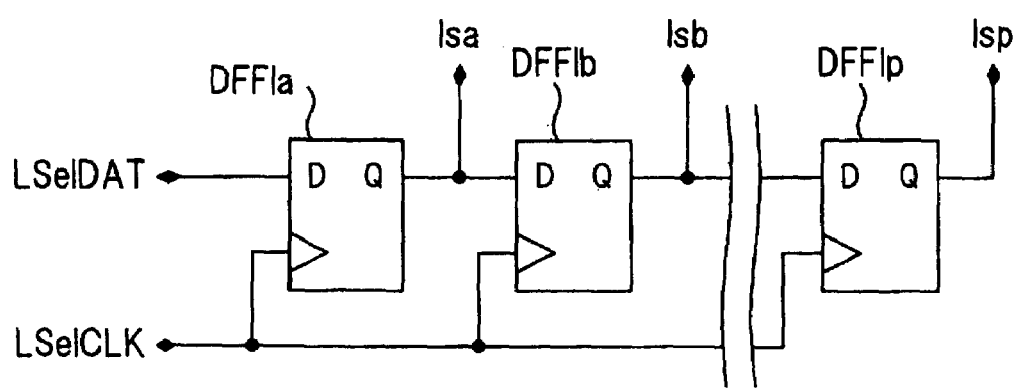
FIG. 12 is a circuit diagram showing an internal configuration of a line selection signal generation circuit in accordance with the first embodiment of the invention.

FIG. 12 is a circuit diagram showing an internal configuration of the line selection signal generation circuit 343 in accordance with the first embodiment of the invention. As shown in FIG. 12, the line selection signal generation circuit 343 is configured as shift registers including a number (16) of serially connected D flip-flops DFFla, DFFlb, ..., DFFlp. The D flip-flops DFFla to DFFlp output the line selection signals lsa to lsp, respectively.

Figure 13:
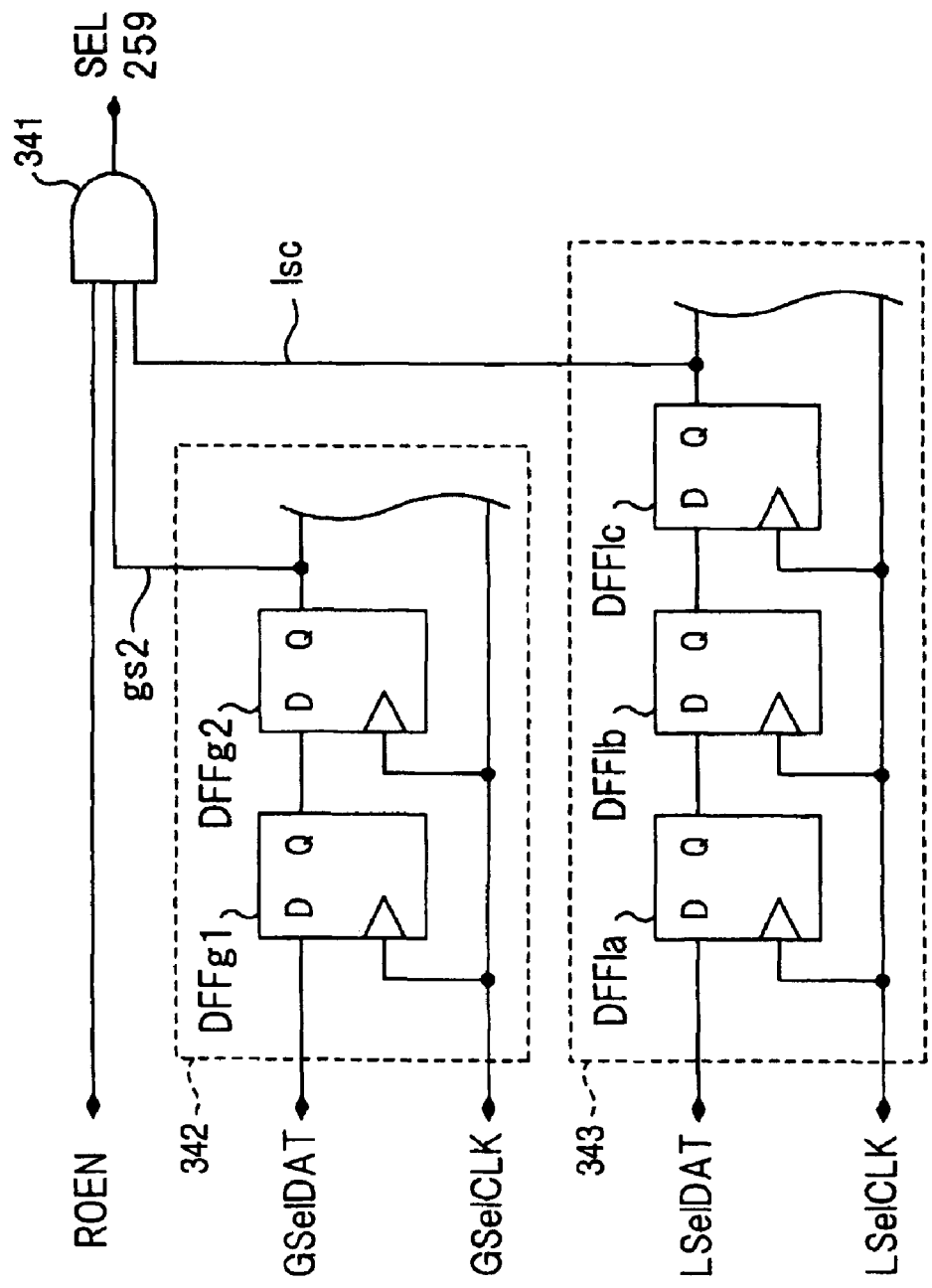
FIG. 13 is a diagram showing a configuration of the selection signal generation circuit in accordance with the first embodiment of the invention.
Figure 14:
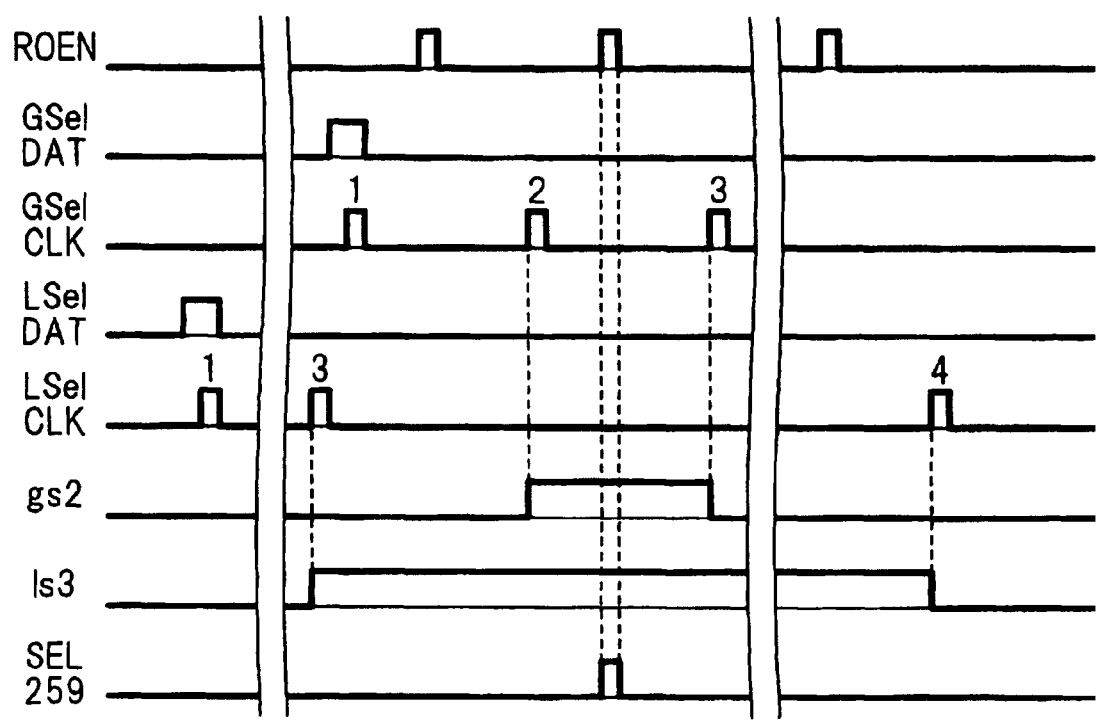
FIG. 14 is a timing chart for explaining an operation of the selection signal generation circuit in accordance with the first embodiment of the invention.

FIG. 13 is a diagram showing a configuration of the selection signal generation circuit 340 in accordance with the first embodiment of the invention, and FIG. 14 is a timing chart for explaining an operation of the selection signal generation circuit 340 in accordance with the first embodiment of the invention.

Next, the operation of the selection signal generation circuit 340 will be described with reference to FIGS. 13 and 14.

In FIGS. 13 and 14, an operation of generating the selection signals to be output to the selection signal line SEL259 will be described.

As shown in FIG. 13, since the light intensity detection circuit C assigned with SPNO 259 and connected to the selection signal line SEL259 has its block NO of 2 and its line ID of c, the AND circuit 341 receives, as its input, the group selection signal gs2 and the line selection signal lsc, together with the sensor selection timing signal ROEN. That is, the input of the AND circuit 341 is connected to the output of the second-stage D-flip-flop DFFg2 in the group selection signal generation circuit 142 and to the output of the third-stage D-flip-flop DFFlc in the line selection signal generation circuit 143.

As shown in FIG. 14, the line selection signal lsc is changed into an ON state at the rising time of the third line switching clock signal LSelCLK after the line switching signal LSelDAT is input to the line selection signal output circuit 343. In this manner, the light intensity detection circuit C assigned with the line ID of c is selected.

Next, the block selection signal gs2 is changed into an ON state at the rising time of the second group switching clock signal GSelCLK after the group switching signal GSelDAT is input to the group selection signal output circuit 342. In this manner, the light intensity detection circuit C assigned with the group ID of 2 is selected.

When the sensor selection timing signal ROEN for selecting any one of the light intensity detection circuits C is input to the selection signal generation circuit 340, signals to be input to the AND circuit 341 are changed to their ON states. Accordingly, the sensor selection signals to be output through the selection signal line SEL259 are also changed to their ON state.

Next, when the sensor selection timing signal ROEN is changed to an OFF state, the sensor selection signal is also changed to an OFF state. Therefore, the group selection signal gs2 is changed to an OFF state at the rising time of the third group switching clock signal GSelCLK, and the line selection signal lsc is changed to an OFF state at the rising time of the fourth line switching clock signal LSelCLK.

Hereinabove, a case where the sensor selection signal output from the selection signal line SEL259 is in the ON state has been described. In a period where the sensor selection signal of the sensor signal line SEL259 is in the ON state, the selection transistors 130 of the light intensity detection circuit C having the block NO of 2 and the line ID of c are all in their ON state, i.e., the sensor selection signals of the selection signal lines SEL259, SEL275, SEL291, . . . , SEL483, SEL499 are all in their ON state. This means that the selection transistors 130 of the light intensity detection circuit C having the same block NO and the same line ID can be switched at the same time and thus the light intensity detecting operations can be also switched at the same time.

Next, a sequence of the entire light intensity detecting operations of the light intensity measurement unit 241 will be described. In the first embodiment, the light intensity detecting operation of a signal light intensity detection circuit C assigned with a predetermined line ID in each sensor group is performed in a parallelized manner with respect to the entire sensor groups. Hereinafter, the light intensity detecting operation for a single line ID performed to the entire sensor groups assigned with the same line ID will be referred to as a group read operation. Since in the first embodiment, a number (16) of light intensity detection circuits C assigned with line IDs a to p are provided in a single sensor group, the light intensity of the entire organic EL element 110 can be detected by performing the group read operations 16 times.

First, the above-described group read operation will be described.

Figure 15:
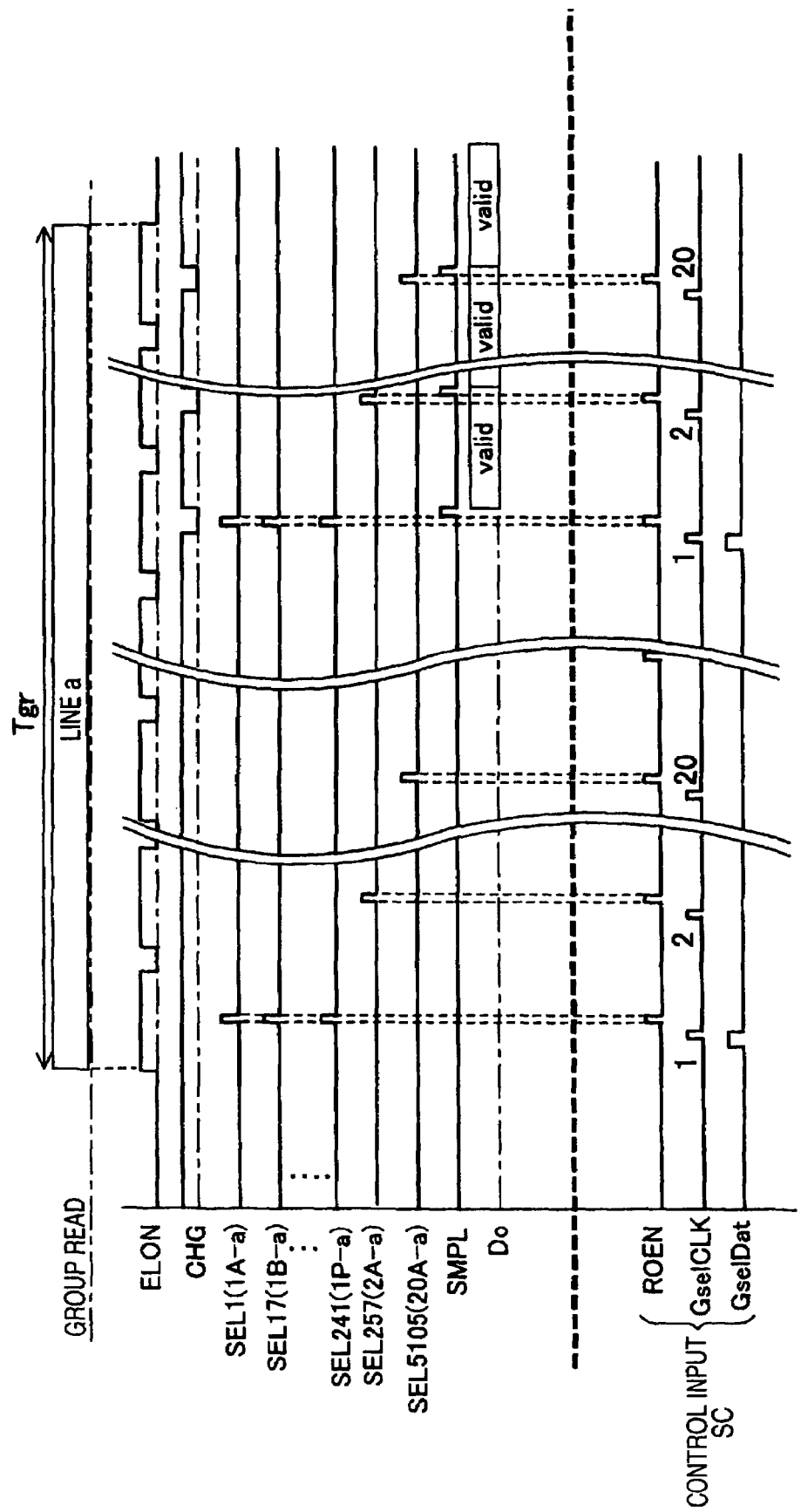
FIG. 15 is a timing chart for explaining a group read operation in accordance with the first embodiment of the invention.

FIG. 15 is a timing chart for explaining the group read operation in accordance with the first embodiment of the invention, in which the group read operation is performed for the case of the line ID a.

As shown in FIG. 15, when the group switching signal GSelDAT is input at the start time of the group read operation for the line ID a, the sensor selection signals are simultaneously output to the selection signal lines SEL1, SEL17, . . . , SEL241 connected to the light intensity detection circuit C assigned with the block NO of 1, in accordance with the input of the group switching clock signal GSelCLK. In the light intensity detection circuit C (assigned with the block ID of 1 and the line ID of a) having received the sensor selection signals, the reset step S1 and the light irradiation/discharge step S2 are simultaneously performed.

Whenever the group switching clock signal GSelCLK is input, the block NO is sequentially incremented from 1. That is, the reset step S1 and the light irradiation/discharge step S2 are sequentially performed to the light intensity detection circuit C assigned with other block NOs in the increasing order of the block NOs.

Next, when the group switching signal GSelDAT is input before the start of the charge transfer step, the sensor selection signals are simultaneously output to the selection signal lines SEL1, SEL17, . . . , SEL241 connected to the light intensity detection circuit C assigned with the block NO of 1, in accordance with the input of the group switching clock signal GSelCLK. In the light intensity detection circuit C (assigned with the block ID of 1 and the line ID of a) having received the sensor selection signals, the charge transfer step S3 and the read step S5 are simultaneously performed. In the sensor groups 1A to 1P, the charge is transferred between a number (16) of light intensity detection circuits C assigned with the line ID of a and the detection processing circuits 170A to 170P.

Whenever the group switching clock signal GSelCLK is input, the block NO is sequentially incremented from 1. That is, the sensor selection signals are sequentially output to the light intensity detection circuit C assigned with other block NOs in the increasing order of the block NOs, and the charge transfer step S4 and the read step S5 are performed thereon.

In this manner, the light intensity detecting operation for the entire light intensity detection circuits C assigned with the line ID of a (the group read operation for the line ID a) is performed.

Here, a plurality of light intensity detection circuits C assigned with the same output IDs are connected to the same driver line Ro. With this configuration, a single charge amplifier 150 can perform its operation with respect to the plurality of light intensity detection circuits C via the same driver line Ro at the same time. Accordingly, the reset step S1 can be simultaneously performed to the plurality of light intensity detection circuits C connected to the same driver line Ro. Moreover, since the light intensity detection circuit C is electrically separated from the driver line Ro in the light irradiation/discharge step S2, the reset step S1 may be simultaneously performed to the plurality of light intensity detection circuits C connected to the same driver line Ro.

However, since at least in the charge transfer step S4 (see FIG. 9 for reference) (in a period between t4 and t5), the charge is transferred from the light intensity detection circuits C to the detection processing circuit 170 through the driver line Ro, it is difficult to simultaneously perform the charge transfer step S4 with respect to the plurality of light intensity detection circuits C connected to the same driver line Ro.

As shown in the timing chart of FIG. 15, in the light intensity measurement unit 241 of the first embodiment, the group read operation for the same line ID is configured to control its timings such that the charge transfer step S4 is not simultaneously performed to the light intensity detection circuits C assigned with the same output IDs. Accordingly, the light intensity of the plurality of light detecting elements 120 can be detected by the detection processing circuit 170 in an efficient manner. That is, it is unnecessary to combine the detection processing circuit 170 and the light intensity detection circuit C as a pair. Thus, it is possible to decrease the circuit size and thus the manufacturing cost.

Since the light irradiation/discharge step S2 can be simultaneously performed to the plurality of light intensity detection circuits C assigned with the same output IDs in a partially overlapping manner, it is possible to decrease the time period required for the light intensity detection.

In this manner, since the light intensity detecting operations for the plurality of light intensity detection circuits C can be switched using the selection transistors 130 provided to the light intensity detection circuits C, it is possible to decrease the circuit size and thus perform the light intensity detection in an efficient manner.

Figure 16:
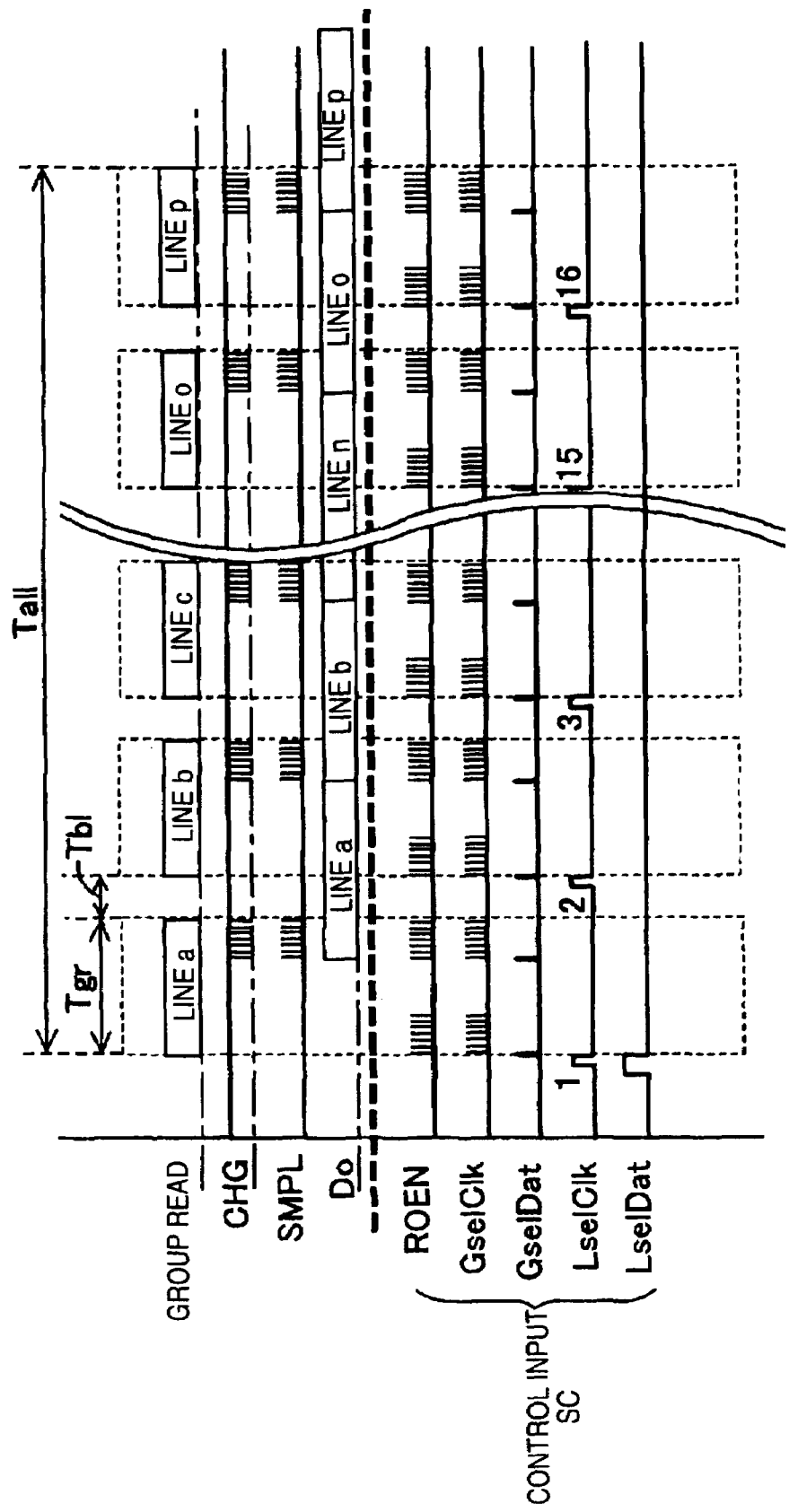
FIG. 16 is a timing chart for explaining the entire operations of the light intensity measuring unit in accordance with the first embodiment of the invention.

FIG. 16 is a timing chart for explaining the entire operations of the light intensity measuring unit 241 in accordance with the first embodiment of the invention. As shown in FIG. 16, the entire light intensity detecting operations are started in response to the line switching signal LSelDAT input to the selection signal generation circuit 340. Whenever the line switching clock signal LSelCLK is input, the line ID is sequentially switched. A period Tbl is provided between consecutive group read operations for each line ID.

Since in the first embodiment, there are provided a number (16) of line IDs a to p, the results of the light intensity detection in the entire light detecting elements 120 can be detected within a period Tall by performing the group read operations 16 times.

In this manner, since it is configured to sequentially detect the light intensity detection circuits C having the same line IDs, a number of organic EL elements 110 in the main scanning direction, corresponding to the number (16 in the present embodiment) of line IDs are caused to emit light at the time of the light intensity detection. Accordingly, it is possible to perform the light intensity detection with a high precision while preventing the so-called crosstalk, i.e., the influence of light emitted from other neighboring organic EL elements 110 other than the organic EL element 110 serving as an object of the light intensity detection.

For the light intensity correction, it is necessary to detect the light intensity for both of the bright current and the dark current, and the light intensity detection is made on the basis of the light intensity of the organic EL element 110 in consideration of the light intensity detection results obtained for both bright and dark currents. Accordingly, by performing the above-described light intensity measuring operations several times, the light intensity correction can be performed with a higher precision.

The output Do (which is digitalized data as described above) of the light intensity measurement unit 241 is processed by a known mounted computer system (hereinafter, referred to as a light intensity correction unit) including a computation unit such as micro computer, a nonvolatile memory such as ROM storing a processing program therein, a rewritable memory such as RAM providing a work area for use in the computation, and a bus for connecting above-described components to each other. In addition, the driving condition such as the light intensity or the lighting period of the organic EL element 110 is determined on the basis of the output Do.

When it is desired to correct the light intensity of the organic EL element 110, the light intensity correction unit calculates a new driving current (or driving voltage or driving time) of the individual organic EL elements 110 constituting the exposure device, and a driving condition setting unit (not shown) determines driving parameters on the basis of the calculation result. With this configuration, it is possible to control the driving condition of the organic EL element 110 for the case where the driving circuit 160 (see FIG. 2(a) for reference) is in the ON state.

In this manner, the charge amplifier 150 serving as the light intensity calculation circuit calculates a corrected voltage on the basis of the output voltage of the light intensity detection circuit C. Then, the driving circuit 160 controls the voltage to be applied to the anode 111 and cathode 113 of the light emitting element and controls the voltage to be applied to the light emitting layer 112 disposed between the anode 111 and the cathode 113. Accordingly, it is possible to compensate the time-varying change or irregularity in the light intensity of the light emitting element so that a uniform exposure can be maintained.

Figure 17:
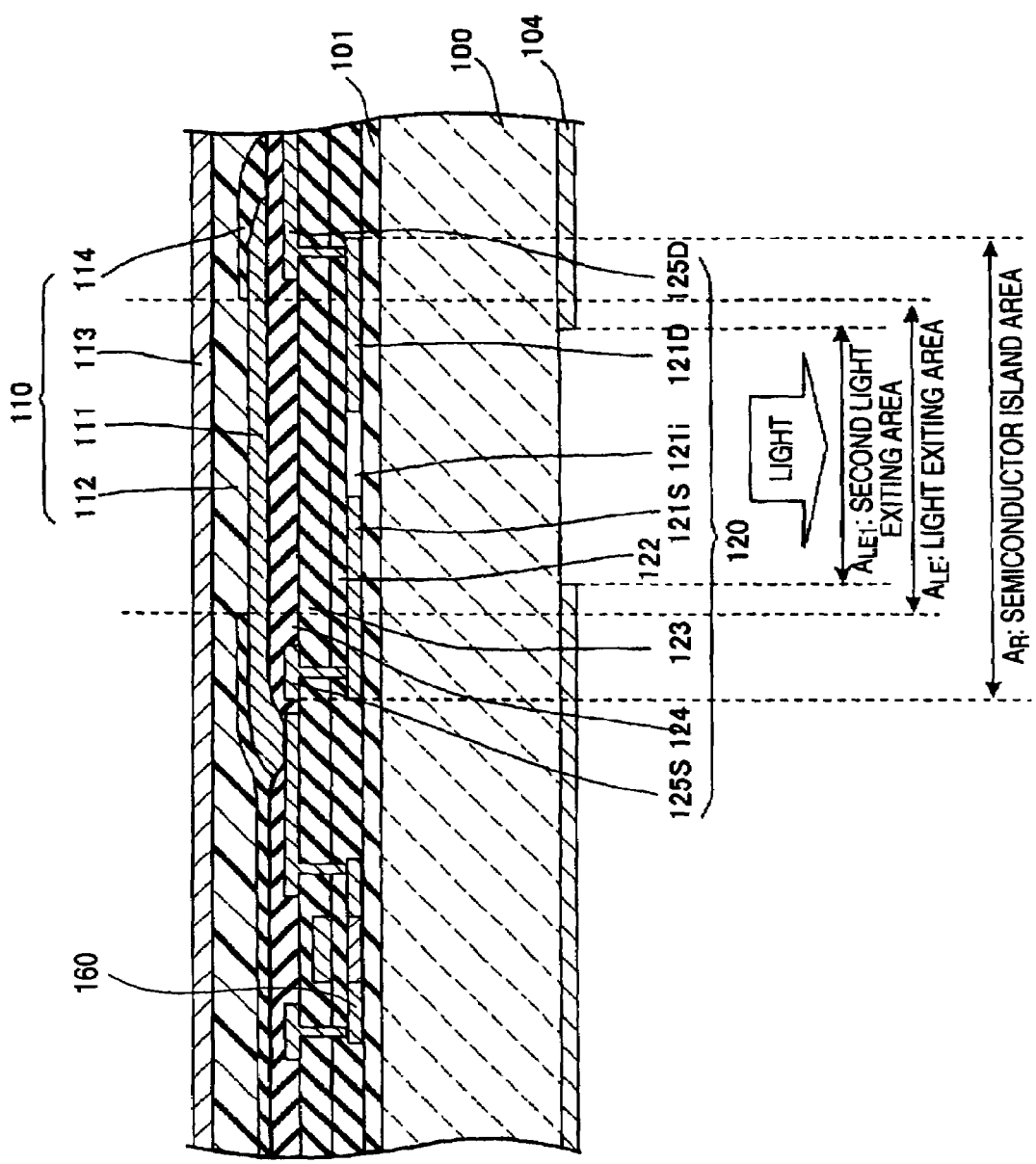
FIG. 17 is a cross-sectional diagram of a modified example of the exposure device in accordance with the first embodiment of the invention.

FIG. 17 is a cross-sectional diagram of a modified example of the exposure device in accordance with the first embodiment of the invention.

As shown in FIG. 17, an optical light blocking film 104 made of a thin Cr film is formed on the side of the light exiting surface of the glass substrate 100 so as to define an opening on the light exiting surface, and a second light exiting area $A_{LE1}$ is defined by the opening. By forming the second light exiting area $A_{LE1}$ to be smaller in size than that of the opening defined by the silicon nitride film serving as the pixel defining member 114 described in connection with the first embodiment, it is possible to prevent the edge portion (the boundary portion of the light exiting area $A_{LE}$; this portion is likely to cause a non-uniform light intensity distribution) of the pixel defining member 114 from being disposed inside the light exiting area $A_{LE1}$. Accordingly, it is possible to manufacture the light emitting layer with a uniform thickness distribution.

Other configurations are the same as those described in the first embodiment.

Second Embodiment

Next, an image forming apparatus using the exposure device described in connection with the first embodiment will be described as a second embodiment.

Figure 18:
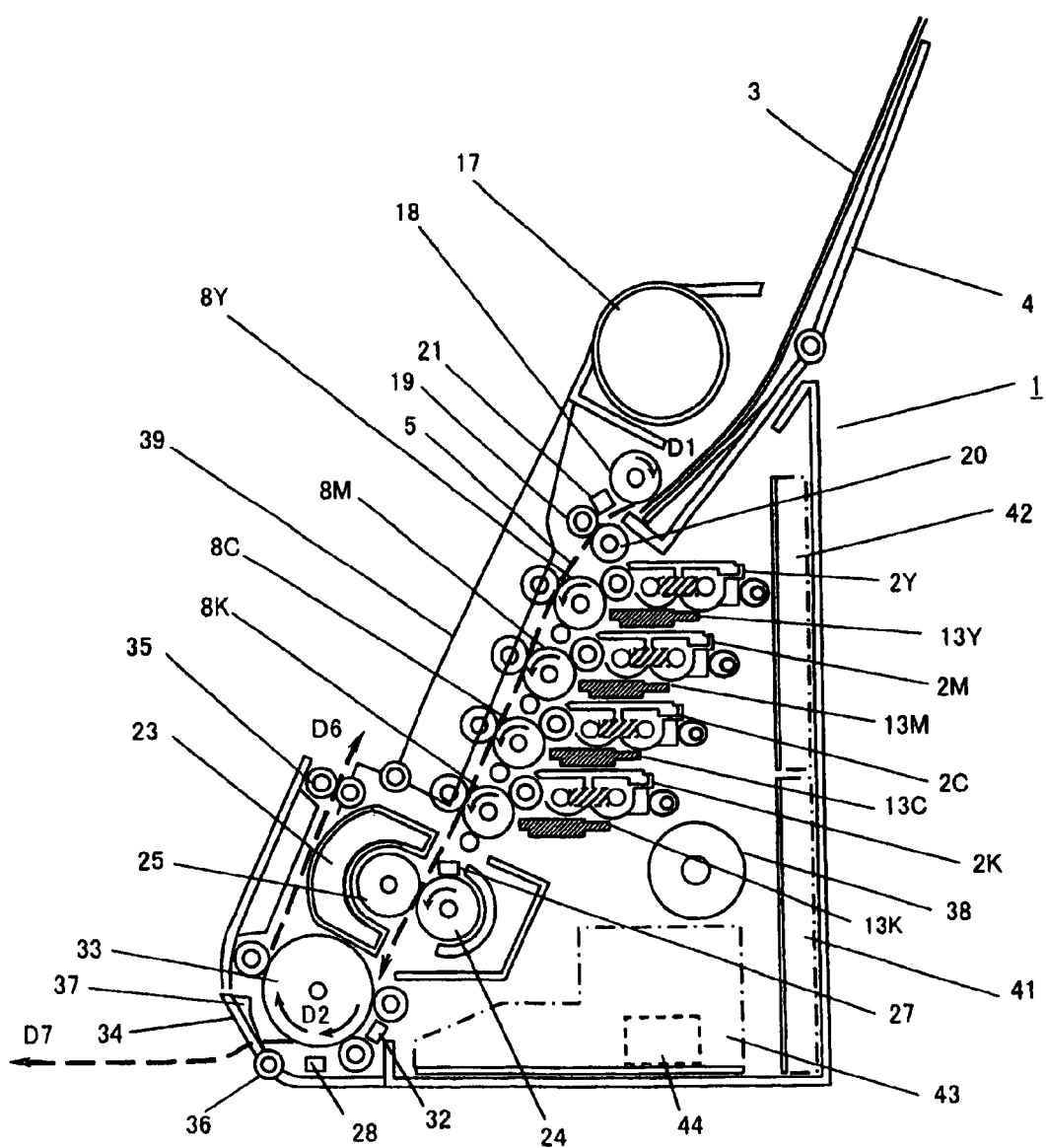
FIG. 18 is a diagram showing a configuration of an image forming apparatus in accordance with a second embodiment of the invention.

FIG. 18 is a diagram showing a configuration of an image forming apparatus in accordance with a second embodiment of the invention.

FIG. 18 shows an image forming apparatus 1 having, as the exposure device, exposure devices 13Y to 13K corresponding to each color of yellow, magenta, cyan, and black.

As shown in FIG. 18, the image forming apparatus 1 includes four development stations corresponding to four colors, i.e., a yellow development station 2Y, a magenta development station 2M, a cyan development station 2C, and a black development station 2K, which are arranged with an offset in a longitudinal direction. A paper feeding tray 4 accommodating a recording paper 3 as a recording medium therein is disposed above the development stations 2Y to 2K. At locations corresponding to the individual development stations 2Y to 2K, a recording paper conveyance path 5 serving as a conveyance path of the recording paper 3 supplied from the paper feeding tray 4 extends in a longitudinal direction from an upstream side to the downstream side.

Each of the development stations 2Y to 2K forms a toner image of yellow, magenta, cyan, and black colors in this order from the upstream side of the recording paper conveyance path 5. The yellow development station 2Y has a photosensitive member 8Y, the magenta development station 2M has a photosensitive member 8M, the cyan development station 2C has a photosensitive member 8C, and the black development station 2K has a photosensitive member 8K. Moreover, each of the development stations 2Y to 2K includes components for performing a development process of a series of electrophotographic process, such as a development sleeve and a charger, which will be described later.

Exposure devices 13Y to 13K for exposing the surfaces of the photosensitive members 8Y to 8K so as to form electrostatic latent images are respectively disposed below each of the development stations 2Y to 2K.

Although colors of developing agents filled in the development stations 2Y to 2K are different from each other, the configurations of the development stations are equal to each other regardless of the developing agent color. Therefore, in the following descriptions, the development stations, the photosensitive members, and the exposure devices will be simply denoted by a development station (development unit) 2, a photosensitive member 8, and an exposure device 13 without including a specific color thereof in order to simplify the description, except a case where there is especially a need to state clearly.

Figure 19:
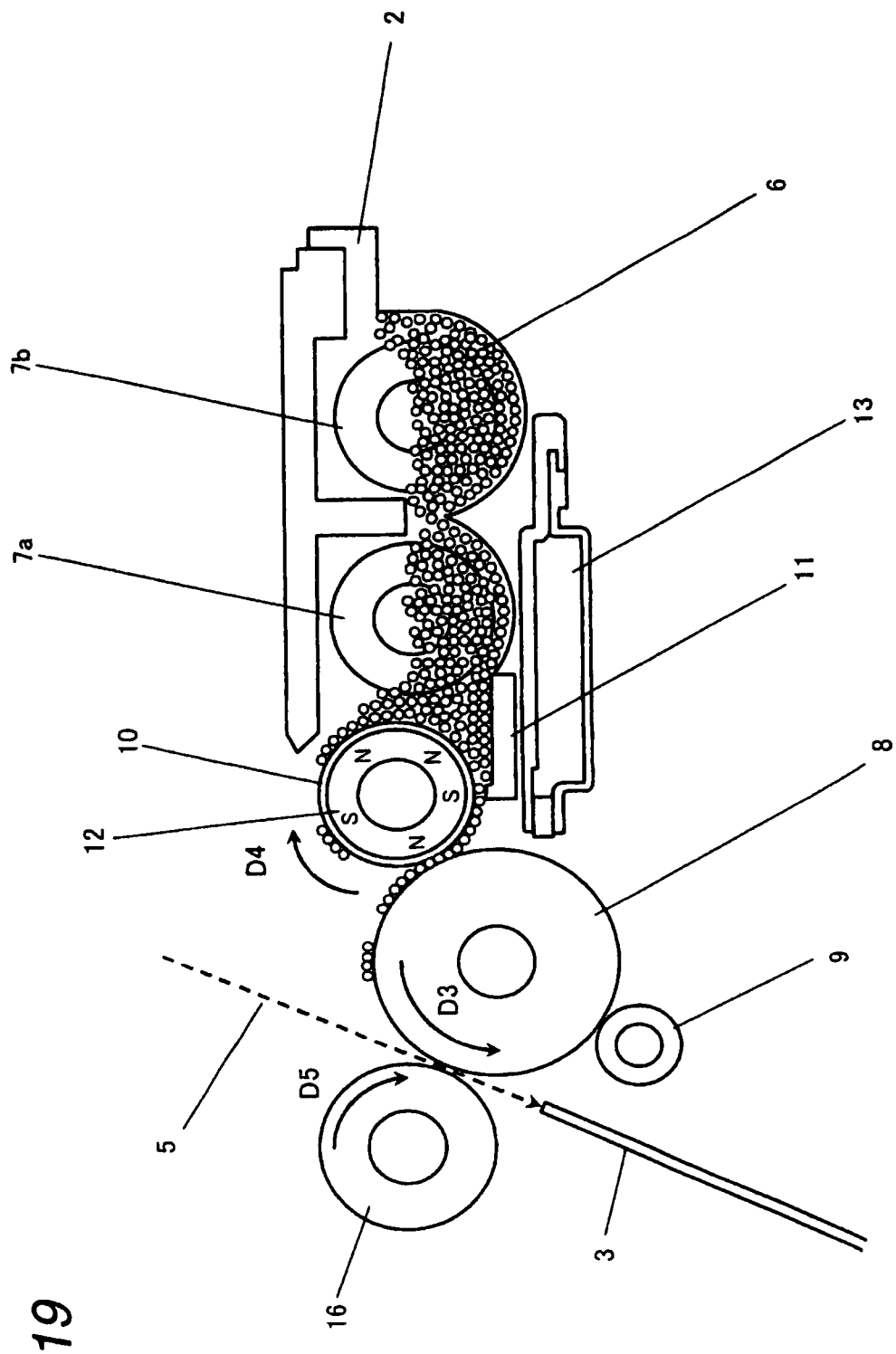
FIG. 19 is a diagram showing a peripheral configuration of a development station of the image forming apparatus in accordance with the second embodiment of the invention.

FIG. 19 is a diagram showing a peripheral configuration of a development station 2 of the image forming apparatus 1 in accordance with the second embodiment of the invention.

In FIG. 19, a developing agent 6 as a mixture of a carrier and a toner is filled in the development station 2. Reference numerals 7a and 7b denotes stirring paddles for stirring the developing agent 6. With the rotation of the stirring paddles 7a and 7b, the toner in the developing agent 6 is charged with a predetermined electric potential by the friction with the carrier, and the toner and the carrier are sufficiently stirred and mixed while being circulated in the development station 2. The photosensitive member 8 is rotated in the D3 direction by a driving source (not shown). Reference numeral 9 denotes a charger that charges the surface of the photosensitive member 8 with a predetermined electric potential. Reference numeral 10 denotes a development sleeve and reference numeral 11 denotes a thin-layered blade. The development sleeve 10 includes a magenta roll 12 having a plurality of magnetic poles arranged therein. The layer thickness of the developing agent 6 supplied and formed on the surface of the development sleeve 10 is regulated by the thin-layered blade 11. The development sleeve 10 is rotated in the D4 direction by a driving source (not shown), the developing agent 6 is supplied to the surface of the development sleeve 10 by the rotation of the development sleeve 10 and the action of the magnetic poles of the magnet roll 12, and the electrostatic latent image formed on the photosensitive member 8 is developed by an exposure device 13 to be described later. In this case, the developing agent 6 that is not transferred to the photosensitive member 8 is collected into the inside of the development station 2.

Reference numeral 13 denotes an exposure device which includes a light emitting element array constituted by aligning organic EL elements serving as an exposure light source in an array configuration with a resolution of 600 dpi (dots per inch). The exposure device 13 can form an electrostatic latent image of the maximum A4 size paper on the photosensitive member 8 charged with the predetermined electric potential by the charger 9 by selectively on and off the organic EL elements in accordance with image data. When the predetermined electric potential (a development bias) is applied to the development sleeve 10, an electric potential gradient is formed between the electrostatic latent image portion and the development sleeve 10. A coulomb force is applied to the toner in the developing agent 6 that is supplied to the surface of the development sleeve 10 and charged with the predetermined electric potential, and only the toner in the developing agent 6 adheres to the photosensitive member 8, whereby the electrostatic latent image is developed.

As will be described later in detail, the exposure device 13 is provided with the light detecting element 120, which has been described in detail in connection with the first embodiment, serving as a light intensity measuring unit for measuring the light intensity of the organic EL elements.

Reference numeral 16 denotes a transfer roller which is disposed at a position opposite to the photosensitive member 8 with the recording paper 5 interposed therebetween and is rotated in the D5 direction by a driving source (not shown). The transfer roller 16 is applied with a predetermined transfer bias and transfers the toner image formed on the photosensitive member 8 onto the recording paper 3 conveyed through the recording paper conveyance path 5.

Next, the description will be continued with reference to FIG. 18.

Reference numeral 17 denotes a toner bottle in which toners of yellow, magenta, cyan, and black are contained. A toner conveyance pipe (not shown) extends from the toner bottle 17 to each of the development stations 2Y to 2K, and the toner is supplied to each of the development stations 2Y to 2K through the toner conveyance pipe.

Reference numeral 18 denotes a paper feeding roller which is rotated in the D1 direction by the control of an electromagnetic clutch (not shown) and feeds the recording paper 3 stacked in the paper feeding tray 4 to the recording paper conveyance path 5.

In the uppermost stream of the recording conveyance path 5 disposed between the paper feeding roller 18 and the transfer portion of the yellow development station 2Y, there are provided a pair of rollers serving as a nip conveyance unit in the inlet side, i.e., a registration roller 19 and a pinch roller 20. The pair of the registration roller 19 and the pinch roller 20 temporarily stops the recording paper 3 conveyed by the paper feeding roller 18 and then conveys the recording paper 3 in the direction of the yellow development station 2Y at a predetermined timing. With the temporal stop, the front end of the recording paper 3 is squeezed in a direction parallel to the axial direction of the pair of the registration roller 19 and the pinch roller 20, thereby preventing inclination of the recording paper 3.

Reference numeral 21 denotes a recording paper pass detection sensor which is constituted by a reflection type sensor (a photo reflector) and detects front and rear ends of the recording paper 3 by the presence and absence of the reflected light.

When the rotation of the registration roller 19 is started with the control of the power transfer using an electromagnetic clutch (not shown), the recording paper 3 is conveyed along the recording paper conveyance path 5 in a direction toward the yellow development station 2Y However, writing timings for the exposure devices 13Y to 13K disposed in the vicinity of the development stations 2Y to 2K to form the electrostatic latent images, ON/OFF timings for the development bias, ON/OFF timings for the transfer bias and the like are individually controlled at the time of starting the rotation of the registration roller 19.

Next, the description will be continued with reference to FIG. 19.

Since the distance between the exposure device 13 shown in FIG. 19 and a development area (vicinities of the narrowest portion between the photosensitive member 8 and the development sleeve 10) is a matter of design, the time period for the latent image formed on the photosensitive member 8 to reach the development area after the exposure device 13 starts its exposing operation is also a matter of design.

In the second embodiment, at the time of starting the rotation of the registration roller 19, it is controlled that the organic EL elements constituting the exposure device 13 are lighted with set values of light intensity in a period between papers (i.e., an inter-paper period) successively conveyed through the recording paper conveyance path 5 when successively printing a plurality of papers and the development bias is turned off in a period corresponding to the location of the latent image formed on the photosensitive member 8.

Next, the description will be continued with reference to FIG. 18.

In the lowermost stream of the recording conveyance path 5 disposed at a further downstream side of the black development station 2K, there is provided a fixing unit 23 serving as a nip conveyance unit in the outlet side. The fixing unit 23 is constituted by a heating roller 24 and a pressure roller 25.

Reference numeral 27 denotes a temperature sensor for detecting the temperature of the heating roller 24. The temperature sensor 27 is a ceramic semiconductor mainly composed of a metal oxide, obtained through a high-temperature sintering process. The temperature sensor 27 can measure the temperature of an object being in contact by utilizing the variation in load resistance with temperature. The output of the temperature sensor 27 is supplied to an engine control unit 42 to be described later, the engine control unit 42 controls electric power supplied to a heat source (not shown) installed in the heating roller 24 on the basis of the output of the temperature sensor 27 so that the surface temperature of the heating roller 24 becomes about 170° C.

When the recording paper 3 having the toner image formed thereon passes through the nip portion constituted by the temperature-controlled heating roller 24 and the pressure roller 25, the toner image formed on the recording paper 3 is heated and pressurized by the heating roller 24 and the pressure roller 25 so that the toner image is fixed onto the recording paper 3.

Reference numeral 28 denotes a recording paper rear-end detection sensor that monitors a discharge state of the recording paper 3. Reference numeral 32 denotes a toner image detection sensor which is a reflection type sensor unit constituted by a plurality of light emitting elements having light emitting spectra different from each other (all of which are in a visible band) an a single light receiving element. The toner image detection sensor 32 detects an image density by utilizing a fact that the absorption spectrum at background portions of the recording paper 3 and the absorption spectrum at image forming portions are different from each other in accordance with image colors. Moreover, since the toner image detection sensor 32 can detect an image forming position in addition to the image density, in the image forming apparatus 1 of the second embodiment, two toner image detection sensor 32 are provided in the width direction of the image forming apparatus 1 so as to control an image forming timing on the basis of a detection position of the positional error detection pattern of images formed on the recording paper 3.

Reference numeral 33 denotes a recording paper conveyance drum which is a metal roller coated with a rubber having a thickness of 200 μm.

Fixed recording paper 3 is conveyed in the D2 direction along the recording paper conveyance roller 33. In this case, the recording paper 3 is cooled by the recording paper conveyance drum 33 and is conveyed along a curved line in a direction opposite to the image forming direction. With this configuration, it is possible to considerably reduce the curl of paper occurring when forming an image on the entire surface of the recording paper with a high density.

Then, the recording paper 3 is conveyed in the D6 direction by an outfeed roller 35 and discharged to a paper discharging tray 39.

Reference numeral 34 denotes a face-down paper discharging unit which is pivotable forward and backward about a support member 36. When the face-down paper discharging unit 34 is in an open state, the recording paper 3 is discharged in the D7 direction. A rib 37 is provided along the conveyance path on a back surface of the face-down paper discharging unit 34 so that the rib 37 guides the conveyance of the recording paper 3 in cooperation with the recording paper conveyance drum 33 when the face-down paper discharging unit 34 is in a closed state.

Reference numeral 38 denotes a driving source which is embodied as a stepping motor in the second embodiment. The driving source 38 serves to drive the peripheral portions of the development stations 2Y to 2K including the paper feeding roller 18, the registration roller 19, the pinch roller 20, the photosensitive members 8Y to 8K, and the transfer roller 16 (see FIG. 19 for reference), the fixing unit 23, the recording paper conveyance drum 33, and the outfeed roller 35.

Reference numeral 41 denotes a controller which receives image data from a computer (not shown) or the like through an external network and develops and generates printable image data. As will be described later in detail, a controller CPU (not shown) installed in the controller 41 serves not only as a light intensity correcting unit that receives measurement data of the light intensity of the organic EL elements as a light emitting element from the exposure devices 13Y to 13K so as to generate light intensity correction data, but also as a light intensity setting unit that sets the light intensity of the organic EL elements on the basis of the light intensity correction data.

Reference numeral 42 denotes an engine control unit which controls hardware or mechanism of the image forming apparatus 1 so as to form a color image on the recording paper 3 on the basis of the image data and the light intensity correction data transmitted from the controller 41. Moreover, the engine control unit 42 controls a general operation of the image forming apparatus 1 including a temperature control of the heating roller 24 of the fixing unit 23.

Reference numeral 43 denotes a power source unit which supplies an electric power of a predetermined voltage to the exposure devices 13Y to 13K, the driving source 38, the controller 41, and the engine control unit 42. The power source unit 43 also supplies an electric power to the heating roller 24 of the fixing unit 23. The power source unit 43 has a high voltage source system such as a charging potential for charging the surface of the photosensitive member 8, a development bias to be applied to the development sleeve 10 (see FIG. 19 for reference), and a transfer bias to be applied to the transfer roller 16. The engine control unit 42 regulates turning on and off, an output voltage value, and an output current value of the high voltage source by controlling the power source unit 43.

Moreover, the power source unit 43 has a power source monitor unit 44 which allows monitoring of a power source voltage to be supplied to the engine control unit 42, the output voltage of the power source unit 43, and the like. The monitor signal is detected by the engine control unit 42 in which a voltage drop in the power source caused by a switching-off or a stoppage of power supply or the like or, especially, an abnormal output of the high voltage source is detected.

Next, the operation of the image forming apparatus 1 having such a configuration will be described with reference to FIGS. 18 and 19.

In the following description, when describing the configuration and a general operation of the image forming apparatus 1, FIG. 18 will be mainly referenced and the colors are distinguished like the development stations 2Y to 2K, the photosensitive members 8Y to 8K, and the exposure devices 13Y to 13K. However, in the descriptions related to a single color, such as an exposure process and a development process, FIG. 19 will be mainly referenced and the colors are not distinguished like the development station 2, the photosensitive member 8, and the exposure device 13.

<Initialization Operation>

First, an initialization operation at the time of supplying power to the image forming apparatus 1 will be described.

When power is supplied to the image forming apparatus 1, an engine control CPU (not shown) installed in the engine control unit 42 checks errors in electric resources constituting the image forming apparatus 1, i.e., registers and memories. When the error checking is completed, the engine control CPU (not shown) starts rotation of the driving source 38. As described above, the peripheral portions of the development stations 2Y to 2K including the paper feeding roller 18, the registration roller 19, the pinch roller 20, the photosensitive members 8Y to 8K, and the transfer roller 16, the fixing unit 23, the recording paper conveyance drum 33, and the outfeed roller 35 are driven by the driving source 38. However, immediately after the supply of power, the electromagnetic clutch (not shown) transferring a driving force to the paper feeding roller 18 and the registration roller 19 related to the conveyance of the recording paper 3 is immediately set to an OFF state so that the paper feeding roller 18 and the registration roller 19 are controlled not to convey the recording paper 3.

Next, the description will be continued with reference to FIG. 19.

The rotation of the development sleeve 10 and the stirring paddles 7*a* and 7*b* of the development station 2 is started in accordance with the rotation of the driving source 38 (see FIG. 18 for reference). Accordingly, the developing agent 6 composed of a toner and a carrier filled in the development station 2 is circulated in the development station 2, and the toner is charged with minus charges by the friction with the carrier.

The engine control CPU (not shown) controls the power source unit 43 (see FIG. 18 for reference) so as to turn on the charger 9 when a predetermined time period has passed after the time of starting the rotation of the driving source 38 (see FIG. 18 for reference). The surface of the photosensitive member 8 is charged with an electric potential of −700 V, for example, by the charger 9. The photosensitive member 8 is rotated in the D3 direction, and the engine control CPU (not shown) applies a development bias of −400 V, for example, to the development sleeve 10 by controlling the power source unit 43 (see FIG. 18 for reference) after the charged area has reached the development area, i.e., the narrowest portion between the photosensitive member 8 and the development sleeve 10. In this case, since the surface of the photosensitive member 8 is charged with the electric potential of −700 V and the development sleeve 10 is applied with the development bias of −400 V, the coulomb force applied to the toner charged with minus charges is directed toward the photosensitive member 8 from the development sleeve 10 so that the electromagnetic force line is extended toward the photosensitive member 8 from the development sleeve 10. Therefore, the toner does not adhere to the photosensitive member 8.

As described above, the power source unit 43 (see FIG. 18 for reference) has a function of monitoring the abnormal output (for example, leakage) of the high voltage source, and the engine control CPU (not shown) has a function of checking errors caused at the time of applying the high voltage to the charger 9 or the development sleeve 10.

The engine control CPU (not shown) corrects the light intensity of the exposure device 13 as a final step of these series of initialization operations.

The engine control CPU (not shown) installed in the engine control unit 42 (see FIG. 18 for reference) outputs a creation request of dummy image information for the light intensity correction to the controller 41 (see FIG. 18 for reference). Then, the controller 41 (see FIG. 18 for reference) generates the dummy image information for the light intensity correction in accordance with the creation request, and the organic EL elements constituting the exposure device 13 is actually controlled to be lighted or unlighted at the time of initialization on the basis of the dummy image information for the light intensity correction. In the second embodiment, in this case, the light detecting element 120 provided in the above-described exposure device 13 measures the light intensity of the organic EL element 110 (see FIG. 21(*a*) for reference) and corrects the light intensity on the basis of the light intensity detection result so that the light intensity of the individual organic EL element 110 is equal to each other. As described above, the light intensity measurement is performed in a state that those units related to the image forming operation such as the photosensitive member 8 or the development stations 2Y to 2K of the image forming apparatus 1 are in their operating states. When the light intensity measurement is performed in a state that the rotation of the photosensitive member 8 is stopped, the same portion of the photosensitive member 8 is continuously exposed to light, which causes a so-called over-exposure, thereby deteriorating the property of the photosensitive member 8 at a partial portion thereof. Therefore, it is necessary to perform the light intensity measurement at least in a state that the photosensitive member 8 is in its rotating state and is being charged by the charger 9 to prevent the toner from adhering to the photosensitive member 8.

<Image Forming Operation>

Next, the image forming operation of the image forming apparatus 1 will be described with reference to FIGS. 18 and 19.

When image information is transmitted to the controller 41 form an external source, the controller 41 expands the image information to printable data, for example binary image data and supplies the printable data to an image memory (not shown). After completing the expansion of the image information, the controller CPU (not shown) installed in the controller 41 outputs a start-up request to the engine control unit 42. The start-up request is received by the engine control CPU (not shown) installed in the engine control unit 42, and the engine control CPU (not shown) immediately starts the preparation of image forming operation by rotating the driving source 38.

The above-described processes are the same as those described in <Initialization Operation> excluding the error checking operation for the electric resources. The engine control CPU (not shown) can still perform the above-described light intensity measuring operation at this time point. As will be described later, since the light intensity measurement requires about 10 seconds, it may have influence on the first print time (a period required for printing the first sheet of paper). Therefore, it is configured such that the execution of the light intensity correction at the start-up time can be selectable by allowing a user to input instructions through an operation panel (not shown) or other means (for example, a computer) external to the image forming apparatus 1.

After completing the preparation of the image forming operation through the above-mentioned processes, the engine control CPU (not shown) installed in the engine control unit 42 controls the electromagnetic clutch (not shown) so as to rotate the paper feeding roller 18 and start the conveyance of the recording paper 3. The paper feeding roller 18 is a half-moon shaped roller in which a portion of the entire circumference is omitted. The paper feeding roller 18 conveys the recording paper 3 in the direction of the registration roller 19 and stops its rotation after one rotation. When the front end of the conveyed recording paper 3 is detected by the recording paper pass detection sensor 21, the engine control CPU (not shown) controls the electromagnetic clutch (not shown) so as to rotate the registration roller 19 after a predetermined delay period. The recording paper 3 is supplied to the recording paper conveyance path 5 in accordance with the rotation of the registration roller 19.

The engine control CPU (not shown) individually controls the wiring timing for each of the exposure devices 13Y to 13K to form the electrostatic latent image at the time of starting the rotation of the registration roller 19. Since the writing timing of the electrostatic latent image has a direct influence on the color error or the like of the image forming apparatus 1, the writing timing is not generated directly from the engine control CPU (not shown). Specifically, the engine control CPU (not shown) presets the writing timing for each of the exposure devices 13 to form the electrostatic latent image to timers as hardware (not shown) and activates the operations of the corresponding timers of the exposure devices 13Y to 13K at the time of starting the rotation of the above-mentioned registration roller 19. Each of the timers outputs an image data transmit request to the controller 41 when a preset time period has passed.

The controller CPU (not shown) of the controller 41 having received the image data transmit request transmits individual binary image data to each of the exposure device 13Y to 13K in synchronization with a timing signal (such as a clock signal and a line sync signal) generated from a timing generation unit (not shown) of the controller 41. In this manner, the binary image data is sent to the exposure devices 13Y to 13K, and the lighting and non-lighting of the organic EL elements constituting the exposure devices 13Y to 13K is controlled on the basis of the binary image data, thereby exposing the photosensitive members 8Y to 8K corresponding to each color.

The latent image formed by the exposure is developed with the toner contained in the developing agent 6 supplied onto the development sleeve 10, as shown in FIG. 19. The developed toner image corresponding to each color is sequentially transferred to the recording paper 3 conveyed through the recording paper conveyance path 5. The recording paper 3 having toner images corresponding to four colors transferred thereto is conveyed to the fixing unit 23 while being sandwiched between the over-heated roller 24 and the pressure roller 25 constituting the fixing unit 23, and the toner image is then fixed onto the recording paper 3 by the heat and pressure.

In a case where the image is to be formed on a plurality of pages, the engine control CPU (not shown) temporarily stops the rotation of the registration roller 19 when the rear end of the recording paper 3 corresponding to a first page is detected by the recording paper pass detection sensor 21. Thereafter, the engine control CPU starts the conveyance of a subsequent recording paper 3 by rotating the paper feeding roller 18 after a predetermined time period. Similarly, the engine control CPU starts again the rotation of the registration roller 19 after a predetermined time period and then supplies the recording paper 3 corresponding to the next page to the recording paper conveyance path 5. In this manner, by controlling the rotation ON and OFF timing of the registration roller 19, it is possible to set the period between recording papers 3 when forming the image on a plurality of pages. Although the period between the papers (hereinafter, referred to as an inter-paper period) varies depending on the specification of the image forming apparatus 1, the inter-paper period is generally set to about 500 ms. It should be noted that an ordinary image forming operation (i.e., an exposure operation of the exposure device 13 to the photosensitive member 8) is not performed in the inter-paper period.

When the image is to be formed on a plurality of pages, the image forming apparatus 1 related to the invention is configured such that the light emitting elements (the organic EL elements) constituting the exposure device 13 are caused to emit light in those periods between the papers (the inter-paper period) so that the light intensity of the light emitting elements is measured. As described in <Initialization Operation>, the light intensity at that moment is controlled so as to be lower than that of the normal image formation so that it does not contribute to the development.

Meanwhile, as described above, the inter-paper period is set to 500 ms in the second embodiment. As described in <Initialization Operation> and will be described later, the time period required to measure the light intensity of the entire organic EL elements is about 10 seconds. Thus, the light intensity of the entire organic EL elements cannot be measured in one inter-paper period. Therefore, in the second embodiment, it is configured to measure the light intensity only of a portion of the organic EL elements constituting the exposure device 13 at the time of measuring the light intensity of the organic EL element in those periods between the papers (the inter-paper period).

Since the inter-paper period is about 500 ms and the light intensity measurement requires about 10 seconds, it can be seen from a simple calculation that the light intensity of the entire organic EL elements constituting the exposure device 13 can be measured in about 20 inter-paper periods. Since the number of pages in a series of printing job is usually smaller than the above number, in this case, it is also possible to measure the light intensity after the completion of the printing job (when the image forming apparatus 1 is changed to the standby mode to wait for printing instructions).

Figure 20:
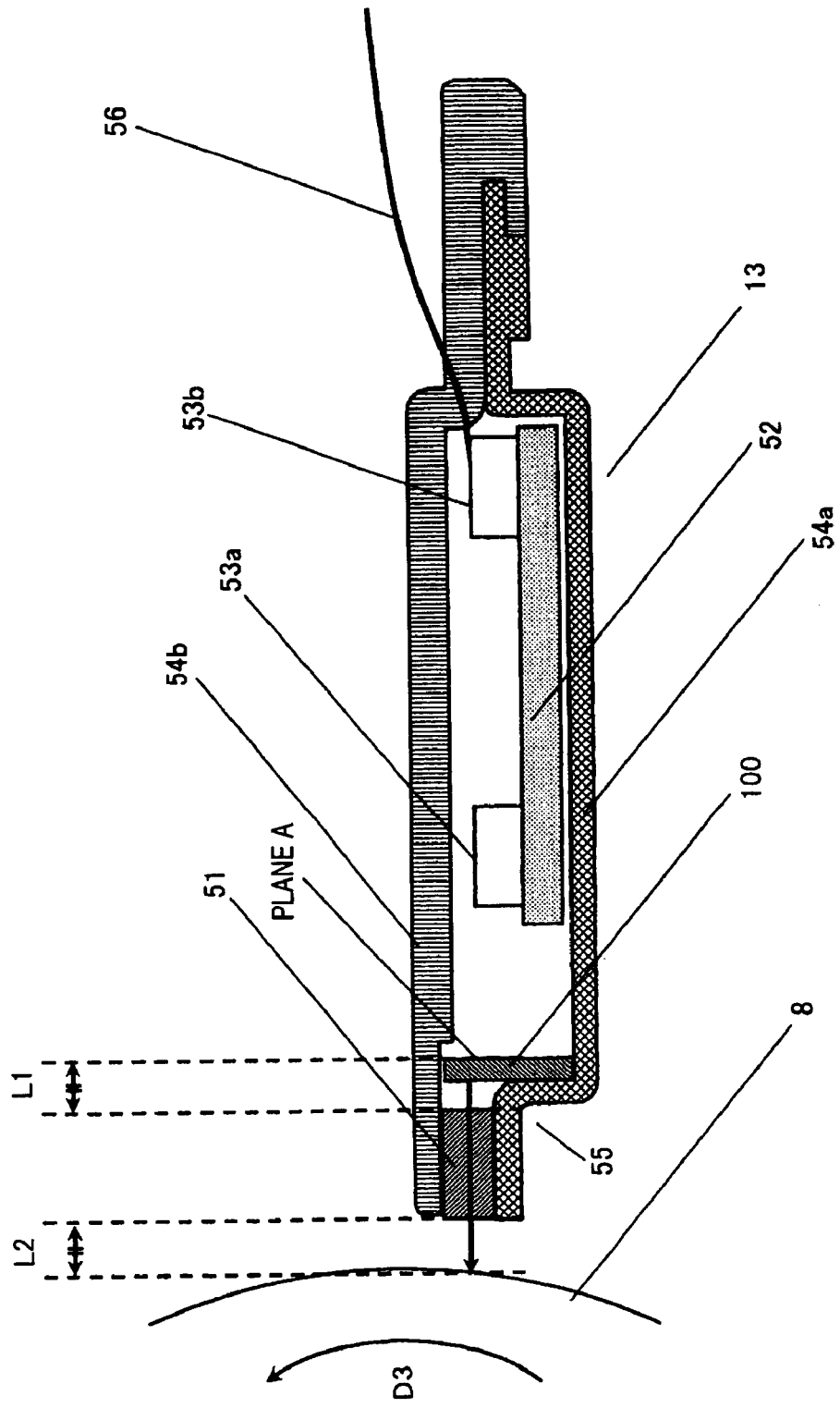
FIG. 20 is a diagram showing a configuration of an exposure device of the image forming apparatus in accordance with the second embodiment of the invention.

FIG. 20 is a diagram showing a configuration of an exposure device 13 of the image forming apparatus 1 in accordance with the second embodiment of the invention.

Hereinafter, the configuration of the exposure device 13 will be described with reference to FIG. 20. In FIG. 20, reference numeral 100 denotes an achromatic light transmitting glass substrate.

On a plane A of the glass substrate 100, the organic EL elements as the light emitting elements are formed in a direction (a main scanning direction) perpendicular to the drawing with a resolution of 600 dpi (dots per inch). Reference numeral 51 denotes a lens array constituted by aligning rod shaped lenses made of plastic or glass in an array configuration. The lens array 51 introduces the output light beams from the organic EL elements formed on the plane A of the glass substrate 100 onto the surface of the photosensitive member 8 as an erected image of same magnification.

Reference numeral 52 denotes a relay substrate having an electronic circuit formed on a glass epoxy substrate, for example. Reference numerals 53a and 53b denote a connector A and a connector B, respectively. At least the connector A 53a and the connector B 53b are mounted on the relay substrate 52. The relay substrate 52 relays the image data, the light intensity correction data and other control signals supplied through a cable 56 such as flexible flat cables from external source to the exposure device 13 through the connector B 53b and then transmits the signals to the glass substrate 100.

Since it is difficult to mount the connectors directly on the surface of the glass substrate 100 considering the bonding strength and reliability in various environment, in the second embodiment, it is constructed in a manner that an FPC (flexible printed circuit) (not shown) is used as a connecting unit for connecting the connector A 53*a* of the relay substrate 52 and the glass substrate 100 to each other, and the substrate 100 and the FPC are bonded with an ACF (anisotropic conductive film), for example, thereby connecting the FPC directly onto an ITO (indium tin oxide, tin-doped indium oxide) electrode, for example, formed in advance on the glass substrate 100.

The connector B 53*b* is a connector for connecting the exposure device 13 to an external source. Generally, the ACF connection may cause a problem of bonding strength. However, by providing the connector B 53*b* for the connection of the exposure device 13 on the relay substrate 52, it is possible to secure sufficient strength on an interface to which a user directly makes an access.

Reference numeral 54*a* denotes a housing A molded by bending a metal plate, for example. An L-shaped portion 55 is formed on a side of the housing A 54*a* facing the photosensitive member 8, and the glass substrate 100 and the lens array 51 extend along the L-shaped portion 55. When it is constructed in a manner that an end face of the housing A 54*a* to the side of the photosensitive member 8 and an end face of the lens array 51 are positioned in the same plane and one end portion of the glass substrate 100 is supported by the housing A 54*a*, thereby securing molding precision of the L-shaped portion 55, it is possible to adjust the positional relation between the glass substrate 100 and the lens array 51 with high precision. Since the housing A 54*a* requires high dimensional precision, the housing A 54*a* is preferably made of metal. By making the housing A 54*a* from metal, it is possible to suppress the influence of noise to the electronic components such as the control circuit formed on the glass substrate 100 and IC chips mounted on the surface of the glass substrate 100.

Reference numeral 54*b* denotes a housing B by molding resins. A cutout portion (not shown) is formed on a portion of the housing B 54*b* in the vicinity of the connector B 53*b*. A user can access the connector B 53*b* through the cutout portion. The image data, the light intensity correction data, the control signals such as the clock signals and the line sync signals, the driving power of the control circuit, the driving power of the organic EL elements serving as the light emitting elements are supplied to the exposure device 13 from the above-mentioned controller 41 (see FIG. 18 for reference) through the cable 56 connected to the connector B 53*b*.

FIG. 21(*a*) is a top view of a glass substrate 100 related to the exposure device 13 of the image forming apparatus 1 in accordance with the second embodiment of the invention; and FIG. 21(*b*) is an enlarged view of a main part thereof.

Hereinafter, the configuration of the glass substrate 100 according to the second embodiment of the invention will be described with reference to FIGS. 20 and 21.

In FIG. 21, the glass substrate 100 is a rectangular substrate with longitudinal and transversal sides and having a thickness of about 0.7 mm and a plurality of organic EL elements 110 as the light emitting elements are aligned in an array configuration along a direction of the longitudinal side (a main scanning direction). In the second embodiment, the organic EL elements 110 required for exposing at least A4 size paper (210 mm) are disposed in the longitudinal direction of the glass substrate 100, and the length of the longitudinal side of the glass substrate 100 is set to 250 mm including a layout space for a drive control unit 58 to be described later. Although in the second embodiment, the glass substrate 100 having a rectangular shape is described to simplify the description, a modification may be applied to the glass substrate 100 in which a cutout portion for the positioning of the glass substrate 100 fitted to the housing A 54*a* is provided on a portion of the glass substrate 100.

Reference numeral 58 denotes a drive control unit which receives the binary image data, the light intensity correction data, and the control signals such as the clock signals and the line sync signals, supplied from a source external to the glass substrate 100 and controls the driving of the organic EL element 110 on the basis of these signals. The drive control unit 58 includes an interface unit for receiving those signals from sources external to the glass substrate 100 and an IC chip (a source driver 61) for controlling the driving of the organic EL elements 110 on the basis of the received signals.

Reference numeral 60 denotes an FPC (flexible print circuit) as the interface unit for connecting the connector A 53*a* of the relay substrate 52 and the glass substrate 100 to each other. The FPC 60 is directly connected to a circuit pattern (not shown) provided on the glass substrate 100 without being connected through the connectors or the like. As described above, the binary image data, the light intensity correction data, the control signals such as the clock signals and the line sync signals, the driving power of the control circuit, and the driving power of the organic EL elements 110 serving as the light emitting elements, supplied to the exposure device 13 from an external source are relayed to the relay substrate 52 shown in FIG. 20, and then supplied to the glass substrate 100 through the FPC 60.

Reference numeral 110 denotes organic EL elements serving as an exposure light source of the exposure device 13. In the second embodiment, a number (5120) of organic EL elements 110 are aligned in an array configuration in the main scanning direction with a resolution of 600 dpi, and the lighting and non-lighting of the individual organic EL element 110 is individually controlled by a TFT circuit to be described later.

Reference numeral 61 denotes a source driver supplied as an IC chip which controls the driving of the organic EL elements 110 and is flip-chip mounted on the glass substrate 100. A bare chip component is used as the source driver 61 considering a surface mounting on the glass. The source driver 61 is supplied with power, the control-related signals such as the clock signals and the line sync signals, and 8-bit light intensity correction data from a source external to the exposure device 13 through the FPC 60. The source driver 61 serves as a driving current setting unit of the organic EL elements 110. Specifically, on the basis of the light intensity correction data generated from the controller CPU (not shown) installed in the controller 41 (see FIG. 18 for reference), the source driver 61 serving as the light intensity correcting unit and the light intensity setting unit of the organic EL elements 110 sets the driving current for driving the individual organic EL elements 110. The operation of the source driver 61 based on the light intensity correction data will be described later in detail.

In the glass substrate 100, the source driver 61 is connected to the bonding portion of the FPC 60 through a circuit pattern (not shown) made of an ITO formed with a metal on the surface, for example. The light intensity correction data and the control signals such as the clock signals and the line sync signals are input to the source driver 61 as the driving current setting unit through the FPC 60. In this manner, the FPC 60 serving as the interface unit and the source driver 61 serving as the driving parameter setting unit constitute the drive control unit 58.

Reference numeral 62 denotes a TFT circuit formed on the glass substrate 100. The TFT circuit 62 includes a gate controller (not shown) for controlling the lighting and non-lighting timings of the organic EL elements 110, such as shift registers and data latch units, and a driving circuit 160 (see FIG. 1 for reference) for supplying driving current to the individual organic EL elements 110. The driving circuit 160 is included in a pixel circuit 69 (which will be described with reference to FIG. 25). The pixel circuit 69 is provided to each of the organic EL elements 110 and are disposed in parallel with the light emitting element array formed by the organic EL elements 110. The values of the driving current for driving the individual organic EL elements 110 are set to the pixel circuit 69 by the source driver 61 serving as the driving parameter setting unit.

The gate controller (not shown) constituting the TFT circuit 62 is supplied with power, the control signal such as the clock signals and the line sync signals, and the binary image data, from a source external to the exposure device 13 through the FPC 60. The gate controller (not shown) controls the lighting and non-lighting timings of the individual light emitting elements on the basis of the power and the signals. The operations of the gate controller (not shown) and the pixel circuit (not shown) will be described later in detail with reference to drawings.

Reference numeral 62a denotes a TFT circuit formed on the glass substrate 100. The TFT circuit 62a includes a group of selection transistors 130 (see FIG. 1 for reference) which have been described in detail in connection with the first embodiment.

Reference numeral 64 denotes a sealed glass. Since the light emitting characteristic of the organic EL elements 110 deteriorates drastically due to the influence of moisture such as shrinking of the light emitting area with time and generation of non-lighting portions (dark spots) in the light emitting area, it is necessary to seal the organic EL elements 110 for blocking the moisture. In the second embodiment, since a beta sealing method in which the sealed glass 64 is attached to the glass substrate 100 using an adhesive agent and the sealing area is generally separated by 2000 μm in the sub-scanning direction from the light emitting element array constituted by the organic EL elements 110, a sealing margin of 2000 μm is secured in the second embodiment.

As shown in FIG. 21, the sealed glass 64 is attached to the glass substrate 100 using an adhesive agent 63. The sealed glass 64 is completely covering the TFT circuit 62a including the group of the selection transistors 130 and is also covering a portion of the TFT circuit 62 including the group of the driving circuit of the organic EL elements 110. The sealed glass 64 may be configured to cover the entire portion of the TFT circuit 62. By completely covering the TFT circuit 62a with the adhesive agent 63 and the sealed glass 64, in the course of dicing the glass substrate 100 out of the mother board during the mass production process of the exposure device, it is possible to prevent the cracking of the TFT circuit 62a, thereby improving the yield.

As described in detail in the first embodiment, on the glass substrate 100, the light detecting elements 120 are arranged in the main scanning direction along the longitudinal side of the glass substrate 100. Reference numeral 59 denotes a processing circuit unit including at least the charge amplifier 150 (see FIG. 4) and the AD converter 240 (see FIG. 4). The light intensity of the individual organic EL elements 110 is measured by the light detecting element 120. Basically, it is necessary to measure the light intensity by causing the organic EL elements 110 to emit light independently from each other. Since the light detecting element 120 is disposed at a distance from the organic EL elements 110 serving as an object of the measurement, the light has little influence on the light detecting element 120. Accordingly, in the second embodiment, by providing the light detecting elements 120 in correspondence to the individual organic EL element 110, it is made possible to measure the light intensity of the organic EL elements 110 at the same time.

The outputs of a plurality of the light detecting elements 120 are input to a processing circuit unit 59 through wires (not shown). The processing circuit unit 59 is a mixture of analog and digital IC chips. The outputs of the light detecting elements 120 are converted to a voltage value by the processing circuit unit 59 using a charge accumulation method, amplified with a predetermined amplification factor, and then subjected to an analog-to-digital conversion. The digital data (hereinafter, referred to as light intensity measurement data) is output to a destination external to the exposure device 13 through the FPC 60, the relay substrate 52, and the cable 56 (which are depicted in FIG. 20). As will be described later in detail, the light intensity measurement data is received and processed by the controller CPU (not shown) installed in the controller 41 (see FIG. 18 for reference), thereby outputting 8-bit light intensity correction data.

Figure 22:
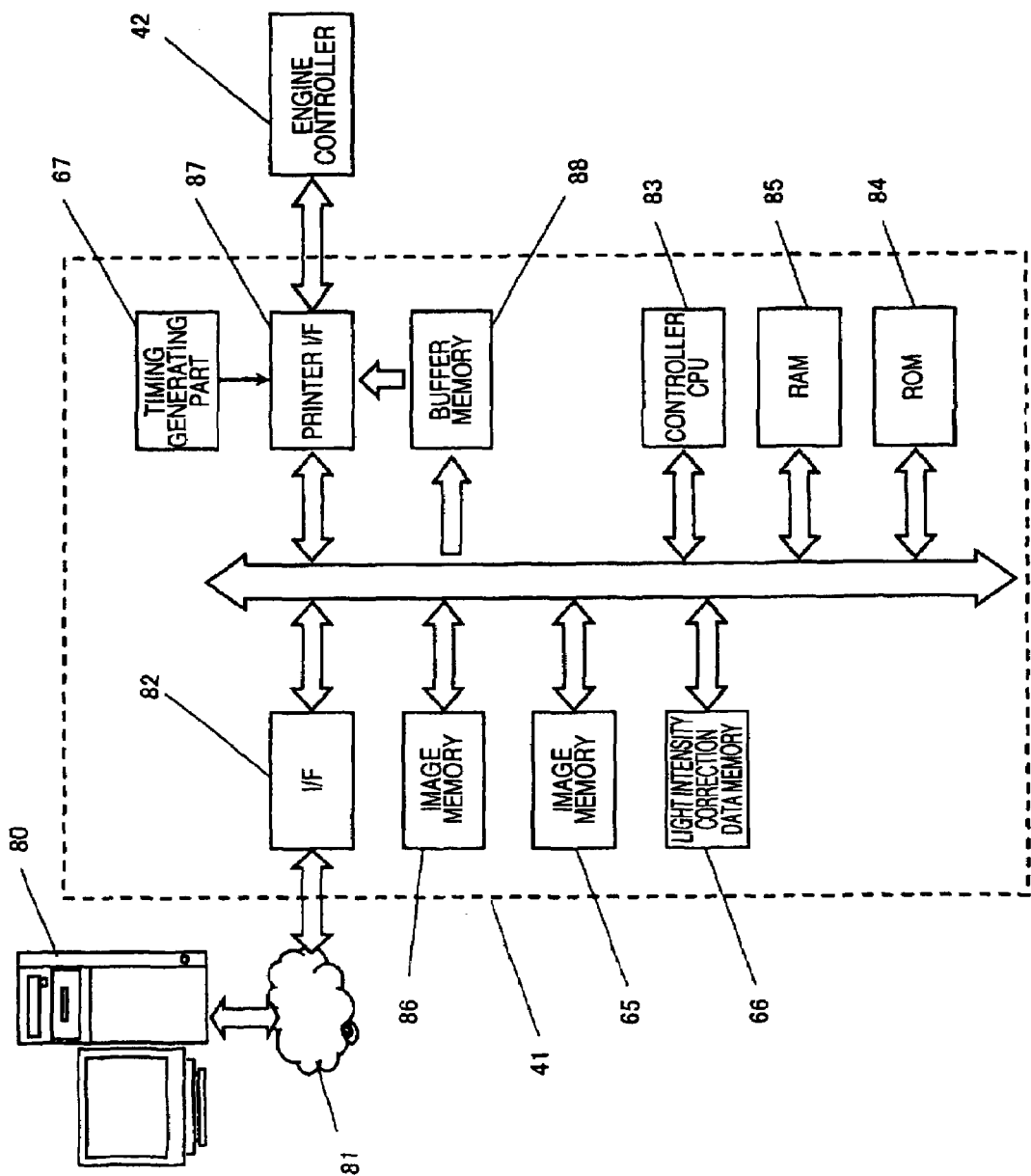
FIG. 22 is a block diagram showing a configuration of a controller of the image forming apparatus in accordance with the second embodiment of the invention.

FIG. 22 is a block diagram showing a configuration of the controller 41 of the image forming apparatus 1 in accordance with the second embodiment of the invention.

Hereinafter, the operation of the controller 41 and the light intensity correction will be described with reference to FIG. 22.

In FIG. 22, reference numeral 80 denotes a computer. The computer 80 is connected to a network 81 through which image information and print job information such as the number of printing pages and printing modes (for example, color or monochrome) are transmitted to the controller 41. Reference numeral 82 denotes a network interface. The controller 41 is a network interface, and receives through the network interface 82, the image information or the print job information transmitted from the computer 80 so as to expand the image information into a printable binary image data. Moreover, the controller 41 transmits error information detected by the image forming apparatus as so-called status information to the computer 80 through the network 81.

Reference numeral 83 denotes a controller CPU which controls the operation of the controller 41 in accordance with a program stored in an ROM 84. Reference numeral 85 denotes an RAM which is used as a work area of the controller CPU 83, and the image information, the print job information, or the like received through the network interface 82 are temporarily stored in the RAM 85.

Reference numeral 86 denotes an image processing unit in which an image processing operation (for example, an image expanding process based on a printer language, a color correction, an edge correction, a screen generation or the like) is performed in units of a page on the basis of the image information and the print job information transmitted from the computer 80 and the printable binary image data is generated. Then, the generated binary image data is stored in the image memory 65 in units of a page.

Reference numeral 66 denotes a light intensity correction data memory constituted by a rewritable nonvolatile memory such as an EEPROM.

Figure 23:
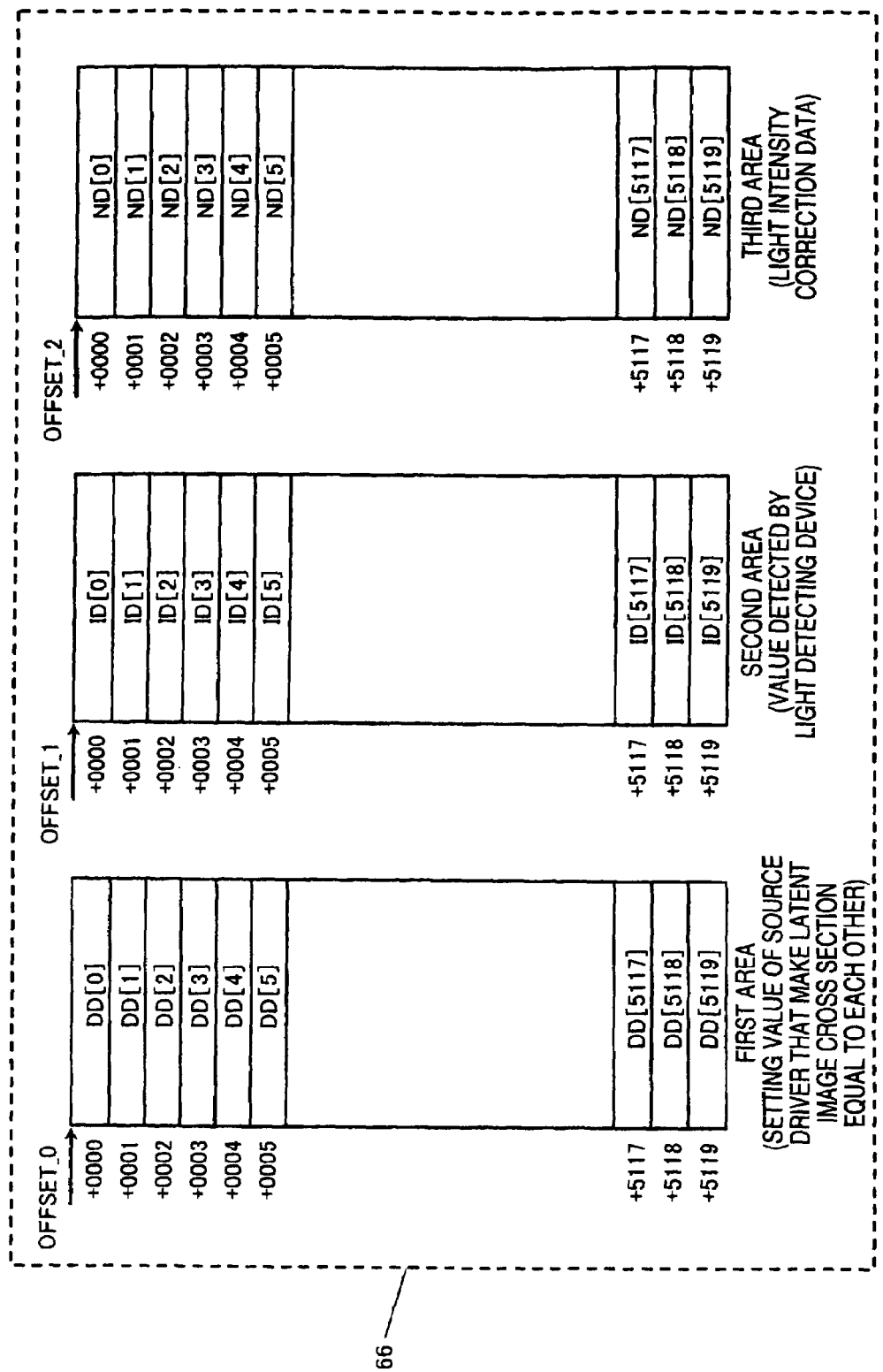
FIG. 23 is an explanatory diagram showing a content of a light intensity data memory of the image forming apparatus in accordance with the second embodiment of the invention.

FIG. 23 is an explanatory diagram showing a content of a light intensity data memory of the image forming apparatus 1 in accordance with the second embodiment of the invention.

Next, the structure and content of data stored in the light intensity correction data memory will be described with reference to FIG. 23.

As shown in FIG. 23, the light intensity correction data memory 66 has three areas, i.e., including first to third areas. Each area includes a number (5120) of 8-bit data corresponding the number of the organic EL elements 110 (see FIG. 21 for reference) constituting the exposure device 13 (see FIG. 20 for reference) and occupies a total of 15360 bytes.

First, data DD[0] to DD[5119] stored in the first area will be described with reference to FIGS. 20, 21 and 23.

The manufacturing process of the above-mentioned exposure device 13 (see FIG. 20 for reference) includes a process of adjusting the light intensity of the individual organic EL elements 110 (see FIG. 21 for reference) constituting the exposure device 13. In this case, the exposure device 13 is fitted to a certain jig (not shown), and the lighting and non-lighting of the organic EL elements 110 is individually controlled on the basis of the control signals supplied from a source external to the exposure device 13.

Two-dimensional light intensity distribution of the individual organic EL elements 110 is measured at an image forming plane of the photosensitive member 8 (see FIG. 20 for reference) by a CCD camera provided in the jig (not shown). The jig (not shown) calculates the electric potential distribution of the latent image formed on the photosensitive member 8 on the basis of the light intensity distribution and calculates the cross sectional area of the latent image having high correlation with the toner adhering amount on the basis of the actual development condition (the development bias value). The jig (not shown) changes the driving current value for driving the organic EL elements 110 (as described above, the current value for driving the organic EL elements 110 can be set by programming an analog value to the pixel circuit 69 constituting the TFT circuit 62 (see FIG. 21 for reference) using the source driver 61 (see FIG. 21 for reference)) so as to extract the driving current value, i.e., a setting value to the pixel circuit 69 (the setting data to the source driver 61 from a viewpoint of controlling), such that each of the cross sectional areas of the latent images formed by the individual organic EL elements 110 becomes substantially the same.

When assuming that both the light emitting areas of the organic EL elements 110 and the light intensity distributions in the light emitting planes of the organic EL elements 110 are equal to each other and the measurement were performed at a general development condition, the cross sectional area of the latent image is almost proportional to the exposure light intensity. In addition, since "the light intensity at a constant exposure time period" and "the exposure light intensity" have the same meaning and the light intensity of the organic EL elements 110 is generally proportional to the driving current value (i.e., the setting value to the pixel circuit 69), it may be possible to obtain the setting value to the pixel circuit 69 (i.e., the setting data to the source driver 61), making each of the cross sectional areas of the latent images formed by the individual organic EL elements 110 to be equal to each other by a single measurement of the cross sectional area of the individual organic EL elements 110 in a state that the driving current to the entire pixel circuit 69 is set to the same value.

The setting data to the source driver 61 thus obtained is stored in the first area of the light intensity correction data memory 66. As described above, the number of the setting data is 5120 equal to the number of the organic EL elements 110 constituting the exposure device 13 (i.e., equal to the number of the pixel circuits 69). In this manner, "the setting value to the source driver 61 for making each of the cross sectional areas of the latent images formed by the individual organic EL elements 110 to be equal to each other in the initial state" is stored in the first area of the light intensity correction data memory 66.

Next, the data ID[0] to ID[5119] stored in the second area will be described with reference to FIGS. 20, 21, and 23.

The jig acquires not only the data stored in the first area, but also acquires the 8-bit light intensity measurement data based on the output of the light detecting element 120 (see FIG. 21 for reference) through the processing circuit unit 59 (see FIG. 21 for reference) of the exposure device 13. Accordingly, it is possible to acquire "the light intensity measurement data when each of the cross sectional areas of the latent images formed by the individual organic EL elements 110 is made equal to each other in the initial state." The 8-bit light intensity measurement data ID[n] is stored in the second area.

Here, it is necessary that the driving condition of the organic EL elements 110 when the light intensity measurement data ID[n] is acquired by the jig is equal to that of at the time of measuring the light intensity.

Therefore, in the second embodiment, a total of about 30 ms of the lighting and non-lighting period is provided by applying multiple times of 350 μs period corresponding to 1 line period (a raster period) of the image forming apparatus 1.

In this manner, in the manufacturing process of the exposure device 13, the data stored in the first and second areas is acquired, and the data are written to the light intensity correction data memory 66 from the jig through an electric communication unit (not shown).

Next, the data ND[0] to ND[5119] stored in the third area will be described with reference to FIGS. 20, 21, 22, and 23.

The image forming apparatus 1 related to the second embodiment of the invention includes the light intensity correction unit (the controller CPU 83 (see FIG. 22 for reference)) correcting the light intensity of the organic EL elements 110 so as to be equal to each other on the basis of the measurement result of the light detecting element 120 serving as the light intensity measuring unit, and the light intensity setting unit (the controller CPU 83) sets the light intensity of each of the organic EL elements 110 at the time of forming the image on the basis of the output of the light intensity correction unit. The light intensity setting value (i.e., light intensity correction data) of each of the organic EL elements 110 when the image is formed by the controller CPU 83 serving as the light intensity correction unit is stored in the third area.

As described above, in the image forming apparatus 1 of the second embodiment, the light intensity of the organic EL elements 110 constituting the exposure device 13 is measured at a predetermined timing to be described later, such as in the initialization period of the image forming apparatus 1, in a start-up period of the image forming operation, in the inter-paper period, and at the time of completing the image forming operation. The controller CPU 83 generates the light intensity correction data on the basis of the light intensity measurement data measured at these timings, "the setting value to the source driver 61 for making each of the cross sectional areas of the latent images formed by the individual organic EL elements 110 to be equal to each other in the initial state" stored in the first area in the manufacturing process of the exposure device 13, and similarly "the light intensity measurement data when each of the cross sectional areas of the latent images formed by the individual organic EL elements 110 is made equal to each other in the initial state" stored in the second area in the manufacturing process of the exposure device 13.

Hereinafter, the details of computation of the light intensity correction data by the controller CPU 83 will be described. In this case, it is assumed that the light intensity at the time of measuring the light intensity is made equal to that of at the time of forming the image in order to clarify the point of the invention.

Assuming that "the setting value to the source driver 61 making each of the cross sectional areas of the latent images formed by the individual organic EL elements 110 to be equal to each other in the initial state" stored in the first area is DD[n] (wherein, n represent an organic EL element number in the main scanning direction), "the light intensity measurement data when each of the cross sectional areas of the latent images formed by the individual organic EL elements 110 is made equal to each other in the initial state" stored in the second area is ID[n], and a new light intensity measurement data measured in the initialization operation or the like is PD[n], a new light intensity correction data ND[n] to be written in the third area can be generated by the controller CPU 83 on the basis of Equation 1.

$$ND[n]=DD[n] \times ID[n]/PD[n] \qquad \text{[Equation 1]}$$

(n represents an organic EL element number in the main scanning direction)

The formula in Equation 1 is a basic formula for use in the light intensity correction data calculation and should be used only for the case where the light intensity to be used for the image forming operation is the same as that for the light intensity measurement. In the second embodiment, the light intensity of the organic EL element 110 at the time of the light intensity measurement related to the light intensity correction is set to be smaller than that for the image forming operation. To realize this, at the time of measuring the light intensity, the DD[n] multiplied by an integer k smaller than 1 is used as the light intensity correction data to be transmitted to the exposure device 13, and the organic EL element 110 is lighted on the basis of the obtained value. For example, by programming the light intensity correction data DD[n] obtained through multiplication with k (0.5, for example) to the pixel circuit 69 (not shown) through the source driver 61 (see FIG. 21), it is possible to increase the light intensity of the organic EL element 110 by 0.5 times [in the unit of cd/m$^2$] compared with that for the image forming operation. In this case, the new light intensity correction data ND[n] can be generated on the basis of Equation 2.

$$ND[n]=DD[n] \times (ID[n] \times k)/PD[n] \qquad \text{[Equation 2]}$$

(n represents an organic EL element number in the main scanning direction, and k is an integer smaller than 1)

In this manner, the generated light intensity correction data ND[n] is written to the third area of the light intensity correction data memory 66 (see FIG. 22 for reference). Thereafter, the light intensity correction data ND[n] is copied from the light intensity correction data memory 66 to a predetermined area of the image memory 65 (see FIG. 22 for reference) prior to the image forming operation. In the image forming operation, the light intensity correction data ND[n] copied to the image memory 65 is temporarily stored in a buffer memory 88 (see FIG. 22 for reference) to be described later together with the binary image data and then output to the engine control unit 42 (see FIG. 22 for reference) through a printer interface 87 (see FIG. 22 for reference).

The light intensity measurement data is converted to a voltage value by the above-mentioned processing circuit unit 59 (see FIG. 21 for reference) using a charge accumulation method. Although the charge accumulation method is effective in improving an SN ratio, the charge accumulation requires some extent of accumulation time period since the magnitude of the output (electric current value) of the light detecting element 120 (see FIG. 21 for reference) is very small, which will be described later. In the second embodiment, by setting the accumulation period to about 30 ms, it is possible to obtain the SN ratio of 48 DB at the time of the light intensity measurement.

However, when the accumulation period is set to 30 ms, the light intensity measurement requires a longer time period. Specifically, when the light intensity of a number (5120) of organic EL elements 110 (see FIG. 21) is to be measured one by one, it may require 154 (=5120×30 ms) seconds and thus is not practical. Therefore, the second embodiment is configured such that the light detecting elements 120 are configured with the poly-crystalline silicon sensors integrated onto the glass substrate 100, the integrated light detecting elements are divided into 16 groups so that the charge accumulation is simultaneously performed for each of the groups, and the voltages at each terminal of the light detecting elements 120 having charge accumulated therein are measured so that crosstalk between neighboring light detecting elements 120 is prevented, thereby speeding up the processing. With this configuration, the light intensity measurement can be performed in 9.6 (=154/16) seconds.

Next, the description will be continued with reference to FIG. 22.

Reference numeral 88 denotes a buffer memory in which the binary image data stored in the image memory 65 and the above-mentioned light intensity correction data is stored before being transmitted to the engine control unit 42. The buffer memory 88 is composed of a so-called dual port RAM in order to absorb the difference between the transmission speed from the image memory 65 to the buffer memory 88 and the data transmission speed from the buffer memory 88 to the engine control unit 42.

Reference numeral 87 denotes a printer interface. The binary image data stored to the image memory 65 in units of a page and the light intensity correction data are transmitted to the engine control unit 42 through the printer interface 87 in synchronism with the clock signals and the line sync signals generated by the timing generation unit 67.

Figure 24:
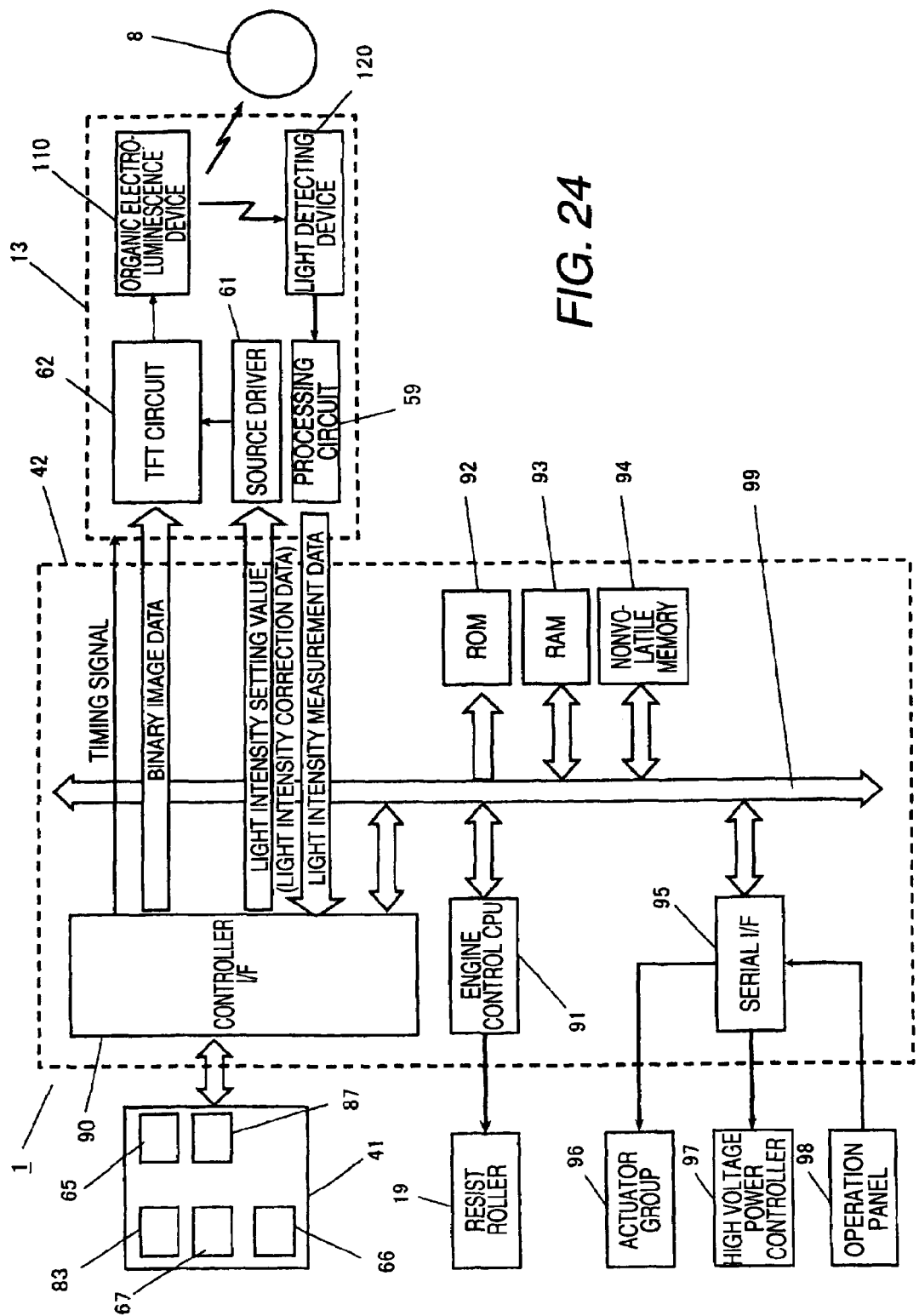
FIG. 24 is a block diagram showing a configuration of an engine control unit of the image forming apparatus in accordance with the second embodiment of the invention.

FIG. 24 is a block diagram showing a configuration of the engine control unit 42 of the image forming apparatus 1 in accordance with the second embodiment of the invention.

Hereinafter, the operation of the engine control unit 42 will be described with reference to FIGS. 18 and 24.

In FIG. 24, reference numeral 90 denotes a controller interface. The controller interface 90 receives the light intensity correction data and the binary image data in units of a page, transmitted from the controller 41.

Reference numeral 91 denotes an engine control CPU which controls the image forming operation of the image forming apparatus 1 on the basis of the program stored in the ROM 92. Reference numeral 93 denotes an RAM which is used as a work area at the time of operating the engine control CPU 91. Reference numeral 94 denotes a rewritable nonvolatile memory such as an EEPROM. Information related to the lifetime of components such as the rotation time period of the photosensitive member 8 of the image forming apparatus 1 and the operation time period of the fixing unit 23 (see FIG. 18 for reference) is stored in the nonvolatile memory 94.

Reference numeral 95 denotes a serial interface. Information received from a sensor group such as the recording paper pass detection sensor 21 (see FIG. 18 for reference) and the recording paper rear-end detection sensor 28 (see FIG. 18 for reference) or the output of the power source monitor unit 44 (see FIG. 18 for reference) is converted to a serial signal having a predetermined period by a serial conversion unit (not shown) and then transmitted to the serial interface 95. The serial signal received by the serial interface 95 is converted to a parallel signal and then read to the engine control CPU 91 through a bus 99.

Meanwhile, control-related signals such as start-up and stop signals to the paper feeding roller 18 (see FIG. 18 for reference) and the driving source 38 (see FIG. 18 for reference), control signals to an actuator group 96 such as the electromagnetic clutch (not shown) controlling the transmission of driving force to the feeding roller 18 (see FIG. 18 for reference), and control signals to a high voltage source control unit 97 managing the electric potential settings of such as the development bias, the transfer bias, and the charging potential are transmitted to the serial interface 95 as a parallel signal. In the serial interface 95, the parallel signal is converted to a serial signal and transmitted to the actuator group 96 and the high voltage source control unit 97. In this manner, in the second embodiment, the sensor input signals and the actuator control signals which are not required to be detected at high speed are output through the serial interface 95. Meanwhile, the control signals for driving and stopping the registration roller 19 requiring some extent of high speed operation are directly connected to an output terminal of the engine control CPU 91.

Reference numeral 98 denotes an operation panel connected to the serial interface 95. A user command input to the operation panel 98 is recognized by the engine control CPU 91 through the serial interface 95. Alternatively, the operation panel 98 serving as a command input unit for allowing a user to input a command may be provided in the second embodiment, so that the light intensity of the organic EL elements 110 constituting the exposure device 13 is measured and corrected on the basis of the input to the operation panel 98. The command may be input from an external computer or the like through the controller 41. As a specific example, a case may be considered in which a large amount of printing has been performed, the user has found an uneven printing density distribution on the printed paper, and the user forcibly correct the light intensity, thereby securing the image quality. When the image forming apparatus 1 is in a standby mode, the user can instruct to forcibly perform the light intensity correcting operation at any time. Even in the image forming operation, the user can instruct to perform the light intensity correcting operation by putting the image forming apparatus 1 into an off-line mode so as to temporarily holding the image forming operation.

In the end, when a request for correcting the light intensity is input from the operation panel 98 serving as the command input unit, or the like, as described above in <Initialization Operation>, the engine control CPU 91 starts driving of components of the image forming apparatus 1 and outputs a creation request of dummy image information for the light intensity correction to the controller 41. Then, the controller CPU 83 installed in the controller 41 generates the dummy image information for the light intensity correction in accordance with the creation request, and the organic EL elements 110 constituting the exposure device 13 is controlled to be lighted or unlighted on the basis of the dummy image information. In this case, the light intensity of the individual organic EL elements 110 is detected by the light detecting element 120 provided to the exposure device 13, and the light intensity correcting operation is performed on the basis of the light intensity detection result such that the light intensity of the individual organic EL elements 110 becomes equal to each other.

Next, the operation of measuring the light intensity of the organic EL elements 110 will be described with reference to FIGS. 18, 22, 23, and 24.

As described later, although the light intensity correcting operation is performed at various timings such as in the initialization period immediately after the start-up of the image forming apparatus 1, prior to the start of printing operation, in the inter-paper period, after the start of the printing operation, and at a user designation timing through the operation panel 98, description will be made only to a case where the light intensity measurement operation is performed at the time of initializing the image forming apparatus 1. Moreover, although the image forming apparatus 1 of the second embodiment is configured to be able to form a full-color image and has four exposure devices 13Y to 13K (see FIG. 18 for reference) corresponding to four colors, description will be made only to the operation regarding only one color and the exposure devices will be denoted by the exposure device 13. Moreover, in the following situation, it is assumed that the driving source 38 (see FIG. 18 for reference) and the development station 2 (see FIG. 19 for reference) are already in an activated state as described above in detail in <Initialization Operation>.

In the image forming apparatus 1, since the image forming operation is managed by the engine control unit 42, the light intensity correction operation is activated by the engine control CPU 91 of the engine control unit 42. First, the engine control CPU 91 outputs a creation request of dummy image information different from normal binary image data related to the image formation to the controller 41.

The engine control unit 42 and the controller 41 are connected to each other through a bidirectional serial interface (not shown), and a request command (request) and an acknowledge signal (response information) to the request command are communicated to each other. The creation request of the dummy image information issued by the engine control CPU 91 is output to the controller 41 from the controller interface 90 through the bus 99 using the bidirectional serial interface (not shown).

The controller CPU 83 installed in the controller 41 creates the dummy image information, i.e., the binary image data used in measuring the light intensity and write the information to the image memory 65. The controller CPU 83 reads out "the setting value to the source driver 61 making each of the cross sectional areas of the latent images formed by the individual organic EL elements 110 to be equal to each other in the initial state" DD[n] (n: 0 to 5119) stored in the first area (see FIG. 18 for reference) of the light intensity correction data memory 66, multiplies the value by k (for example, 0.5) smaller than 1 so that the light intensity of the organic EL element 110 is set to be smaller than that for the normal image formation, and writes the multiplied value to a predetermined area of the image memory 65. After completing these processes, the controller CPU 83 outputs response information to the engine control unit 42 through the printer interface 87.

In this case, the engine control CPU 91 of the engine control unit 42 having received the above-mentioned response information immediately sets a writing timing to the exposure device 13. That is, the engine control CPU 91 sets a writing timing for the exposure device 13 to form the electrostatic latent image to timers as hardware (not shown) and immediately starts the operation of the timer when receiving the response information. This function is provided to determine the start timings of the plurality of exposure devices 13 corresponding to each color. Such a strict timing setting may not be required in the light intensity measuring operation and zero value (0) may be set to each of the timers, for example. The timer outputs an image data transmission request to the controller 41 after a predetermined time period. The controller 41 having received the image data transmission request transmits the binary image data to the exposure device 13 through the controller interface 90 in synchronization with the timing signals (clock signals, line sync signals, or the like) generated from the timing generation unit 67. At the same time, "the light intensity setting value smaller than that for the normal image formation" written to the image memory 65 is transmitted to the exposure device 13 in synchronization with the above-mentioned timing signals. In the case of the normal image formation, unlike the light intensity measurement, the light intensity correction data (the above-described ND[n]) rather than "the light intensity setting value smaller than that for the normal image formation" is supplied to the exposure device 13 through the same transmission path.

In this manner, the binary image data transmitted in synchronization with the timing signals is input to the TFT circuit 62 of the exposure device 13, and the light intensity setting value is input to the source driver 61 of the exposure device 13. In the exposure device 13, the lighting and non-lighting of the corresponding organic EL element 110 is controlled on the basis of the binary image data, i.e., ON/OFF information. Since the light intensity of the organic EL elements 110 at that moment is based on the light intensity setting value, the individual organic EL element 110 emits light with a light intensity smaller than that for the normal image formation. The light intensity of the individual organic EL elements 110 at that moment is measured by the light detecting element 120.

In this manner, the lighting and non-lighting of the organic EL elements 110 is controlled and the light intensity is measured by the light detecting element 120. The output (analog current value) of the light detecting element 120 is converted to a voltage value by the processing circuit unit 59 using the charge accumulation method, amplified with a predetermined amplification factor, and then subjected to an analog-to-digital conversion. Thereafter, the data is output from the processing circuit unit 59 as an 8-bit light intensity measurement data (digital data).

The light intensity measurement data output from the processing circuit unit 59 is transmitted to the controller 41 from the engine control unit 42 through the controller interface 90, and received by the controller CPU 83 of the controller 41. Then, the controller CPU 83 generates the light intensity correction data ND[n] as the PD[n] in Equation 2 on the basis of the light intensity measurement data, as described with reference to FIGS. 22 and 23.

Figure 25:
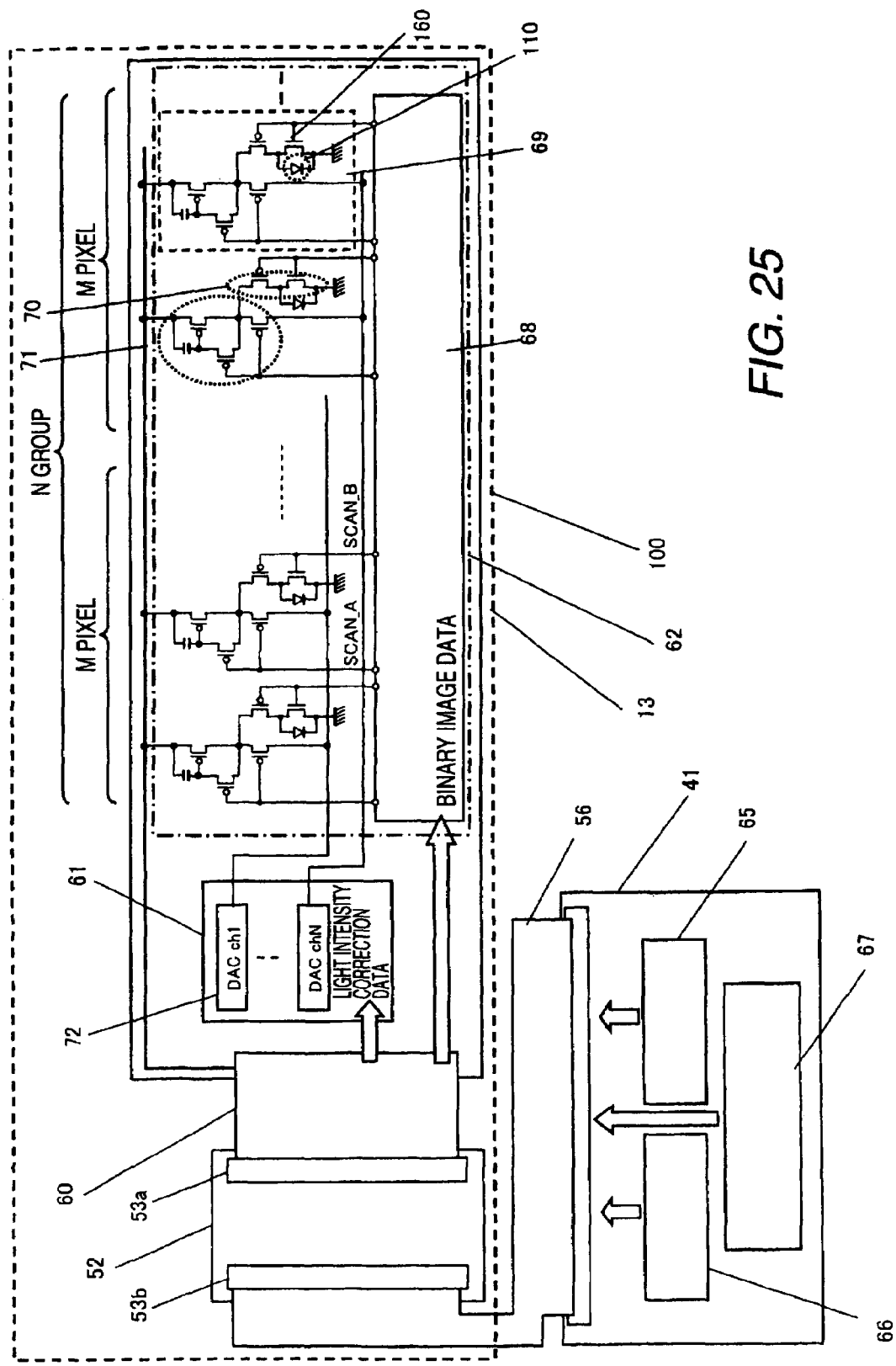
FIG. 25 is a circuit diagram showing the exposure device of the image forming apparatus in accordance with the second embodiment of the invention.

FIG. 25 is a circuit diagram showing the exposure device 13 of the image forming apparatus 1 in accordance with the second embodiment of the invention.

Hereinafter, the lighting and non-lighting control of the source driver 61 and the TFT circuit 62 will be described with reference to FIG. 25.

The TFT circuit 62 is mainly divided into the pixel circuit 69 and the gate controller 68. The pixel circuit 69 is provided to each of the organic EL elements 110, and N groups of the organic EL elements 110 corresponding to M pixels are arranged on the glass substrate 100.

In the second embodiment, a number of organic EL elements 110 corresponding to 8 pixels are provided in one group (i.e., M=8) and the number of groups is 640. Accordingly, the total number of pixels is 5120 (8×640=5120). Each of the pixel circuits 69 includes a driver unit 70 for supplying an electric current to the organic EL elements 110 so as to drive the organic EL elements 110, and a so-called electric current programming unit 71 for storing the current value (i.e., the driving current value of the organic EL elements 110) supplied from drivers for controlling the lighting and non-lighting of the organic EL elements 110 to a capacitor included therein. The pixel circuit 69 can drive the organic EL elements 110 with a constant current in accordance with the driving current value programmed at a predetermined timing.

The gate controller 68 includes a shift register (not shown) sequentially shifting the input binary image data, a latch unit (not shown) disposed in parallel with the shift register and holding a predetermined number of pixels input to the shift register in a bundle, and a control unit (not shown) controlling timings for these operations. The gate controller 68 receives the binary image data (the image information converted by the controller 41 in the case of the image forming operation or the dummy image information converted by the controller 41 in the case of the light intensity measuring operation) from the controller 41 and outputs SCAN_A and SCAN_B signals on the basis of the binary image data, i.e., the ON/OFF information, thereby controlling timings for lighting or non-lighting the organic EL elements 110 connected to the pixel circuit 69 and timings for programming the driving current of the organic EL elements 110.

The source driver 61 includes a number of D/A converter 72 corresponding to the number N (640 in the second embodiment) of groups in the organic EL elements 110. The source driver 61 sets the driving current of the individual organic EL elements 110 on the basis of the 8-bit light intensity correction data supplied through the FPC 60 (on the basis of the ND[n] shown in FIG. 23 in the case of the image formation, the DD[n] multiplied by an integer k smaller than 1, shown in FIG. 23, in the case of the light intensity measurement). With this configuration, the light intensity of the individual EL element 110 in the case of the image formation can be uniformly controlled on the basis of the above-described light intensity correction data ND[n], and the light intensity of the EL element 110 in the case of the light intensity measurement can be controlled so as to be smaller than that for the normal light intensity measurement.

Figure 26:
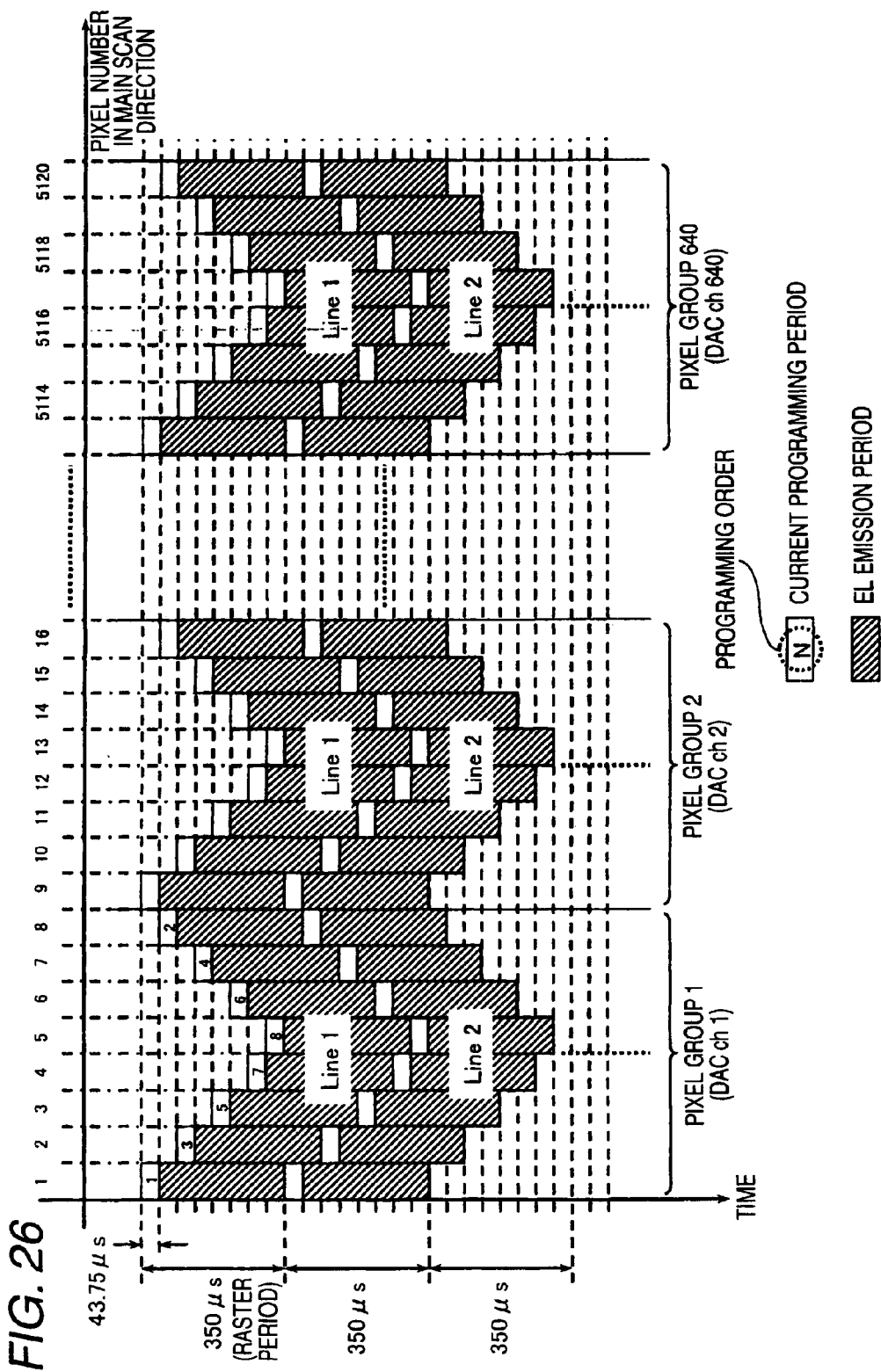
FIG. 26 is an explanatory diagram showing an electric current programming period related to the exposure device of the image forming apparatus and a lighting and non-lighting period of an organic EL element in accordance with the second embodiment of the invention.

FIG. 26 is an explanatory diagram showing an electric current programming period related to the exposure device 13 of the image forming apparatus 1 and a lighting and non-lighting period of an organic EL element 110 in accordance with the second embodiment of the invention.

Hereinafter, the lighting and non-lighting control in accordance with the second embodiment will be described with reference to FIGS. 25 and 26. In the following description, a single pixel group composed of 8 pixels (for example, "the pixel number in the main scanning direction" is 1 to 8 in FIG. 26) will be described in order to simplify the description.

In the second embodiment, one line period (raster period) of the exposure device 13 is set to 350 µs, and ⅛ (43.75 µs) of the one line period is used as the programming period for setting the driving current value to the capacitor provided in the electric current programming unit 71.

First, the gate controller 68 (see FIG. 25 for reference) sets the SCAN_A signal and the SCAN_B signal for the number 1 pixel to ON and OFF, respectively, so as to set the programming period. In the programming period, the D/A converter 72 installed in the source driver 61 (see FIG. 25 for reference) is supplied with 8-bit light intensity correction data, and the capacitor in the current programming unit 71 (see FIG. 25 for reference) is charged by the analog level signal obtained by D/A converting the digital data. Operations in the programming period are performed regardless of ON and OFF of the binary image data input to the gate controller 68. In this manner, the analog value based on the 8-bit light intensity correction data (based on the ND[n] shown in FIG. 23 in the case of the image formation, the DD[n] multiplied by an integer k smaller than 1, shown in FIG. 23, in the case of the light intensity measurement) is written to the capacitor formed in the current programming unit 71 at every one line period. That is, charges accumulated in the capacitor of the current programming unit 71 is always refreshed, and thus the driving current of the organic EL elements 110 determined on the basis of the data is always maintained at a constant value.

After expiration of the programming period, the gate controller 68 (see FIG. 25 for reference) immediately switches the SCAN_A signal and the SCAN_B signal to OFF and ON states, respectively, so as to set the lighting and non-lighting period. As described above, the gate controller 68 (see FIG. 25 for reference) is already supplied with the binary image data in the image forming operation and the light intensity measuring operation, and the organic EL elements 110 is not lighted even in the lighting period when the image data is in the OFF state. Meanwhile, when the image data is in the ON state, the organic EL elements 110 are continuously lighted for the remaining time period 306.25 μs (350 μs–43.75 μs). However, since it takes a little time to switch the control signal, the lighting time period is a little decreased. As described above, in the second embodiment, since it is assumed that it takes 30 ms to measure the light intensity of the organic EL elements 110, the controller 41 generates the dummy image information so that the number of lightings in the light intensity measuring operation becomes 100 (i.e., 100 lines), for example.

Meanwhile, in FIG. 26, when the programming period for the pixel circuit 69 (see FIG. 25 for reference) corresponding the number 1 pixel expires, the gate controller 68 (see FIG. 25 for reference) immediately sets the current programming period for the pixel circuit 69 (see FIG. 25 for reference) corresponding to the number 8 pixel. In a similar sequence to that of the pixel circuit corresponding to the number 1 pixel, when the programming period for the pixel circuit corresponding to the number 8 pixel expires, an operation of setting the lighting period of the organic EL elements 110 (see FIG. 25 for reference) corresponding to the pixel number is performed.

In this manner, the gate controller 68 (see FIG. 8 for reference) sets the programming period and the lighting period in the order of the pixel number in the main scanning direction, i.e., "1->8->2->7->3->6->4->5->1 . . . ." By setting the lighting order in such a manner, the lighting timings of pixels disposed adjacent to each other in pixel groups adjacent to each other become close to each other in time and it is thus possible to make uneven display of image less prominent at the time of forming one line of image.

The second embodiments have been described with reference to an configuration in which the lighting periods of the organic EL elements 110 constituting the exposure device 13 are set to a constant period and the light intensity of the organic EL elements 110 is controlled by changing the current value. However, the invention may be easily applied to a so-called PWM method in which the driving current value of the light emitting element such as the organic EL element 110 is set to a fixed value and the light intensity of the light emitting element is controlled by changing the lighting period. In this case, the content of the first area described with reference to FIG. 23 may be substituted by "the setting value of the driving period for making the cross sectional areas the latent images equal to each other."

In addition, there is known an exposure device which forms the latent image by exposing multiple times those portions having substantially the same relation to the rotation direction of the photosensitive member using a plurality of light emitting element arrays constituted by the organic EL elements. The invention may be applied to such an exposure device by setting the light intensity of the PWM period so that the latent images formed through the multiple times of exposure do not contribute to the development. In such an exposure device, since the latent image contributing to the development is not formed in the case of a single array type light emitting element, a sequence in which the light intensity may be measured in the inter-paper period in units of an array may be considered.

Although in the second embodiment, the light intensity of the organic EL elements 110 is measured using the light detecting element 120 disposed on the glass substrate 100 of the exposure device 13, the invention is not limited to this. That is, since the light transmittance of low-temperature poly-silicon constituting the TFT circuit 62 is relatively high, it is possible to bury the light detecting element 120 corresponding to the individual organic EL elements 110 at a portion adjacent to the TFT circuit 62 even in a so-called bottom emission type organic EL element in which the exposure light is extracted from the glass substrate 100 side as described in connection with the second embodiment. In this case, the light detecting element 120 is generally formed on the entire surface immediately below the light emitting plane of the organic EL elements 110, but may be formed at a portion of the surface corresponding to the location of the organic EL elements 110.

In addition, the invention may be configured such that a sensor unit (not shown) having a plurality of sensor portions made, for example, of amorphous silicon and arranged in a film configuration is attached on an end face of the glass substrate 100 of the exposure device 13 so as to measure reflection light having traveled through the glass substrate 100. The technical scope of the invention may be similarly applied to such a configuration.

As described above, although the second embodiment has been described with reference to the image forming apparatus employing an electro-photographic method, the invention is not limited to the electro-photographic method. Since the RGB light source can be easily realized by the organic EL element, the invention may be employed in an image forming apparatus in which a plurality of exposure devices having light sources corresponding to R, G, and B colors is provided as an exposure light source so as to directly expose a photographic paper on the basis of image data corresponding to each color of R, G, and B.

Third Embodiment

FIGS. 27(*a*) and 27(*b*) are explanatory diagrams showing examples of an element arrangement pattern in the exposure device in accordance with a third embodiment of the invention.

Next, a modified example of the element arrangement pattern in accordance with the third embodiment of the invention will be described.

Although in the first embodiment, as shown by a schematic diagram in FIG. 27(*a*), the selection transistor 130, the capacitance element 140, and the light detecting element 120 are aligned in a line shape in a direction substantially vertical to the light emitting element array (see FIG. 1 for reference), the capacitance element 140 may be shifted from the line arrangement of the selection transistor 130 and the light detecting element 120 in a zigzag configuration, as shown by a schematic diagram in FIG. 27(*b*). In FIG. 27, reference numeral 110 denotes the organic EL element.

Although in the above-described embodiments, an example of the light detecting element 120 configured with TFTs has been described, the light detecting element 120 is not limited to the TFTs. Alternatively, the invention may be applied to the light detecting element having different structures such as image sensors having a sandwiched structure in which amorphous silicon or poly-crystalline silicon is sandwiched by a pair of electrodes.

Fourth Embodiment

FIGS. 28(a) to 28(c) are explanatory diagrams showing examples of an element arrangement pattern in the exposure device in accordance with a fourth embodiment of the invention.

In the above-described embodiments, as shown by a schematic diagram in FIG. 28(a), since the light detecting elements 120 are provided to the organic EL elements 110 in an one-to-one basis, it is easy to detect data for the individual elements with a high accuracy. Alternatively, such a highly accurate data detection may also be realized with a two-to-one mapping or n-to-one mapping.

As a modified example, as shown by a schematic diagram in FIG. 28(b), the light detecting elements 120 may be provided to the organic EL elements 110 in an two-to-one basis. With this configuration, since a single light detecting element is disposed in correspondence to two light exiting areas, it is possible to decrease the number of circuits required for the light intensity detection. However, in this case, it is necessary to carefully control the synchronization of switching operations between each combination of the light detecting elements and the organic EL elements.

As a further modified example, as shown by a schematic diagram in FIG. 28(c), the light detecting elements 120 may be provided to the organic EL elements 110 in an n-to-one basis (where n is 3 or more). With this configuration, since a single light detecting element is disposed in correspondence to a number (n) of light exiting areas, it is possible to greatly decrease the number of circuits required for the light intensity detection. However, in this case, when there is any defective light detecting element, the result of the light intensity correction for the entire n numbers of organic EL element cannot be reliable. Accordingly, it is necessary to pay attention to prevent a further spreading of the irregular in the light intensity.

Fifth Embodiment

Figure 29:
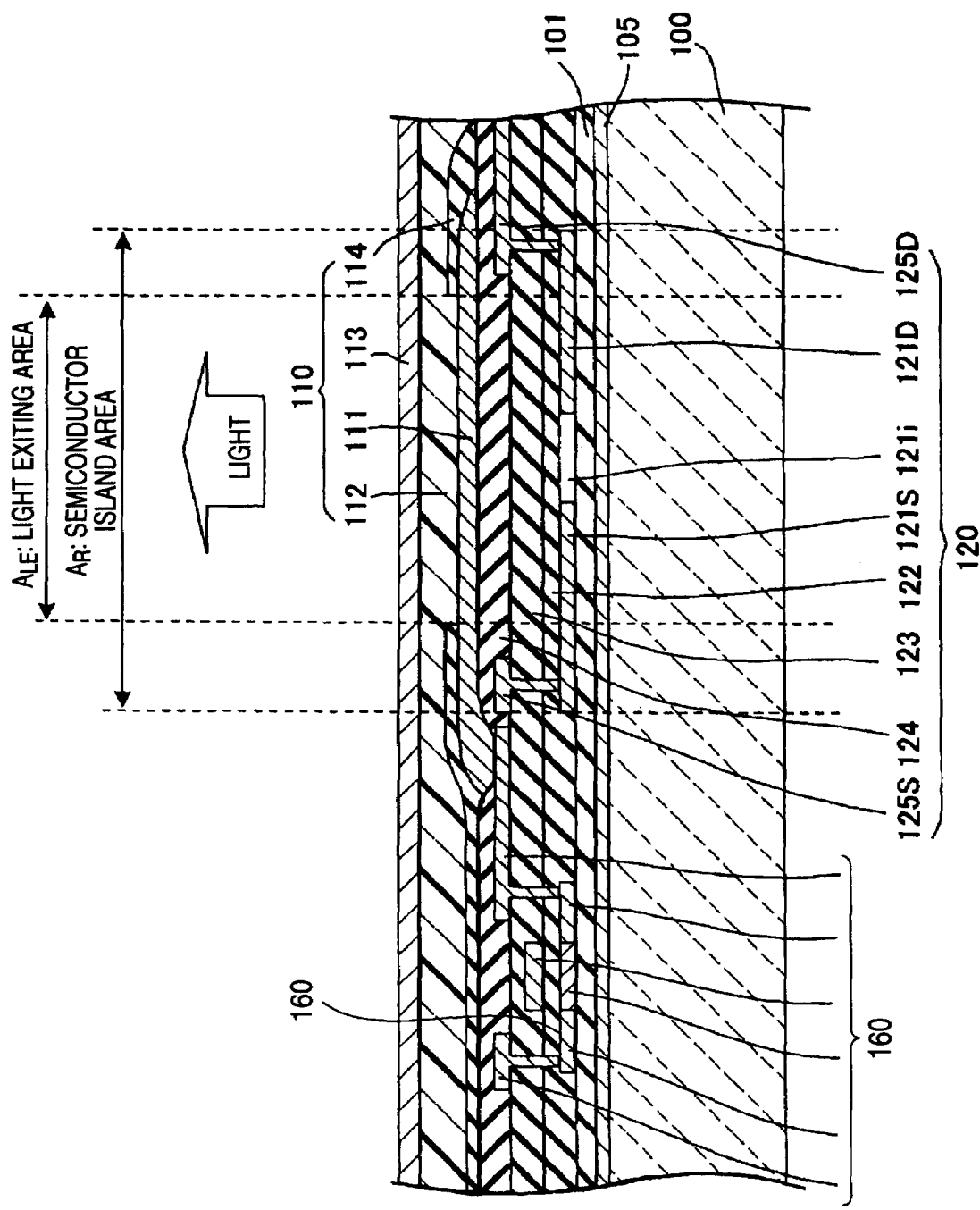
FIG. 29 is a cross-sectional diagram of an exposure device in accordance with a fifth embodiment of the invention, in which the exposure device is designed for a top-emission structure.

FIG. 29 is a cross-sectional diagram of an exposure device in accordance with a fifth embodiment of the invention, in which the exposure device is designed for a top-emission structure. Other configurations are the same as those described in the first embodiment, and descriptions thereof will be omitted.

The top-emission structure is a structure in which the light emitted from the light emitting layer 112 is output toward the cathode 113 disposed above the light emitting layer 112 in an opposite direction to the case of the bottom-emission structure. In the configuration shown in FIG. 29, a reflective layer 105 made of a metal is provided on the glass substrate 100 so that the light is output toward the cathode 113.

In the case of the top-emission structure, the light generated from the light emitting layer 112 of the organic EL element 110 and output in a direction departing from the light detecting element 120 is exposed to a photosensitive member (not shown) (see FIG. 20 and the second embodiment for reference). Meanwhile, the light generated from the light emitting layer 112 is also output toward the light detecting element 120 in a direction opposite to the direction for the exposure of the photosensitive member, and the light is received by the light detecting element 120.

In the case of the top-emission structure, since the exposure light does not have to pass through the light detecting element 120, it is unnecessary to use highly transparent poly-crystalline silicon as a material for the light detecting element 120. The light detecting element 120 may be formed of amorphous silicon having an excellent photocurrent generation capability.

However, the implementation of the top-emission structure requires forming the cathode 113 with a transparent metal, which is technically difficult. Instead, the cathode 113 may be formed by laminating a ultra-thin metal layer (thin film cathode) made of such as Al or Ag and a transparent electrode such as ITO onto each other. Since the thickness of the metal layer is very small, it is possible to realize the cathode having a sufficient light transmitting property. Even though the manufacturing cost may increase because the top-emission structure requires an additional numbers of manufacturing processes compared with the bottom-emission structure, it is possible to provide an optical head having an excellent light emitting efficiency.

Although in the first and fifth embodiments, the light emitting elements (the EL element 110) aligned in one line (array) were described, the light emitting elements may be aligned in a plurality of lines (arrays) to substantially increase the number of light emitting colors.

As described above, the EL element 110 and the light detecting element 120 may be arranged in a two-dimensional manner so that they are applied in a display apparatus.

Figure 30:
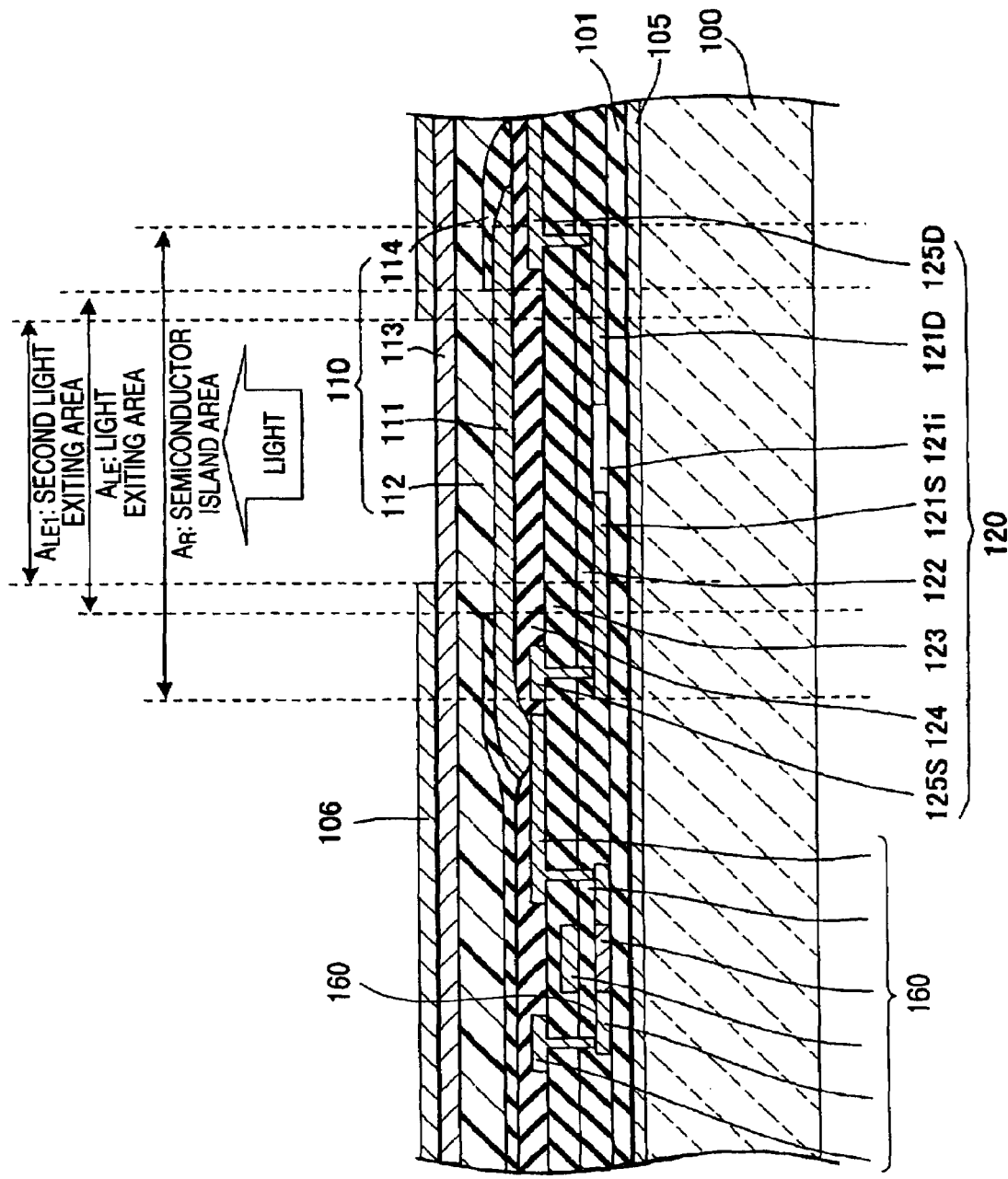
FIG. 30 is a cross-sectional diagram showing a modified example of the exposure device in accordance with the fifth embodiment of the invention.

FIG. 30 is a cross-sectional diagram showing a modified example of the exposure device in accordance with the fifth embodiment of the invention.

As shown in FIG. 30, an optical light blocking film 106 made of a thin Cr film may be formed on the surface of the cathode 113 so as to define an opening on the surface, and a second light exiting area $A_{LE1}$ is defined by the opening. By forming the second light exiting area $A_{LE1}$ to be smaller in size than that of the opening of the pixel defining member 114 described in connection with the first embodiment, it is possible to prevent the edge portion (the boundary portion of the light exiting area $A_{LE}$; this portion is likely to cause a non-uniform light intensity distribution) of the pixel defining member 114 from being disposed inside the light exiting area $A_{LE1}$. Accordingly, it is possible to manufacture the light emitting layer with a uniform thickness distribution. Other configurations are the same as those described in the fifth embodiment.

Sixth Embodiment

FIG. 31 is a peripheral circuit diagram of the light detecting element 120 in accordance with a sixth embodiment of the invention.

Figure 31A:
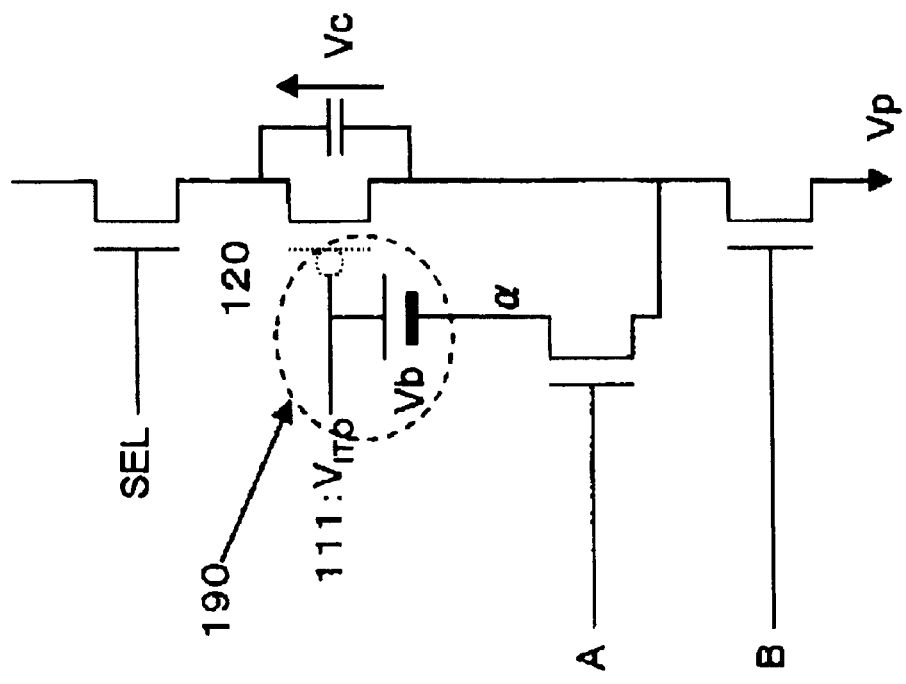
FIG. 31 is a peripheral circuit diagram of a light detecting element in accordance with a sixth embodiment of the invention.

In the first embodiment, the threshold voltage of the TFT constituting the light detecting element 120 is adjusted by controlling the impurity concentration of the channel region 121i. In the sixth embodiment, rather than adjusting the light detecting element 120 itself, a voltage source is connected between the gate and drain of the TFT constituting the light detecting element 120 as shown in FIG. 31(a) so as to control the electric potential of the gate to be maintained at a level in which the TFT is always in the OFF region. The voltage source may be configured with a capacitor as shown in FIG. 31(b).

Figure 31B:
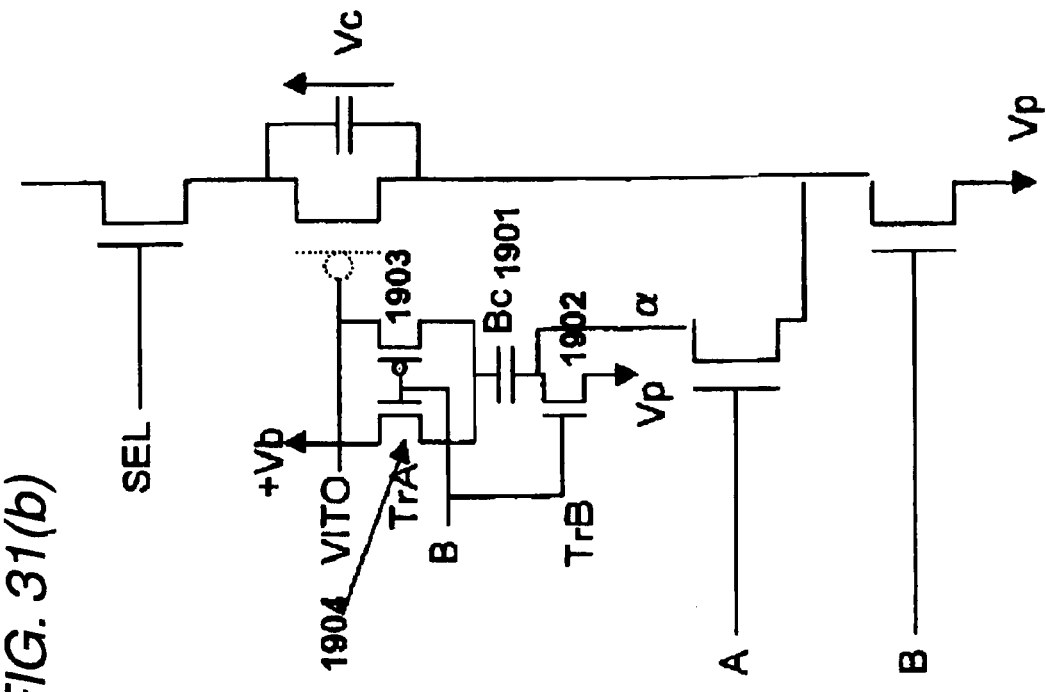
Figure 33:
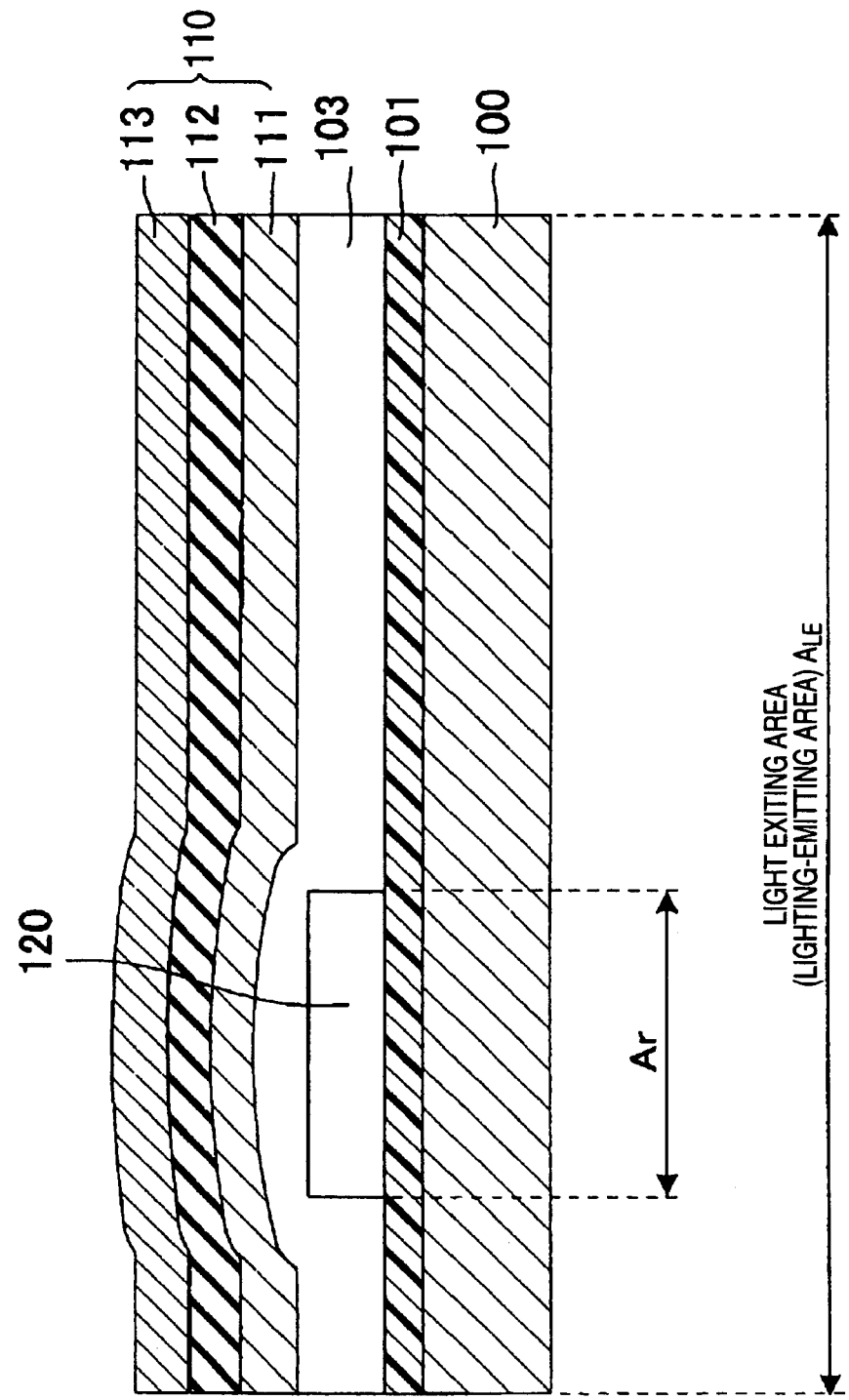
FIG. 33 is a cross-sectional diagram of a configuration of an optical head, and more particularly, of a peripheral configuration of an light emitting element provided in the optical head, in accordance with the related art.

In this manner, in the sixth embodiment, as shown in FIGS. 31(a) and 31(b), by connecting a transistor switch network 190 to form a level shifting circuit, the gate electric potential is always maintained at a level in which the TFT is in the OFF region.

Next, the level shifting operation of the electric circuit will be described with reference to FIGS. 31(b) and 32.

The voltage source circuit shown in FIG. 31(b) includes a transistor 1904 connected to the voltage source +Vb, a transistor 1903 connected to VITO, a transistor 1902 connected to Vp, and a capacitor 1901 for maintaining the voltage.

The circuit is actuated by a signal B. When the signal B is at a high potential, the transistors 1904 and 1902 are turned ON, and the +Vb is applied to the capacitor 1901 and stored therein. When the signal B is changed to a low potential, the transistors 1904 and 1902 are turned OFF and the transistor 1903 is turned ON. In this case, the capacitor 1901 acts as a voltage source connected to VITO. Next, when the signal A is changed to a high potential, the capacitor 1901 is connected to the sensor and provides an electric potential between the source and drain of the sensor, thereby shifting the electric potential of the gate of the TFT serving as the light detecting element 120 to a desired value.

As shown in FIG. 31(b) (which shows the main part of the FIG. 31(a)), the transistor switch network 190 includes a first transistor TrA having its gate and drain connected to the gate and drain of the TFT constituting the light detecting element 120, and a second transistor TrB having its drain connected through a capacitor Bc to the drains of the first transistor TrA and the TFT constituting the light detecting element 120. The gate of the second transistor TrB is commonly connected to the gates of the first transistor TrA and the TFT constituting the light detecting element 120.

By turning on and off the first and second transistors TrA and TrB by applying the signal voltages A and B to the first and second transistors TrA and TrB in a sequential manner, it is possible to shift the electric potential of the gate of the TFT to a desired value.

FIG. 32 is an explanatory diagram showing electric potentials and the like of a switching TFT in accordance with the sixth embodiment of the invention.

In FIG. 32, FIG. 32(a) is a diagram showing the ON and OFF electric potential of the switching TFT; FIG. 32(b) is a diagram showing the electric potential VITO of the anode 111 of the EL element; FIG. 32(c) is a diagram showing the electric potential of the gate of the first transistor TrA constituting the light detecting element and the level shifting circuit; FIG. 32(d) is a diagram showing the electric potential of the second transistor TrB; and the FIG. 32(e) is a diagram showing the output current of the light detecting element flowing into the capacitor Vc. In the invention, when the anode, i.e., the ITO has a positive electric potential, the transistor connected to the signal B is turned OFF, the capacitor Bc is disconnected from the power line, and the transistor connected to the signal A is turned ON, whereby the transistor is always driven at the OFF region by the voltage accumulated in the capacitor Bc.

As can be seen from the waveform in FIG. 32(e) showing the waveform of the output current flowing toward the capacitor Vc in the light detection circuit, the level shifting circuit using the transistor switch circuit network of the present embodiment shifts the gate electric potential of the TFT serving as the light detecting element 120 to a level equal to or greater than 0 V. Accordingly, it is possible to operate the thin-film transistor at the OFF region and provide a stable and uniform output current.

As described above, the electric potential of the gate electrode is shifted from the electric potential of the first electrode of the EL element by a desired amount so that the TFT can be operated in the region as indicated by the dotted lines in FIG. 5. Accordingly, it is possible to operate the TFT constituting the light detecting element 120 in the OFF state.

Although the exposure device has been described with reference to the one employed in an image forming apparatus, the light detecting element 120 itself that has been described in connection with the first and fifth embodiments can be equally applied to the image sensor mounted on an image reading apparatus, for example.

Although in the first and fifth embodiments, the light intensity of the organic EL element 110 is measured using the light detecting element configured as an monolithic integrated device made of the same polysilicon as the TFT circuit and the organic EL element, the technical scope of the invention is not limited to this. For example, the invention may be also applied to a configuration in which a plurality of film-shaped light receiving sensors made of amorphous silicon are provided along the end face of the glass substrate 100 (see FIG. 21 for reference).

The invention may be also applied to a light emitting element, and a light emitting device or a display apparatus capable of detecting the light emitted from the light detecting element and controlling the light intensity of the light emitting element on the basis of the detection result.

As described above, the invention include the following aspects.

The exposure device in accordance with an aspect of the invention includes an EL element 110 having a first electrode, a second electrode, and a light emitting layer disposed between the first and second electrodes, thereby forming a light emitting unit, and a light detecting element having a photo-electric conversion unit for detecting light emitted from the EL element 110, in which the EL element and the light detecting element are stacked onto each other, and the first electrode of the EL element disposed to the side of the light detecting element covers the entire surface of the photo-electric conversion unit of the light detecting element. With such a configuration, since the first electrode of the EL element faces the entire surface of the photo-electric conversion unit of the light detecting element, the channel characteristics of the light detecting element can be controlled by the stable electric potential of the first electrode in a reliable manner. The "photo-electric conversion unit" used in the invention refers to an area contributing the photo-electric conversion. The photo-electric conversion unit can be realized as an i-layer of the light detecting element having a p-i-p structure as long as the i-layer is disposed under the first electrode. In addition, the first electrode is generally an anode made of an electrode material having a light transmitting property, and may be used as a cathode.

In addition, the invention includes the exposure device in which the EL element is stacked on an upper layer of the light detecting element formed on a substrate, and an outer periphery of the channel region of the thin-film transistor constituting the light detecting element is disposed at an inner side of the first electrode of the EL element. With this configuration, the electric field of the first electrode is applied to the light detecting element in a reliable manner, thereby improving the controllability.

In addition, the invention includes the exposure device in which the light detecting element is formed on a semiconductor island area formed on the substrate, and an light exiting area of the EL element is formed on the semiconductor island area. With this configuration, the light exiting area of the EL element can be disposed on the semiconductor island area having the light detecting element formed thereon so that the light exiting area is disposed at an inner side of an outer periphery of the semiconductor island area. Accordingly, it is possible to form the light exiting area of the EL element on a flat surface, thereby greatly improving uniformess of the light emission of the EL element.

In addition, the invention includes the exposure device which includes an insulating substrate, a light detecting element formed on the insulating substrate, and an EL element stacked on the light detecting element through an insulating film. With this configuration, the light detecting element and EL element are stacked onto each other on the insulating substrate such as a glass substrate, and the element area is greater than the light exiting area. Accordingly, it is possible to greatly improve uniformess of the light emission of the EL element. The insulating substrate used in the invention refers to a substrate having a surface subjected to an insulating process to form an insulating film on the surface.

In addition, the invention includes the exposure device in which the insulating substrate is a glass substrate having a light transmitting property, the light detecting element is a thin-film transistor having, as an active region, a semiconductor layer formed on the glass substrate having the light transmitting property, wherein the EL element includes a first electrode made of a conductive film having a light transmitting property and formed on the semiconductor layer via an insulating film covering the semiconductor layer; a light emitting layer formed on the first electrode; and a second electrode formed on the light emitting layer, and wherein an electric field is applied between the first electrode and the second electrode, thereby allowing the light emitting layer to emit light therefrom. With this configuration, since the first electrode of the EL element faces the active region of the light detecting element via the insulating film, the first electrode can effectively function as the gate electrode of the light detecting element, thereby controlling the voltage between the gate and the source of the light detecting element. Accordingly, it is possible to control the operation region of the light detecting element by controlling the electric potential of the gate electrode.

In addition, the invention includes the exposure device in which the insulating substrate is a substrate having a reflective surface thereon, the light detecting element is a thin-film transistor having, an active region, a semiconductor layer formed on the substrate, and the EL element includes a first electrode made of a conductive film having a light transmitting property and formed on the semiconductor layer via an insulating film covering the semiconductor layer; a light emitting layer formed on the first electrode; and a second electrode having a light transmitting property formed on the light emitting layer, and an electric field is applied between the first electrode and the second electrode, thereby allowing the light emitting layer to emit light therefrom. With this configuration, the light can be extracted from an opposite side of the substrate, and the light emitted from the EL element can be detected by the light detecting element, and is reflected by the reflective surface to be output toward the EL element.

In this configuration, it is possible to detect the light reflected by the reflective surface.

In addition, the invention includes the exposure device in which the thin-film transistor is a field-effect transistor in which the first electrode of the EL element serves as a gate electrode and the insulating film serves as a gate insulating film, and the thickness of the gate insulating film is determined such that irregularity in the electric potential of the first electrode is absorbed by a voltage drop caused by the gate insulating film. With this configuration, it is possible to determine the operation region of the light detecting element by controlling the film thickness of the gate insulating layer.

In addition, the invention includes the exposure device in which the semiconductor layer of the thin-film transistor is configured such that source/drain regions defined in an impurity-doped region doped with a predetermined concentration are separated from each other by a channel region defined in a non-doped region and the channel region faces the first electrode.

In addition, the invention includes the exposure device in which the thickness of the insulating film on the channel region is adjusted such that the electric field of the first electrode formed on the channel region via the insulating film is changed to a desired value by a voltage drop caused by the insulating film. The desired value used in the invention refers to a target electric field value of the first electrode.

In addition, the invention includes the exposure device in which the width of the first electrode of the EL element is substantially equal to that of the channel region. With this configuration, the light emitting layer of the EL element can be formed on a flat surface in a state that the electric field of the gate is applied in a highly efficient manner. Accordingly, it is possible to prevent the irregularity in the film thickness of the light emitting layer resulting from the underlying bump area. In this case, since the light emitting area is not formed on the source and drain regions, it is possible to match the light exiting area with the light emitting area almost exactly, thereby providing a fine line-shaped light exiting area. Accordingly, it is possible to prevent crosstalk even in a narrower pitch configuration resulting from the miniaturization.

In addition, the invention includes the exposure device in which an opening formed on the insulating film disposed between the first or second electrode and the light emitting layer is defined as a light exiting area of the EL element. With this configuration, the light exiting area of the EL element can be defined on the light emitting layer formed between the first electrode and the second electrode. Since those areas covered by the insulating film does not constitute the light exiting area even when there is any quality deterioration in the end portion of the light emitting layer, it is possible to prevent any quality deterioration and thus improve the reliability.

In addition, the invention includes the exposure device in which an opening formed on the light blocking film disposed more closer to the side of the light exiting area of the EL element than the light emitting area. With this configuration, the light exiting area of the EL element can be defined as the opening provided in the light blocking film. Since those areas covered by the light blocking film does not constitute the light exiting area even when there is any quality deterioration in the end portion of the light emitting layer, it is possible to prevent any quality deterioration and thus improve the reliability.

In addition, the invention includes the exposure device in which the light detecting element is configured with an island-shaped poly-crystalline silicon, and the area of the island-shaped portion is greater than that of the light emitting area of the EL element.

In addition, the invention includes the exposure device in which the light detecting element is configured with an island-shaped amorphous silicon, and the area of the island-shaped portion is greater than that of the light emitting area of the EL element.

In addition, the invention includes the exposure device in which the light detecting element is provided to the light exiting area of the EL element on a one-to-one basis. The exposure device is configured such that a plurality of light exiting areas are aligned in an array configuration. Since the light exiting area is provided to the light detecting element on an one-to-one basis, it is possible to measure the intensity of light emitted from the plurality of light exiting areas at the same time, thereby speeding up the overall light intensity measuring operation of the exposure device.

In addition, the invention includes the exposure device in which an organic EL element is used as the light source. Since the organic EL element provides a higher level of brightness with a low power consumption, it is possible to provide an exposure device having excellent power saving capability.

In addition, the invention includes the exposure device in which an inorganic EL element is used as the light source. Since the inorganic EL element can be manufactured through a screen printing process, it is possible to form the inorganic EL element with little production error. Moreover, since it does not require facilities such as a cleanroom, it is possible to manufacture the EL element with mass production. Accordingly, it is possible to provide the exposure device at a low manufacturing cost.

In addition, the invention includes the exposure device in which the light detecting element is configured with the same layer as the thin-film transistor constituting a driving circuit of the EL element. Since the thin-film transistor and the light detecting element can be formed from the same layer using a processing method such as an etching process, it is possible to simplify the manufacturing process of the exposure device, thereby decreasing the manufacturing cost. Although the process of forming the poly-crystalline silicon layer onto the glass substrate includes a high-temperature process, the process can be performed through only a single adjustment. Accordingly, it is possible to obtain excellent properties with a high controllability and reliability.

In addition, the invention includes an image forming apparatus equipped with the above-described exposure device. By mounting the exposure device providing a uniform light intensity distribution thereon, it is possible to obtain an image forming apparatus having a long lifetime and high image quality.

In addition, the technical scope of the invention includes the light emitting element constituting the exposure device. The light emitting element includes a light emitting unit, a photo-electric conversion unit superimposed onto the light emitting unit to detect the light emitted from the light emitting unit, and an electrode disposed between the light emitting unit and the photo-electric conversion unit to drive the light emitting unit, in which the electrode covers the entire or substantially the entire principal surface of the photo-electric conversion unit. The expression "to cover substantially the entire surface of the photo-electric conversion unit" used in the invention means that the first electrode covers the entire or substantially the entire principal surface of the photo-electric conversion unit. Although it is desirable that the electrode covers the entire principal surface of the photo-electric conversion unit, it is also possible to configure in such a manner that the electrode is not present on the wire-passing area of the photo-electric conversion unit due to the wire layout matters. In this case, the controllability may be somewhat deteriorated compared to the above-mentioned configuration in which the electrode covers the entire surface.

In addition, the invention includes the overall light emitting device in which the EL element used in the above-described exposure device is used as the light emitting element.

The light exiting area used in the invention refers to an area from which the light from the light emitting element is emitted. In a case where there is not formed a light blocking member having an opening serving as the pixel defining member, the light exiting area refers to the light emitting area itself. In a case where there is formed a light blocking member having an opening serving as the pixel defining member, the light exiting area refers to the area corresponding to the opening.

In addition, the above-described element area refers to the semiconductor area, or generally, to the island area formed of the poly-crystalline silicon layer. In a case where the poly-crystalline silicon layer is formed over the entire surface of the substrate and then an insulation area is formed on a portion of the poly-crystalline silicon layer using anode-oxidation or oxygen ion-doping, the element area refers to the active region surrounded by the insulation area. In this case, since the active region as the element area and its circumferential areas are likely to be formed on the same surface, it is only necessary to form the light exiting area on a flat surface even when a portion of the light emitting area is present on the non-active area.

While the invention has been described with reference to various embodiments, the invention is not limited to the above-mentioned embodiments. However, various modifications can be made on the basis of the whole description of the specifications and the known technologies. Such modifications are also included in the technical scope of the invention.

As described above, the exposure device and the image forming apparatus using the same in accordance with the invention can be used in a printer, a copying machine, a facsimile machine, a photo printer, and the like, for example.

This application is based upon and claims the benefit of priority of Japanese Patent Application No 2006-108051 filed on 2006 Apr. 10, Japanese Patent Application No 2006-109646 filed on 2006 Apr. 12, Japanese Patent Application No 2006-123739 filed on 2006 Apr. 27, the contents of which are incorporated herein by reference in its entirety.

What is claimed is:

1. An exposure device comprising:
    an EL (electro-luminescence) element having a first electrode, a second electrode, and a light emitting layer disposed between the first and second electrodes, thereby forming a light emitting unit; and
    a light detecting element detecting light emitted from the EL element, the EL element and the light detecting element being stacked onto each other,
    wherein the light detecting element is provided at an inner side of a principal surface of the electrode which is disposed closer to the light detecting element than the other electrode, and
    wherein a light emitting area of the EL element is provided at an inner side of a principal surface of the light detecting element.

2. The exposure device according to claim 1, wherein the EL element is stacked on an upper layer of the light detecting element formed on a substrate,
    wherein the light detecting element includes a photoelectric conversion unit, and
    wherein an outer periphery of the photoelectric conversion unit is disposed at an inner side of the principal surface of the first electrode of the EL element.

3. The exposure device according to claim 2, wherein the light detecting element is formed on a semiconductor island area formed on the substrate, and
    wherein an light exiting area of the EL element is formed on the semiconductor island area.

4. The exposure device according to claim 1, further comprising:
    an insulating substrate;
    a light detecting element formed on the insulating substrate; and
    an EL element stacked on the light detecting element through an insulating film.

5. The exposure device according to claim 4, wherein the insulating substrate is a glass substrate having a light transmitting property,
wherein the light detecting element is a thin-film transistor having, as an active region, a semiconductor layer formed on the glass substrate having the light transmitting property,
wherein the EL element includes:
a first electrode made of a conductive film having a light transmitting property and formed on the semiconductor layer via an insulating film covering the semiconductor layer;
a light emitting layer formed on the first electrode; and
a second electrode formed on the light emitting layer, and
wherein an electric field is applied between the first electrode and the second electrode, thereby allowing the light emitting layer to emit light therefrom.

6. The exposure device according to claim 4,
wherein the insulating substrate is a substrate having a reflective surface thereon,
wherein the light detecting element is a thin-film transistor having, an active region, a semiconductor layer formed on the substrate,
wherein the EL element includes:
a first electrode made of a conductive film having a light transmitting property and formed on the semiconductor layer via an insulating film covering the semiconductor layer;
a light emitting layer formed on the first electrode; and
a second electrode having a light transmitting property formed on the light emitting layer, and
wherein an electric field is applied between the first electrode and the second electrode, thereby allowing the light emitting layer to emit light therefrom.

7. The exposure device according to claim 5,
wherein the thin-film transistor is a field-effect transistor in which the first electrode of the EL element serves as a gate electrode and the insulating film serves as a gate insulating film, and
wherein the thickness of the gate insulating film is determined such that irregularity in the electric potential of the first electrode is absorbed by a voltage drop caused by the gate insulating film.

8. The exposure device according to claim 5, wherein the semiconductor layer of the thin-film transistor is configured such that source/drain regions defined in an impurity-doped region doped with a predetermined concentration are separated from each other by a channel region defined in a non-doped region and the channel region faces the first electrode.

9. The exposure device according to claim 5,
wherein the thickness of the insulating film on the channel region is adjusted such that the electric field of the first electrode formed on the channel region via the insulating film is changed to a desired value by a voltage drop caused by the insulating film.

10. The exposure device according to claim 5,
wherein the width of the first electrode of the EL element is substantially equal to that of the channel region.

11. The exposure device according to claim 1, wherein an opening formed on the insulating film disposed between the first or second electrode and the light emitting layer is defined as a light exiting area of the EL element.

12. The exposure device according to claim 1, wherein an optical light blocking film is defined as a light exiting area of the EL element.

13. The exposure device according to claim 1, wherein the light detecting element is configured with an island-shaped poly-crystalline silicon, and the area of the island-shaped portion is greater than that of the light emitting area of the EL element.

14. The exposure device according to claim 1, wherein the light detecting element is configured with an island-shaped amorphous silicon, and the area of the island-shaped portion is greater than that of the light emitting area of the EL element.

15. The exposure device according to claim 1, wherein the light detecting element is provided to the light exiting area of the EL element on a one-to-one basis.

16. The exposure device according to claim 1, wherein the EL element is an organic EL element in which an organic semiconductor layer is used as the light emitting layer.

17. The exposure device according to claim 1, wherein the EL element is an inorganic EL element in which an inorganic semiconductor layer is used as the light emitting layer.

18. The exposure device according to claim 1, wherein the exposure device further comprises a light intensity correcting unit that corrects the intensity or lighting period of light emitted from the EL element on the basis of an output from the light detecting element.

19. The exposure device according to claim 1, wherein the light detecting element is configured with the same semiconductor layer as the thin-film transistor constituting a driving circuit of the EL element.

20. An image forming apparatus in which the exposure device according to claim 1 is used as an exposure unit for image formation.

21. An image forming apparatus in which the exposure device according to claim 7 is used as an exposure unit for image formation.

22. An image forming apparatus in which the exposure device according to claim 8 is used as an exposure unit for image formation.

23. An image forming apparatus in which the exposure device according to claim 9 is used as an exposure unit for image formation.

24. An image forming apparatus in which the exposure device according to claim 10 is used as an exposure unit for image formation.

* * * * *